(12) United States Patent
Bustamante

(10) Patent No.: US 11,570,917 B2
(45) Date of Patent: Jan. 31, 2023

(54) PORTABLE MONITOR AND PERIPHERALS HUB SYSTEM

(71) Applicant: BT5 Technologies, LLC, Katy, TX (US)

(72) Inventor: Luis Bustamante, The Woodlands, TX (US)

( * ) Notice: Subject to any disclaimer, the term of this patent is extended or adjusted under 35 U.S.C. 154(b) by 0 days.

(21) Appl. No.: 17/495,670

(22) Filed: Oct. 6, 2021

(65) Prior Publication Data
US 2022/0110218 A1 Apr. 7, 2022

Related U.S. Application Data

(60) Provisional application No. 63/187,814, filed on May 12, 2021, provisional application No. 63/088,436, filed on Oct. 6, 2020.

(51) Int. Cl.
*H05K 5/02* (2006.01)
*G06F 1/16* (2006.01)

(52) U.S. Cl.
CPC ......... *H05K 5/0221* (2013.01); *G06F 1/1601* (2013.01); *H05K 5/0226* (2013.01); *H05K 5/0247* (2013.01); *H05K 5/0286* (2013.01)

(58) Field of Classification Search
CPC ....................................................... G06F 1/16
See application file for complete search history.

(56) References Cited

U.S. PATENT DOCUMENTS

| | | | |
|---|---|---|---|
| 8,988,872 B2 * | 3/2015 | Wong | G06F 1/1632 361/679.42 |
| 2017/0208697 A1 * | 7/2017 | Kurian | G06F 1/1632 |

* cited by examiner

*Primary Examiner* — Jerry Wu
(74) *Attorney, Agent, or Firm* — Joseph P. Aiena

(57) ABSTRACT

There is provided a portable screen and hub system, which incorporates the flexibility to install and interchange different types of functional apparatuses, such as a portable monitor, video-camera, microphone, speakers, sensors, characters/figurines, advertising slot and activation buttons among other peripherals. This present invention can interact mechanically, electronically, visually or orally with the user or third parties and be used in different applications. Internal and external structures house additional and/or extended electronic board and connectors which manage, interface and/or detect the signals obtained from the functional apparatuses and/or characters installed on the hub, and receive and/or send signals to an external device, such as a computer, computer monitor, smartphone, tablets, external memory and other apparatuses.

11 Claims, 69 Drawing Sheets

PORTABLE MONITOR AND PERIPHERALS HUB SYSTEM

CROSS REFERENCE TO RELATED APPLICATIONS

This application claims the benefit of and priority to U.S. Provisional Application Ser. No. 63/088,436, filed on Oct. 6, 2020, and U.S. Provisional Application No. 63/187,814 filed on May 12, 2021, each of which are incorporated by reference herein in its entirety.

FIELD OF THE INVENTION

The present invention relates generally to a technological hub system. More particularly, the present invention relates to a hub with multi-functional capabilities for power, data and video transmission, with a portable monitor, video-camera, microphone, speakers, memory, power bank, wireless and wired connectivity, USB ports and mechanical slots to connect other apparatuses and characters in a unique and small piece of technology.

BACKGROUND

There are technological hubs which have been used for years to connect different apparatuses. There is a need of a new hub system that provide the users with a portable monitor and other important peripherals in a compact and plug-and-play design which is easy to use especially when traveling.

SUMMARY OF THE INVENTION

The present invention provides the user with a new type of portable hub with connectivity and capabilities for enhanced performance and entertainment in any place and especially when traveling. With the present invention, the hub has extended functionality within the apparatus as a unitary system or with attachments. This invention exchanges data, wired or wireless, with the computer and different apparatuses and accessories such as a touch-screen monitor, sensors, characters/figurines, among others, and it can be used in different applications such as personal use, entertainment, healthcare, office, home and for marketing applications.

The portable hub and peripheral system of this invention includes different features such as monitor screen, video-camera, microphone, speakers, memory, power bank, wireless and wired connectivity, voice activation, USB ports and mechanical slots to connect other apparatuses and characters, among others.

The internal structure of the hub is designed to house electronic boards and connectors of the latest technology that manage, interface and/or detect the signals obtained from the monitor, apparatuses and/or characters installed in the hub, and receive and/or send signals to an external device, such as a computer, smartphone, tablet, etc.

Some of the peripherals and/or uses of the portable hub system would be the following: Portable Secondary Computer Screen: to extend or duplicate the computer screen in other display and enhance performance when traveling or working at home; Video: to use a mobile video camera installed in the hub; Camera: to take photos easily and in any direction without moving the computer; Built-in Features: to use the Microphone, Speaker and Memory Flash installed in the portable hub, all options with voice activation option; Connect External Peripherals: to connect other apparatuses in the USB Ports such as external memory, Lantern, Pointer, Fingerprint, chargers, etc; Charger, Video and Data Transfer with Smart Phones and Tablets: to charge other apparatuses and transfer video and data; Mechanical Sound Amplifier: to increase the sound emitted by the smartphones, tablets and other apparatuses when they are installed in the portable hub; Healthcare Applications: to install sensors and be use by professionals in healthcare; Entertainment Applications: to install characters of heroes or other figures for entertainment and download and play their original voices. Voice activation is an option to use this invention; Advertising: to advertise company names, customized names, etc.

The present invention is a portable hub system with enhanced functionality, including an internal power source and a set of electronics for internet and electronic communication with a computer and other apparatuses. The usage of this invention is explained later herein.

The present invention is a portable monitor and peripherals hub system which comprises a unitary hub device with an internal power source with the unitary device housing a set of electronics for wireless and wired communications with a computer and other apparatuses. The hub has input buttons to activate internal components and software to transfer power, data and video with a computer, portable monitor and other apparatuses simultaneously. The hub includes a telescopic base to install monitors and other apparatuses for power charge, data and video communications with a computer. The hub has a fine-tune mechanical adjustment for a USB port and at least one portable monitor can be connected in the hub and act a secondary screen of a computer. The hub includes a mechanical connection on a top surface, and the mechanical connection is capable of securing a functional object and electronically transferring power and data between the object and the hub. With the present invention, the hub has a built-in video-camera, speaker, microphone, flash memory all within its built-in compact design for easy transport. The hub includes software and hardware to be used as a simple plug-and-play system.

In an embodiment, the hub device comprises a unitary body having a top wall, a bottom wall, a front wall, a rear wall, and a pair of side walls defining a cavity within the unitary body, with the unitary body having an internal power source and a set of electronics for wireless and wired communication with external devices. The front wall has an opening for receiving a telescopic base piece into the cavity of the unitary body, with the base piece having a bottom surface and a locking ridge extending from the bottom surface. The base piece has a usb port extending from the base piece and adjustably positioned by a sliding arm. The bottom wall of the unitary body having an interior surface with a locking slot which receives the locking ridge of the base piece. The front wall includes at least one slot formed in the front wall for receiving an external device. The hub includes a plurality of parallel resonance bars extending from an interior surface of the top wall of the unitary body into the cavity, with the parallel resonance bars defining acoustic pathways. The top wall has an exterior surface with a mechanical connection, with the mechanical connection capable of securing a functional object and electronically transferring power and data between the functional object and the unitary body.

In an embodiment, the hub device of the present invention includes the sliding arm is adjusted by a position switch located on the base piece. The hub device includes an embodiment wherein at least one of the side walls has a sound output. The hub device of the present invention includes at least one input located on the unitary body for receiving data communications. The hub device further includes at least one input located on the unitary body for receiving video. The hub device further includes at least one input located on the unitary body for receiving electrical communication.

In an embodiment, the hub device further includes at least one output located on the unitary body for sending data communications. The hub device includes at least one output located on the unitary body for sending video and can also include at least one output located on the unitary body for sending electrical communication.

In an embodiment, there is a monitor for connection to a hub device which comprises a monitor having an autorotation function for altering a screen display from landscape mode to portrait mode or from portrait mode to the landscape mode. The monitor has a bottom lateral side and a pair of sides which extend from the bottom lateral side with the bottom lateral side longer than each of the pair of sides which extend from the bottom lateral side. The embodiment includes a pair of connecting ports for transmission of power, video, audio, or data with the pair of connecting ports including a landscape connecting port located on the lateral side of the monitor for installation of the monitor in landscape mode, and a portrait connecting port located on one of the pair of sides of the monitor for installation in portrait mode. The embodiment includes a magnet located on the monitor which is detected by a Hall effect sensor when the monitor is installed in the portrait mode, and activates the autorotation function of the monitor. The embodiment includes a vertical assembly guide on the monitor for connection of the monitor in a vertical position and a horizontal assembly guide on the monitor for connection of the monitor in horizontal position.

In an embodiment, there is a hub device which comprises a unitary body having a top wall, a bottom wall, a front wall, a rear wall, and a pair of side walls defining a cavity within the unitary body, with the unitary body having an internal power source and a set of electronics for wireless and wired communication with external devices. A plurality of parallel resonance bars extend from an interior surface of the top wall of the unitary body into the cavity, with the parallel resonance bars defining acoustic pathways. The front wall has a first front outer surface and a second front outer surface connected by a plane section, and the front outer surface have a backside with the backside of the front outer surface, the second front outer surface and the plane section defining a channel for receiving an external device. The top wall has an exterior surface with a mechanical connection and the mechanical connection is capable of securing a functional object and electronically transferring power and data between the functional object and the unitary body. The bottom wall having a bottom base area and at least one downwardly extending wall extending from the bottom base area with the bottom base area and the at least one downwardly extending wall forming a cavity to receive a monitor rotatably connected to the hub by a hinge connection on the rear wall, with the hinge connection allowing the monitor to rotate from a first position to a second position along an axis of rotation.

DETAILED DESCRIPTION OF THE DRAWINGS

Figure 1A:
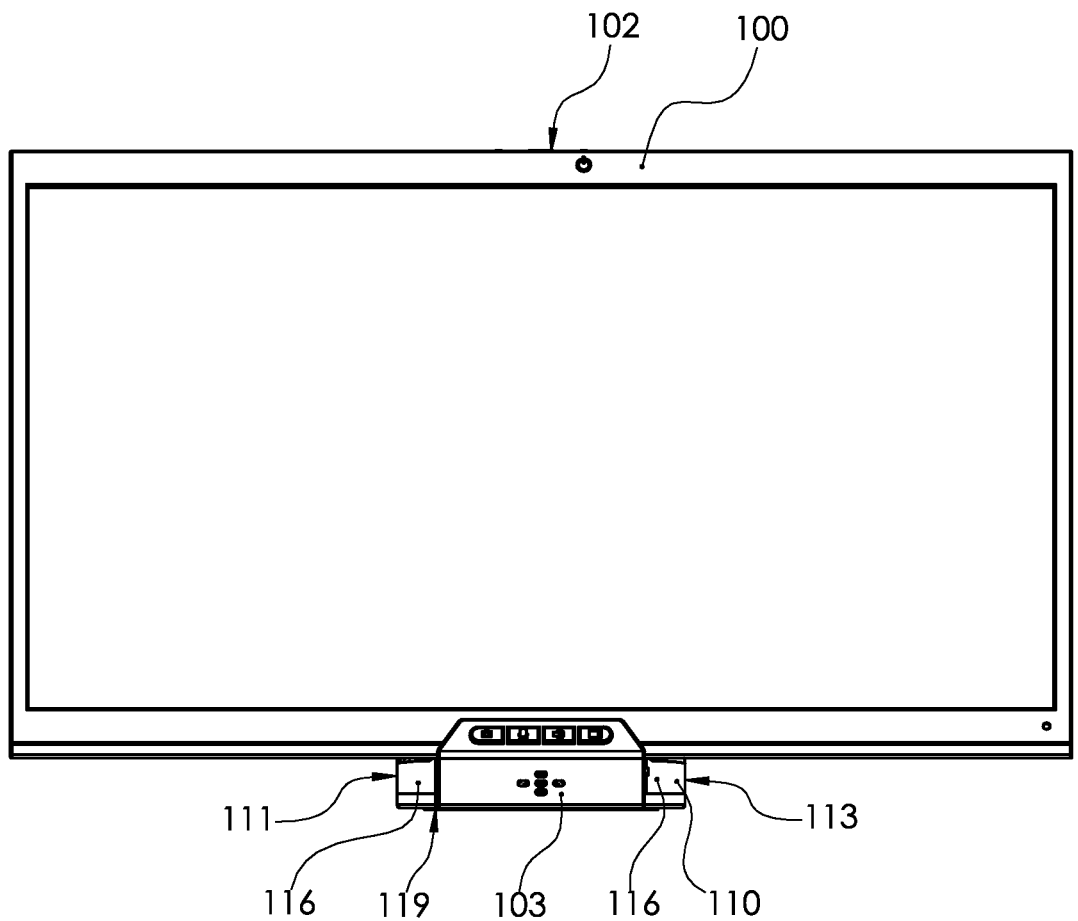
FIGS. 1A, 1B, and 1C are illustrations of the present invention in front, side and top views, respectively.
Figure 1B:
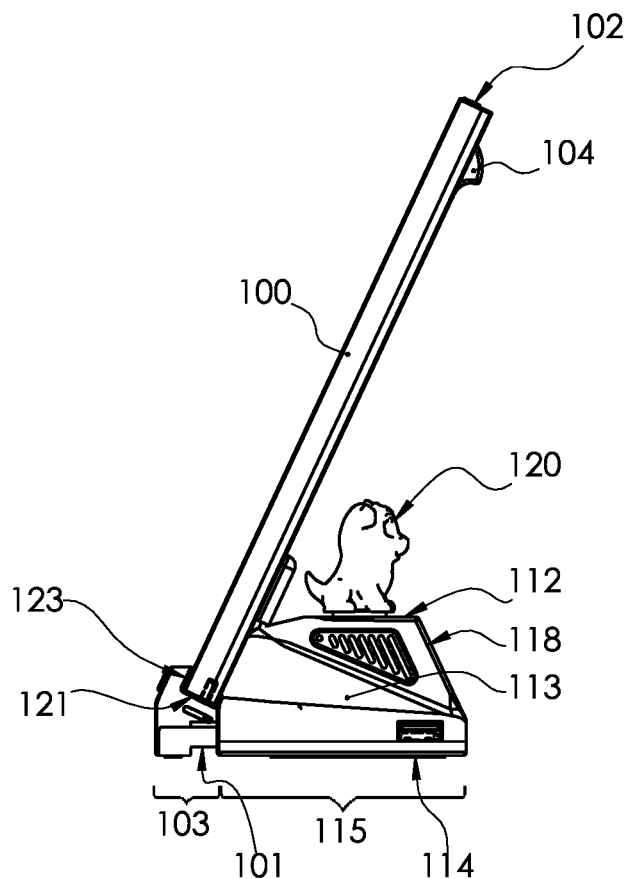
Figure 1C:
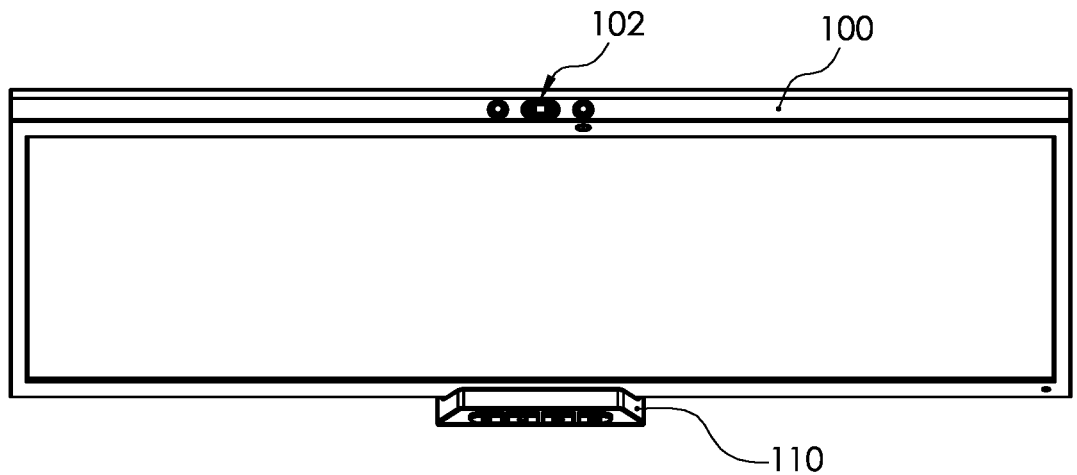

FIGS. 1A, 1B and 1C show the portable monitor and peripheral hub system of the present invention in different views of top, front and right-side views respectively, including the monitor 100 and the hub 110. The hub 110 has the top port (330 of FIG. 6A) in the upper back section (335 of FIG. 6A) to mechanically connect interchangeable and removable 120 characters at the user's discretion. The monitor 100, includes the set-up buttons 102 and a manipulation handle 104. The hub and the monitor include many functionalities for enhancing performance that will be explained later herein.

The hub device comprises a unitary body 115 having a top wall 112, a bottom wall 114, a front wall 116, a rear wall 118, and a pair of side walls 111, 113 defining a cavity (801 in FIGS. 20A and 20B) within the unitary body 115, with the unitary body having an internal power source (790 in FIGS. 20A and 20B) and a set of electronics (810 in FIGS. 20A and 20B) for wireless and wired communication with external devices. The front wall 116 has an opening 119 for receiving a telescopic base piece 103 into the cavity 801 of the unitary body 115, with the telescopic base piece 103 having a bottom surface 101 and locking ridge (550 in FIG. 11B) extending from the bottom surface 101. The telescopic base piece 103 has a USB port (344 of FIG. 6A) extending from the telescopic base piece 103 and adjustably positioned by a sliding arm 590 in FIG. 12. The bottom wall 114 of the unitary body 115 has an interior surface (551 in FIG. 11B) with a locking slot (560 in FIG. 11B) which receives the locking ridge (550 in FIG. 11B) of the telescopic base piece 103. The front wall 116 includes at least one slot 121 formed in the front wall 123 for receiving an external device. The hub 110 includes a plurality of parallel resonance bars (760 FIGS. 19A and 19B) extending from an interior surface (776 FIG. 19A) of the top wall 112 of the unitary body 115 into the cavity 801, with the parallel resonance bars (760 FIGS. 19A and 19B) defining acoustic pathways. The top wall 112 has an exterior surface 335 with a mechanical connection 330, capable of securing a functional object 120 and electronically transferring power and data between the functional object 120 and the unitary body 115. The hub device 110 of the present invention includes a telescopic sliding arm (588 in FIG. 12) which is adjusted by a position switch (590 in FIG. 12) located on the telescopic base piece 103.

Figure 2A:
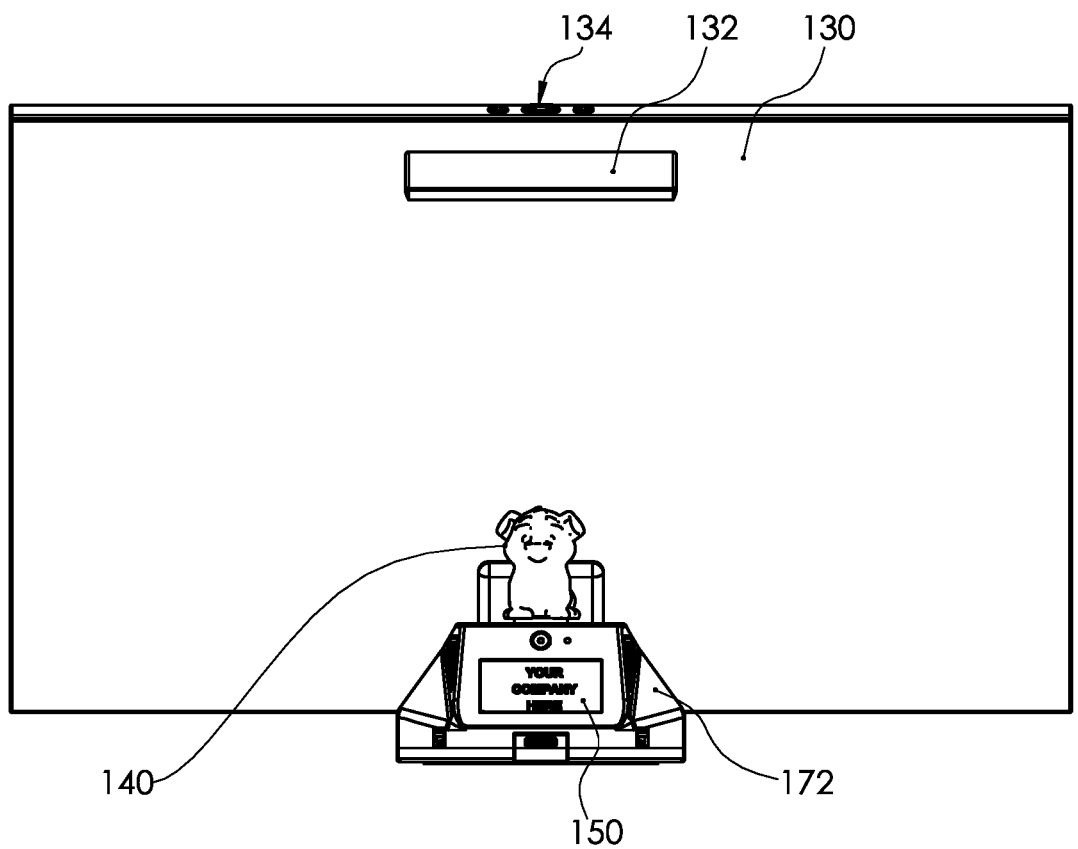
FIGS. 2A, 2B, and 2C are an illustration of the present invention in rear, side and bottom side views, respectively.
Figure 2B:
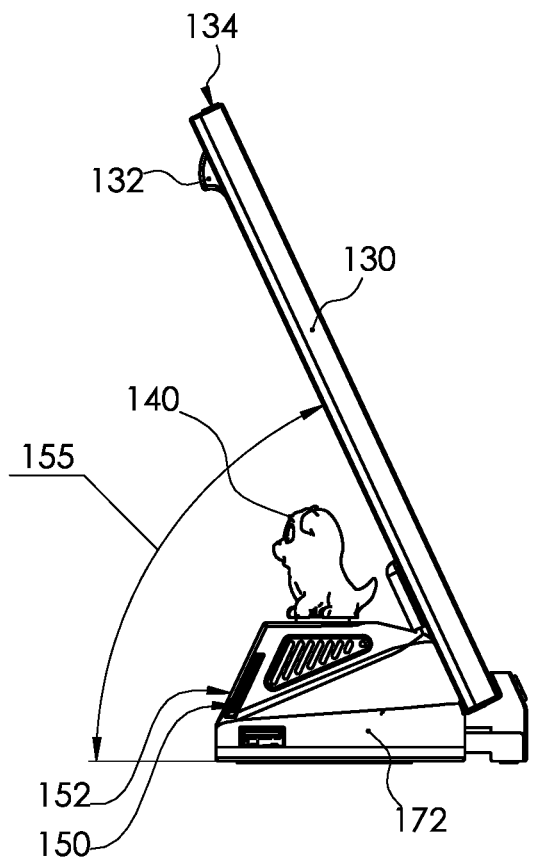
Figure 2C:
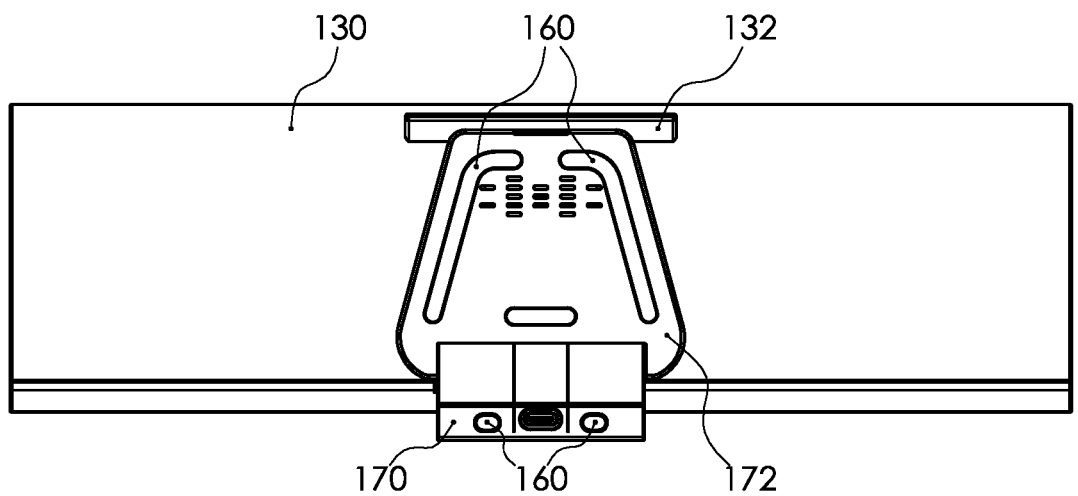

FIGS. 2A, 2B and 2C shows the rear, side and bottom view of this invention in which the monitor 130 installed in the hub 172, at an inclination of 65° 155 from the horizontal base for adjusting itself to the user vision (FIG. 2B). Similarly, it can be seen how, but not limited to, the removable characters 140 are installed in the upper rear part of the hub 172. From the rear view, the interchangeable set of plastic cards 150 are installed in landscaping array in the slot 152, which can be used for the purposes of advertising brands, names or other applications. Additionally, the manipulation handle 132 and the set-up buttons 134 of the monitor 130 are shown in this view. In the bottom view (FIG. 2C), pads 160 are shown to give fixation and stability to the hub 172 when it is on a desk, and the telescopic base 170 on which monitor 130 is installed is also seen.

Figure 3:
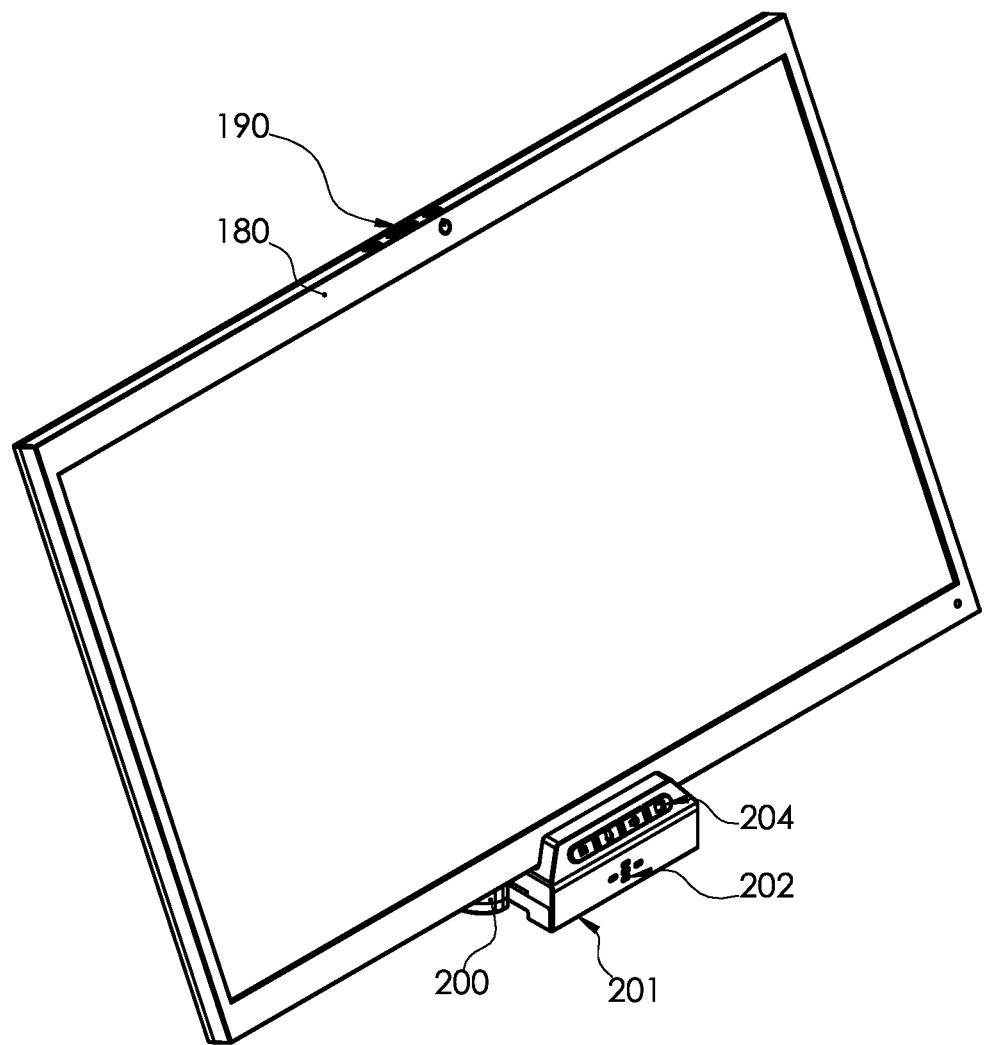
FIG. 3 is an illustration of the isometric front view of the present invention.

FIG. 3 shows an isometric front view of the hub 200 and the connected monitor 180. The monitor can be touch-screen, of different sizes and includes a rechargeable battery and a set of electronics for communication with the hub 200. Monitor 180 has its display configuration control buttons 190 centered at the top so that, when pressed by the user, the force exerted vertically downward is sustained by the telescopic base 201 and the monitor 180 remains stable over the hub 200. The size of the hub gives enough stability to a monitor up to 16 inches. This figure also shows frontal control buttons 204 section and the microphone 202 of the hub 200.

Figure 4:
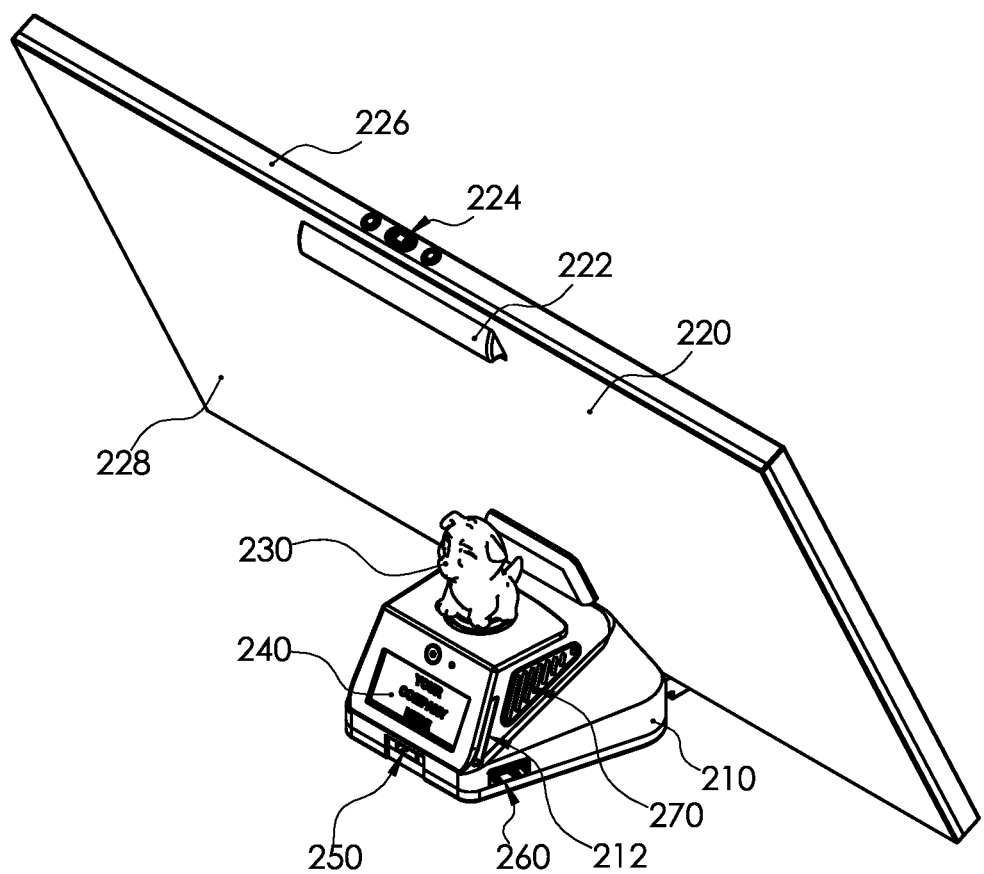
FIG. 4 is an illustration of the isometric rear view of the present invention.

FIG. 4 shows a rear isometric view of this invention, the character 230, the plastic cards 240 and the slot for install the cards 212, all of them installed in the hub 210. User can install approximately 5 plastic customized printed cards in both sides with advertising or any other type of written or visual information. Plastic cards are removed and installed horizontally from the slot port 212. This drawing shows the hub USB-C input port 250 for input power, data and video signals, a USB-A port 260 and a side sound output 270. The monitor 220 includes the set-up buttons 224 in the top area 226 and the handle 222 in the back side 228 for grabbing and manipulate it when the monitor 220 is installed and disconnected from the hub 210.

Figure 5:
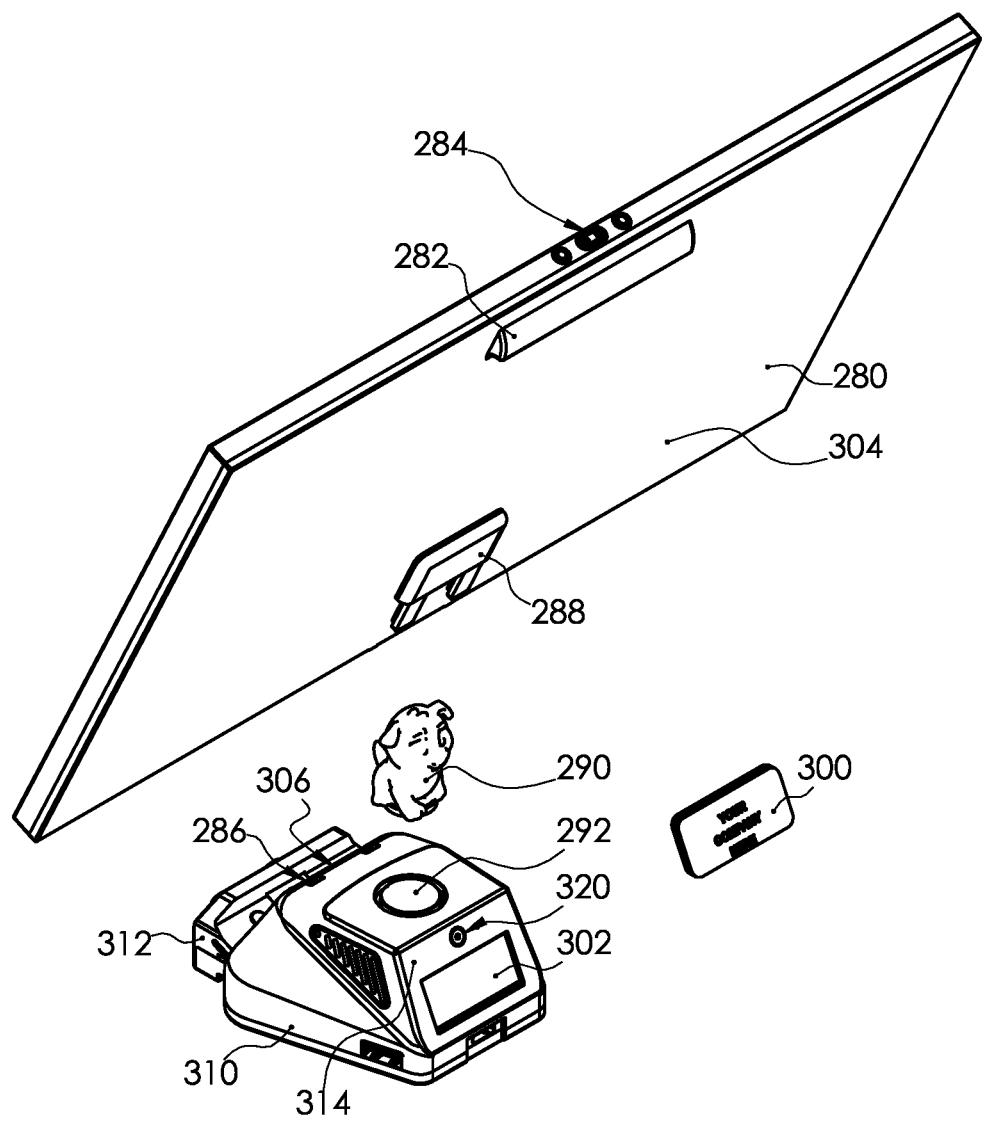
FIG. 5 is an illustration of the isometric exploded view of the present invention describing the main components.

FIG. 5. This illustration shows a rear exploded view of the main components of this invention. It shows the monitor 280 with the set-up buttons 284 in the top area, the rear handle 282 that allows the monitor to grab it easily for connect and disconnect it from the hub 310 in a 65 degrees angle from the horizontal, the monitor assembly guides 288 located in the back side 304 of the monitor 280 and the hub assembly grooves 286 located in the front side 306 of the hub 310 which allows the two main components, the hub 310 and the monitor 280, to mechanically attach in a firmly and stable way for manipulation. This figure also shows the interchangeable character 290 that is connected in the top port 292 of the hub 310, the interchangeable cards 300 and the slot compartment 302 for the plastic cards, the rear video-camera 320 installed at 65° from the horizontal in the back side 314 of the hub 310 in order to make videos and photos in affordable angles when it is seated over a desk, but also at any angle when the hub 310 is taken with the hand and it is wired or wireless connected with a computer or other apparatus. This figure also shows the telescopic base 312 in an extended position to receive the installation of the monitor 280.

Figure 6A:
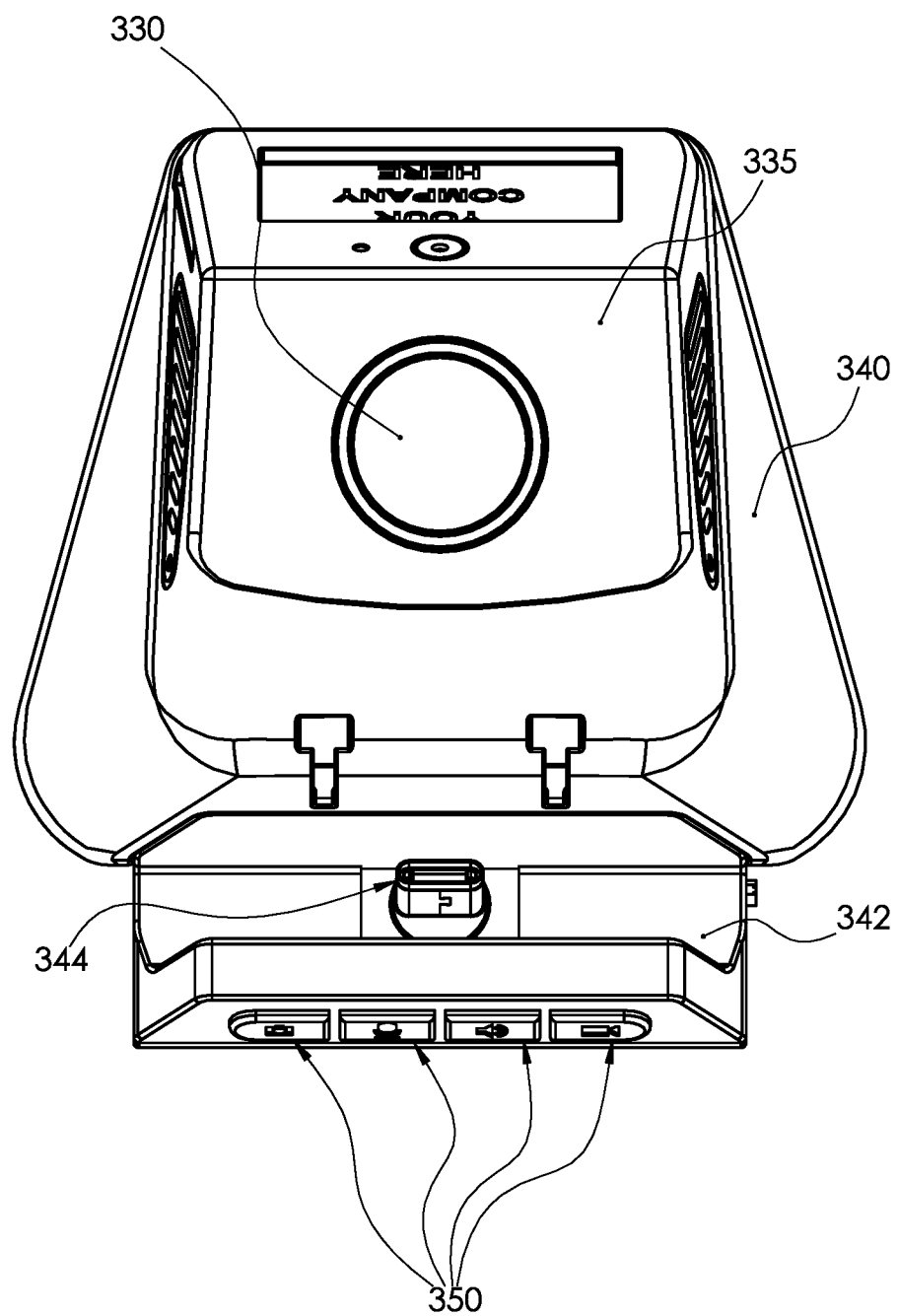
FIGS. 6A, 6B, and 6C are illustrations of the top, front and left views of the hub, respectively, of the present invention.
Figure 6B:
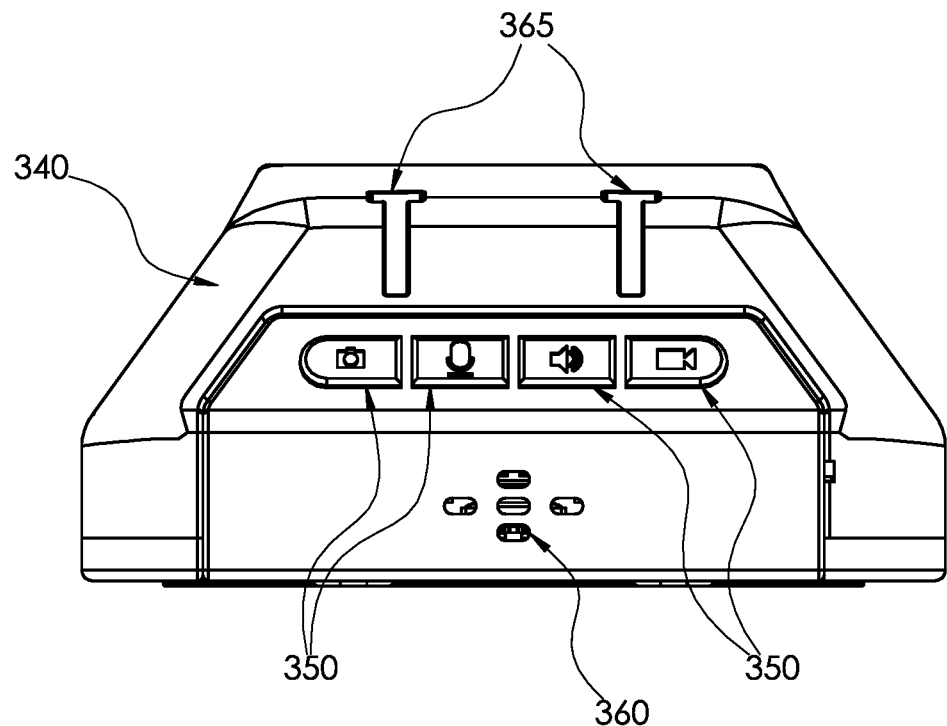
Figure 6C:
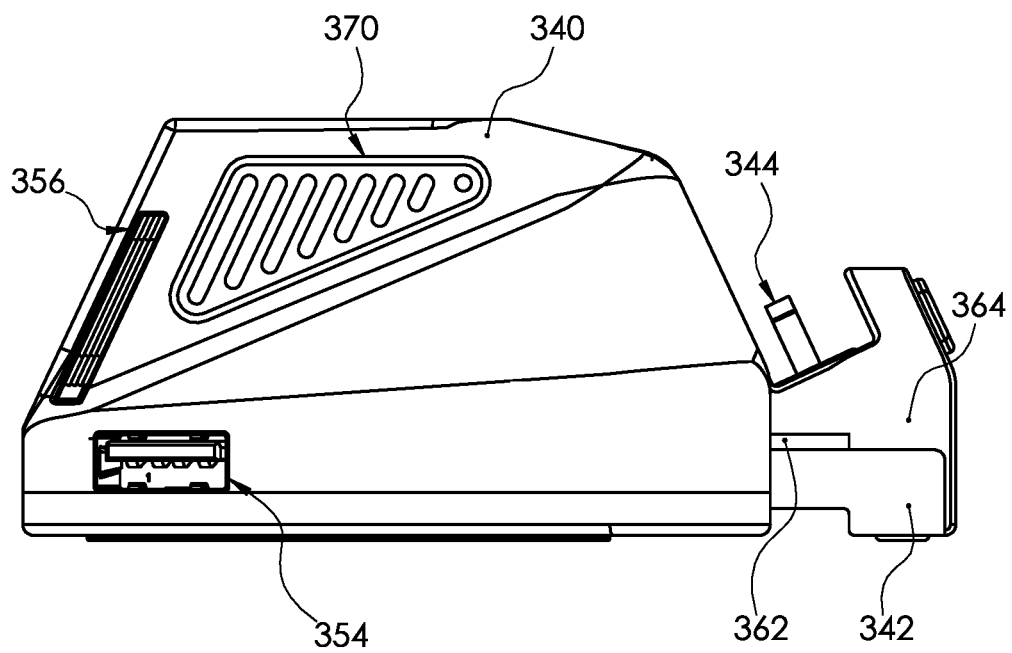

FIGS. 6A, 6B, and 6C show general views of the hub 340, including the top view (FIG. 6A) where there is located the top port 330 in the upper back section 335 to install characters or other IoT apparatuses such as healthcare sensors or others. The top port 330 would be of different designs, including but not limited to, a simple mechanical connector to receive the installation of characters or frames, or a type USB-C or type USB-A connectors to allow transmit power, data or video to any apparatuses installed there, such as healthcare sensor or others. This figure also shows the telescopic USB-C port 344 located in the telescopic base 342 to connect different apparatuses such as a monitor, smartphones, tables, etc. The front view (FIG. 6B) shows the hub assembly grooves 365, the four (4) control buttons 350 of the hub 340 and the audio input 360 for the microphone. More control buttons would be added depending of the apparatus to control. In the left-side view (FIG. 6C) the left audio output 370 of the speaker and the telescopic base 342 in an extended position, the USB-A port 354, and the slot for the interchangeable cards installation 356 can be seen. The telescopic base 342 slides internally into the hub 340 over two rails 362 located in the inside walls 364 of the hub 340, and as explained later, a locking slot system (see 550 in FIGS. 11A to 11C), allows the telescopic base 342 to extend and retract in different adjustable positions, depending of the size of the device to install over the telescopic base 342.

Figure 7A:
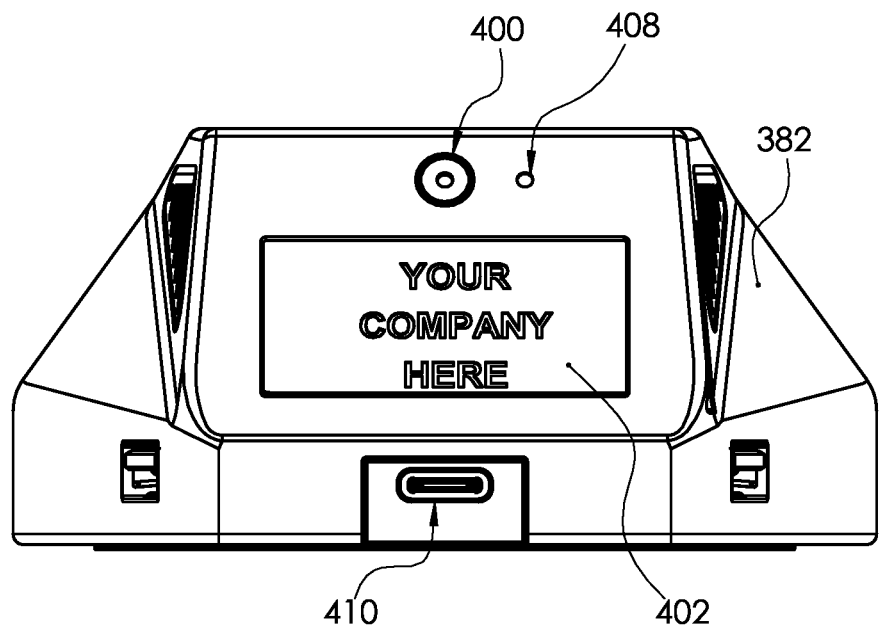
FIGS. 7A, 7B, and 7C are an illustration of the rear, right and bottom views, respectively, of the hub of the present invention.
Figure 7B:
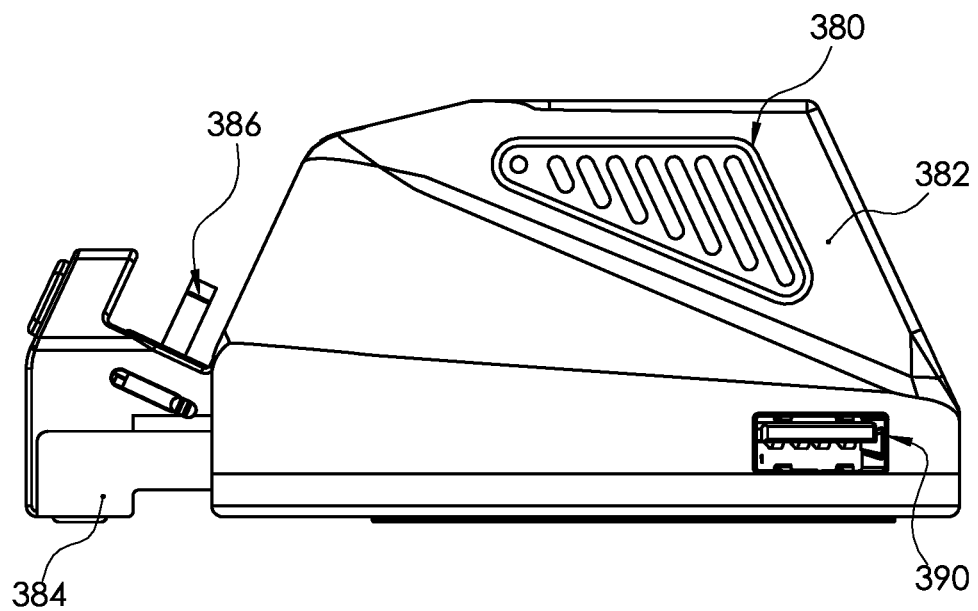
Figure 7C:
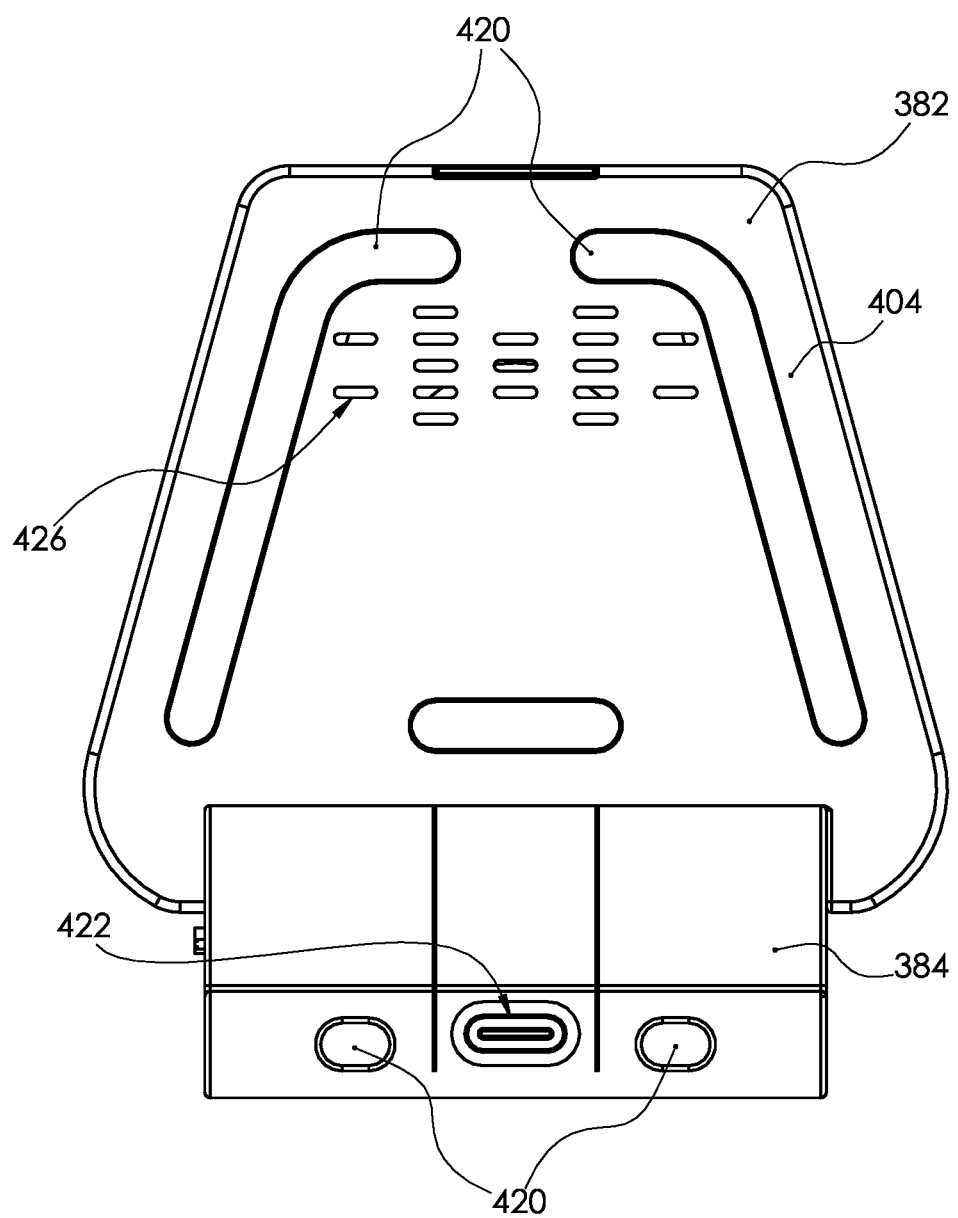

FIGS. 7A, 7B, and 7C show different views of the hub of this invention. The right-side view (FIG. 7B) of the hub 382 shows the right audio output 380 of the built-in speaker, a USB-A port 390 and the telescopic base 384 in extended position and the telescopic USB-C port 386. In the rear view (FIG. 7A) there are the video-camera 400, with its activation LED indicator 408, the hub USB-C input port 410 and the plastic cards compartment 402. The underneath side 404 (FIG. 7C) shows the four grip pads 420 that give stability to the hub 382 when it is on a surface such as a desk and the release button 422 for extend and retract the telescopic base 384 into the hub 382. By pushing the release button 422, the locking system described in FIGS. 11A to 11C, unlocks and permit to extend or retract the telescopic base 384 to be adjusted to the desired position to fit the thickness of the device to install in the telescopic base 384 of this invention. The hub's ventilation slots 426 are also shown.

Figure 8:
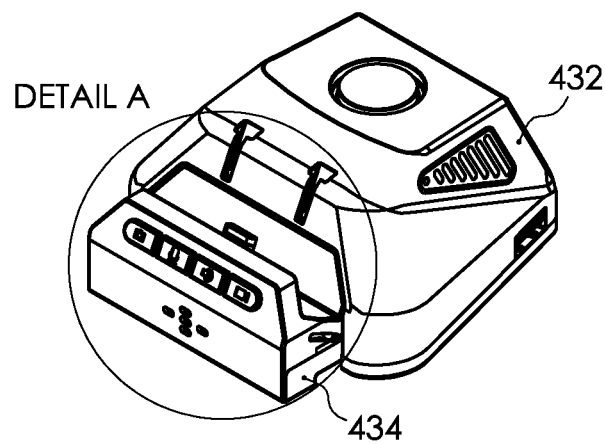
FIG. 8 is an illustration of the USB Type-C port of the present invention with hub control buttons.
Figure 8:
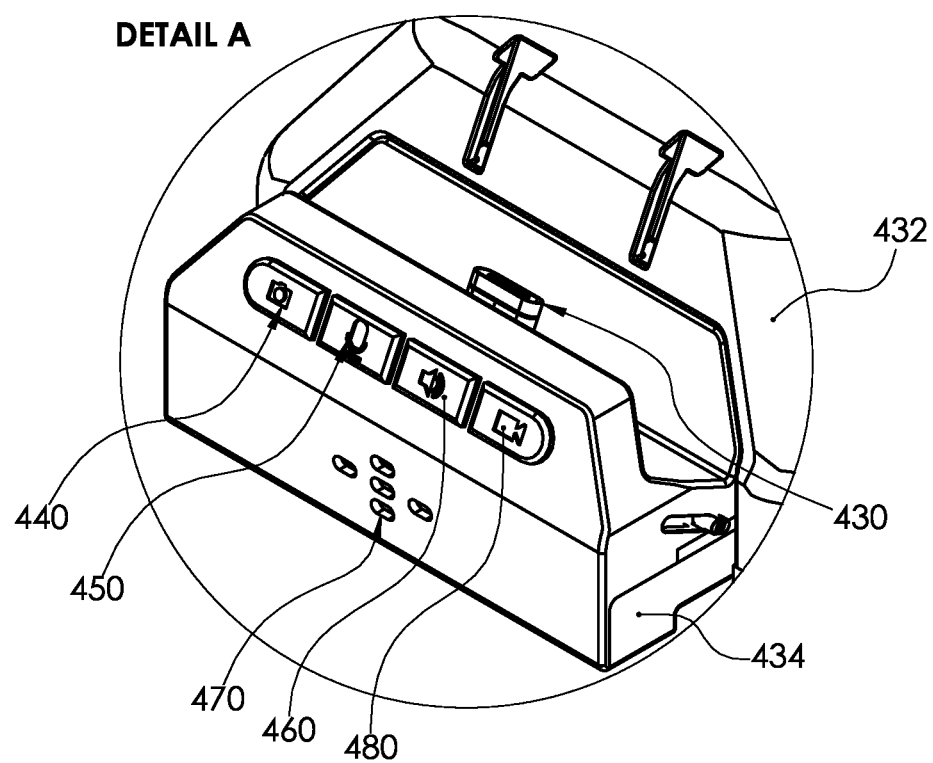

FIG. 8. In this figure there is an isometric front view of the hub 432 with the telescopic base 434 in an extended position. The Detail A enlarges the front section of the hub 432 showing the telescopic USB-C port 430 where the monitor or other apparatuses can be installed, and the hub's control buttons, including, but not limited to, an activation button 440 for taking photos, an on/off microphone button 450, an on/off speaker button 460, the audio input 470 mesh for the microphone, and an on/off video-camera button 480. These features are activated in the hub by means of an embedded software designed so that this invention works as a plug-and-play system dully coordinated with the computer software.

Figure 9:
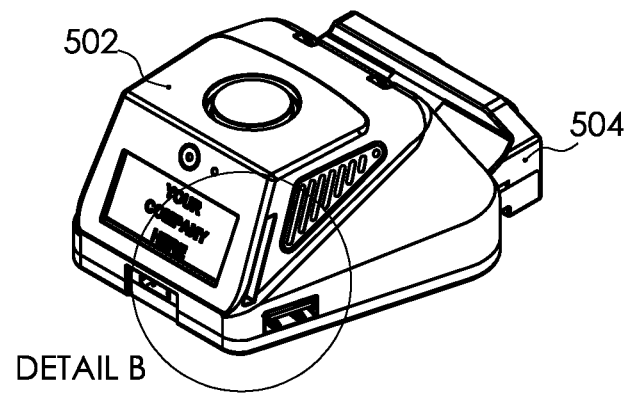
FIG. 9 is an illustration of the rear isometric views of the hub of the present invention.
Figure 9:
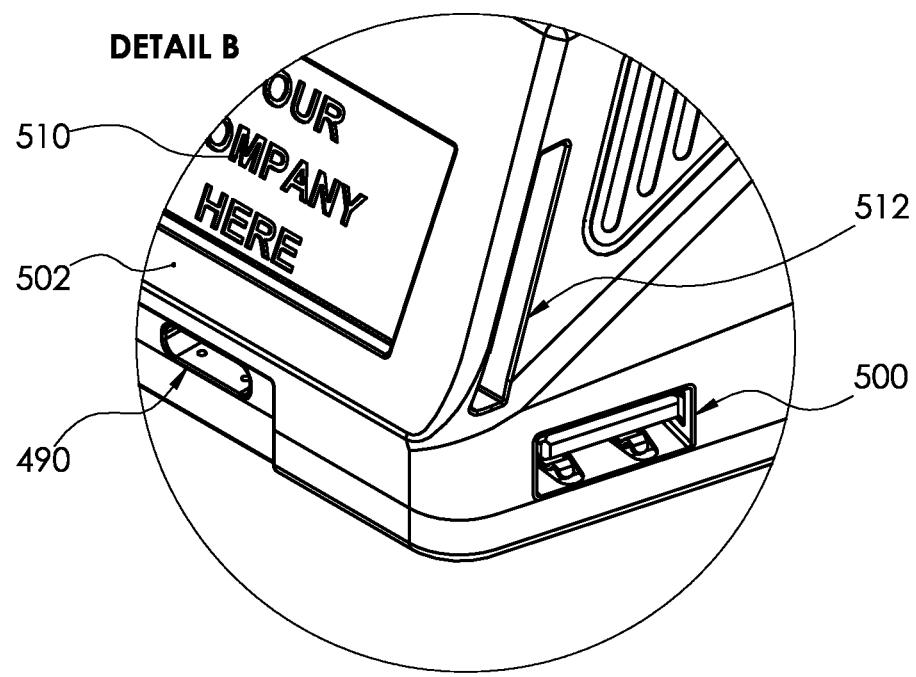

FIG. 9. This figure is an isometric rear view of the hub 502 and shows the telescopic base 504 in an extended position. The Detail B shows how the plastic cards 510 are installed horizontally in the cards slot 512. Also, it shows the input USB-C port 490 for power, video and data, and a USB-A port 500 for data and power transfer with other peripherals.

Figure 10:
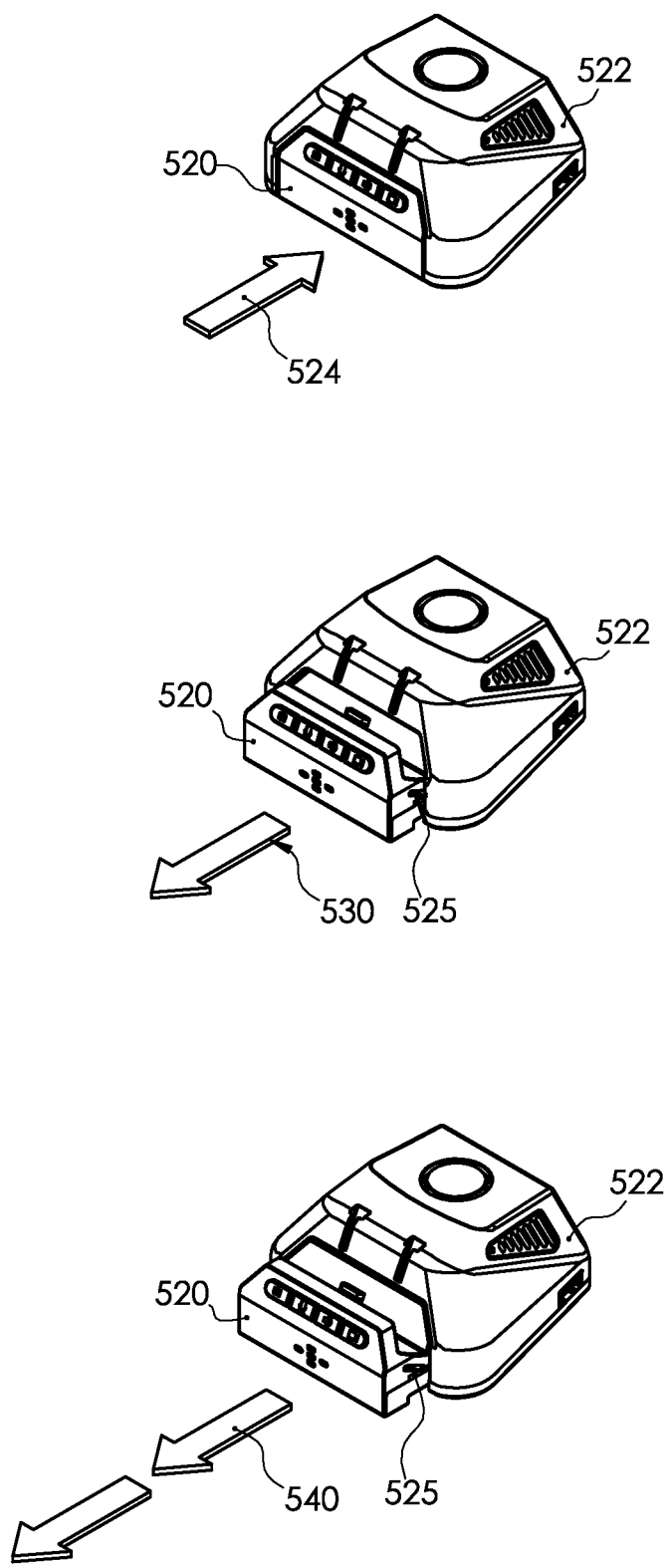
FIG. 10 is an illustration of the telescopic base of the hub of the present invention.

FIG. 10. This view shows how the telescopic base 520 works. In the folded and closed position 524, the telescopic base 520 is folded into the hub 522, and the hub looks like a small, compact and lightweight unit. By manually pulling the telescopic base 520 out, which is done when the release button (See 422 in FIG. 7C) of the telescopic base is pressed up, shown in FIG. 11A to 11C, the telescopic base is moved to any of the seven (7) intermediate adjustable positions 530. In any of these intermediate positions a user can install the monitor originally designed to work with the hub 522 of this invention. In case the user wants to install a protective plastic cover to the monitor, which is of normal use by users to protect this type of portable screens, then the telescopic base 520 can be pulled out again to a bigger intermediate position 540 which allows to install a monitor or other apparatuses of a greater thickness. This telescopic base 520 design will allow the user to install many sizes of devices such as smartphones, tablets and other devices for power supply, data transfer or video, regardless of whether they are bigger, or they have plastic covers or not. The telescopic base 520 slides in and out over the internal hub's rails 525 for about 0.75 of inch. All cabling coming from the telescopic base are connected directly to the main PCB of this invention.

Figure 11A:
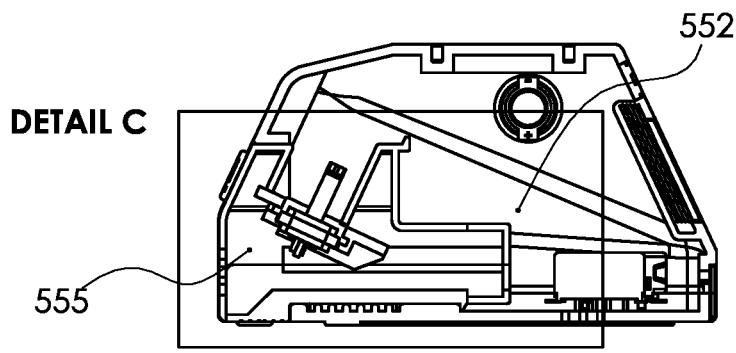
FIGS. 11A, 11B, and 11C are illustrations of the hub's locking slots of the present invention.
Figure 11A:
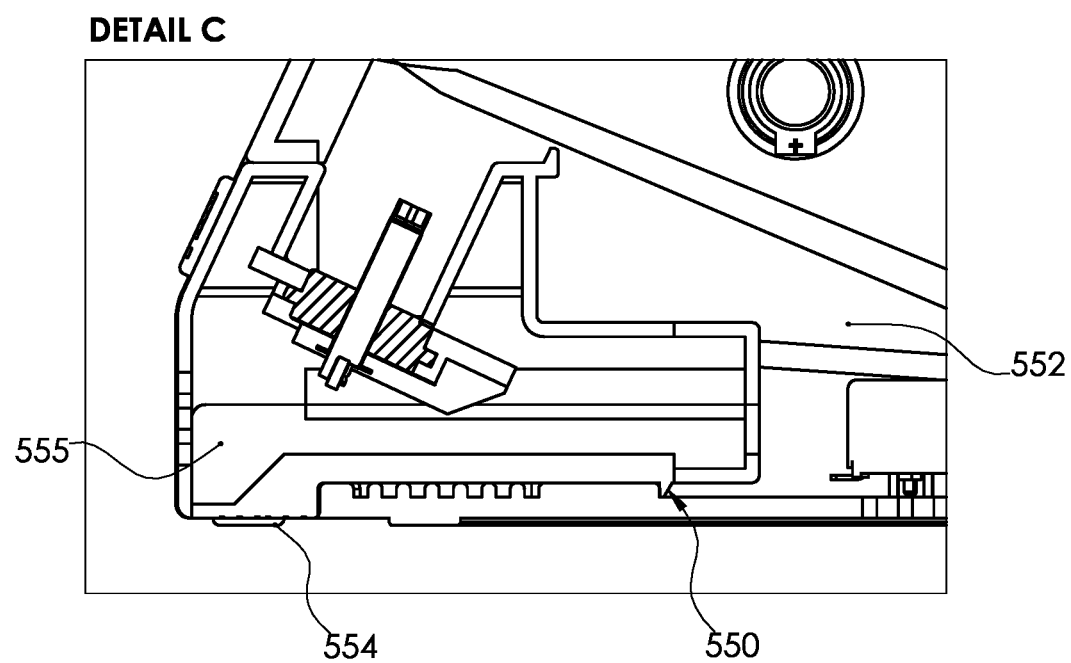
Figure 11B:
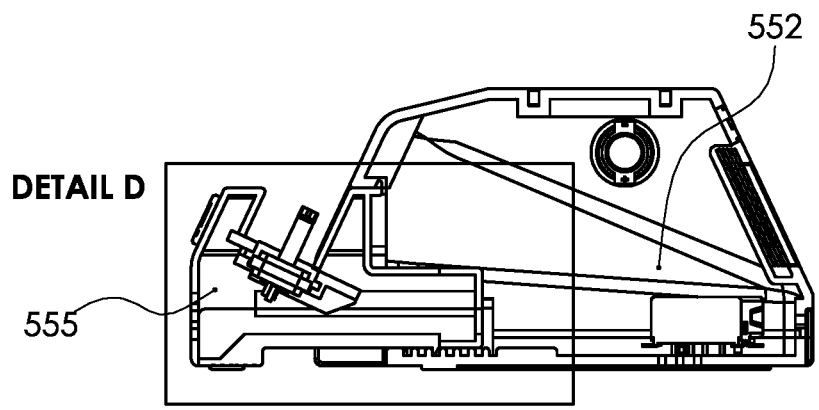
Figure 11B:
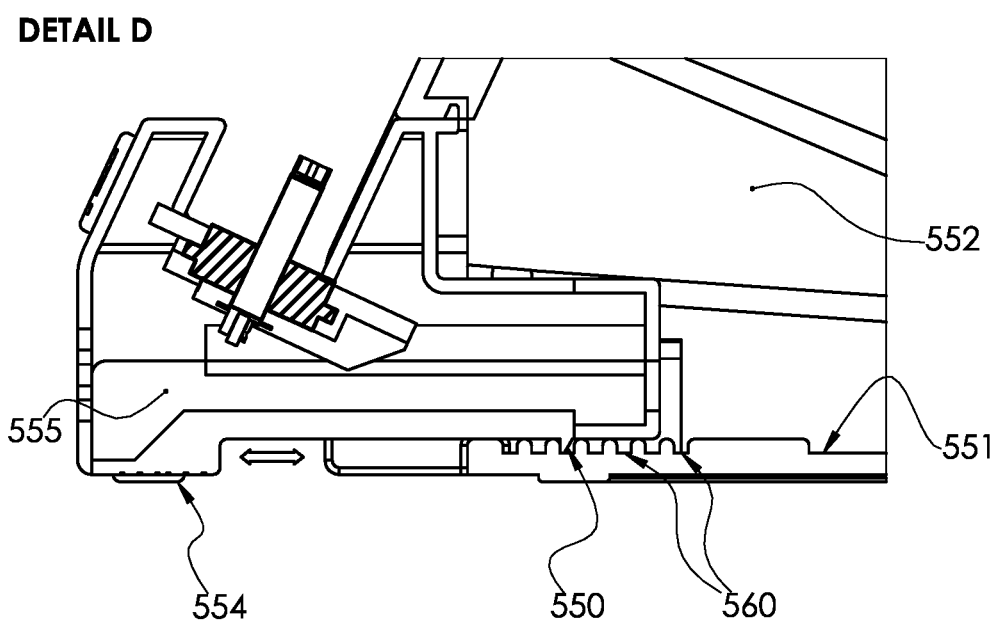
Figure 11C:
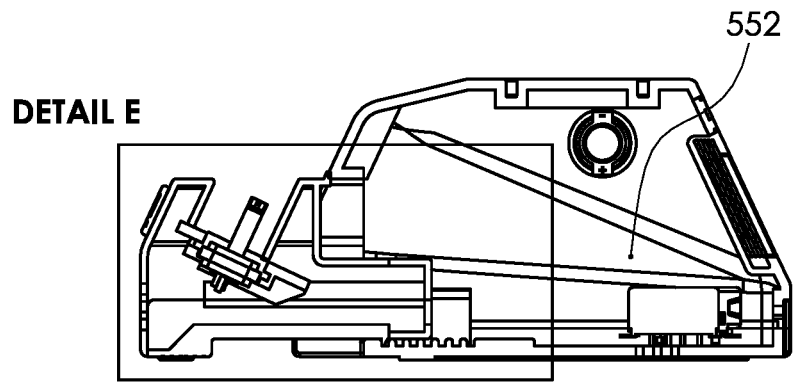
Figure 11C:
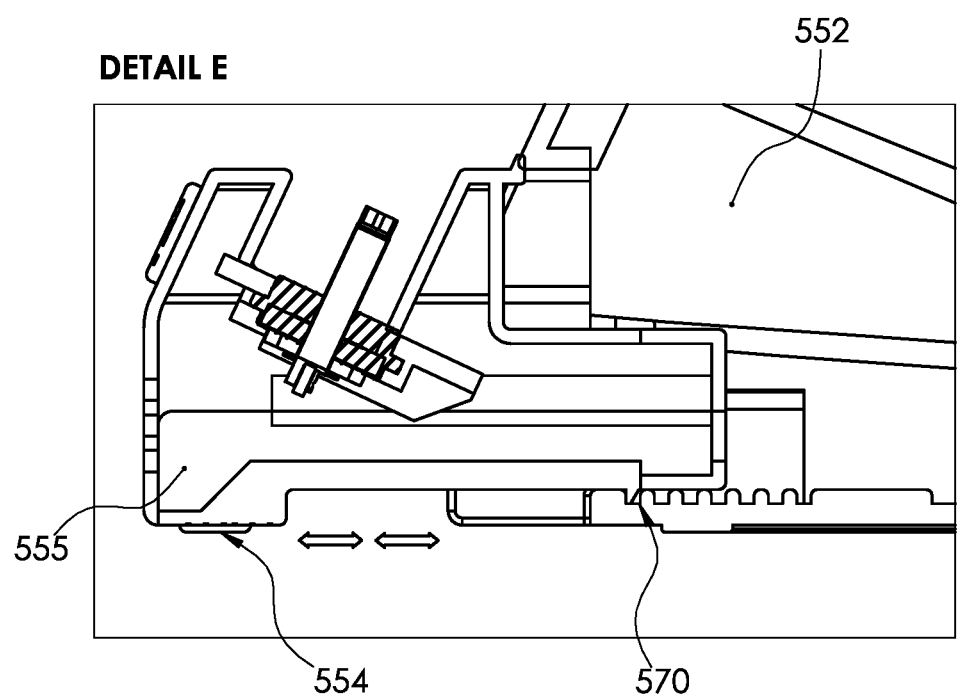

FIGS. 11A, 11B, and 11C show the locking ridge 550 of the telescopic base 555. In detail C (FIG. 11A) it is observed when the telescopic base 555 is folded inside the hub 552, the locking ridge 550 holds the telescopic base in said position. By manually pulling the telescopic base out, Detail D (FIG. 11B), which is done when the release button 554 of the telescopic base is pressed up and horizontally out, the telescopic base can be moved to any of the intermediate positions' locking slots 560, located in the bottom internal surface 551 of the hub 552 in order to fit the thickness of the apparatus to be installed. By pulling the telescopic base 555 to the maximum extension position 570 this invention will receive up to the maximum thickness of 0.75 inches of an apparatus. (FIG. 11C).

Figure 12:
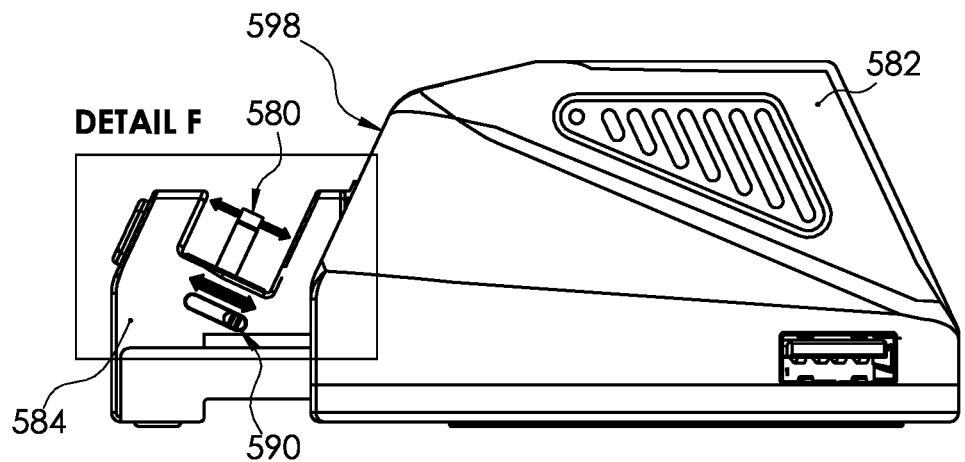
FIG. 12 is an illustration of the telescopic USB-C fine-tune adjustment button located in the hub of the present invention.
Figure 12:
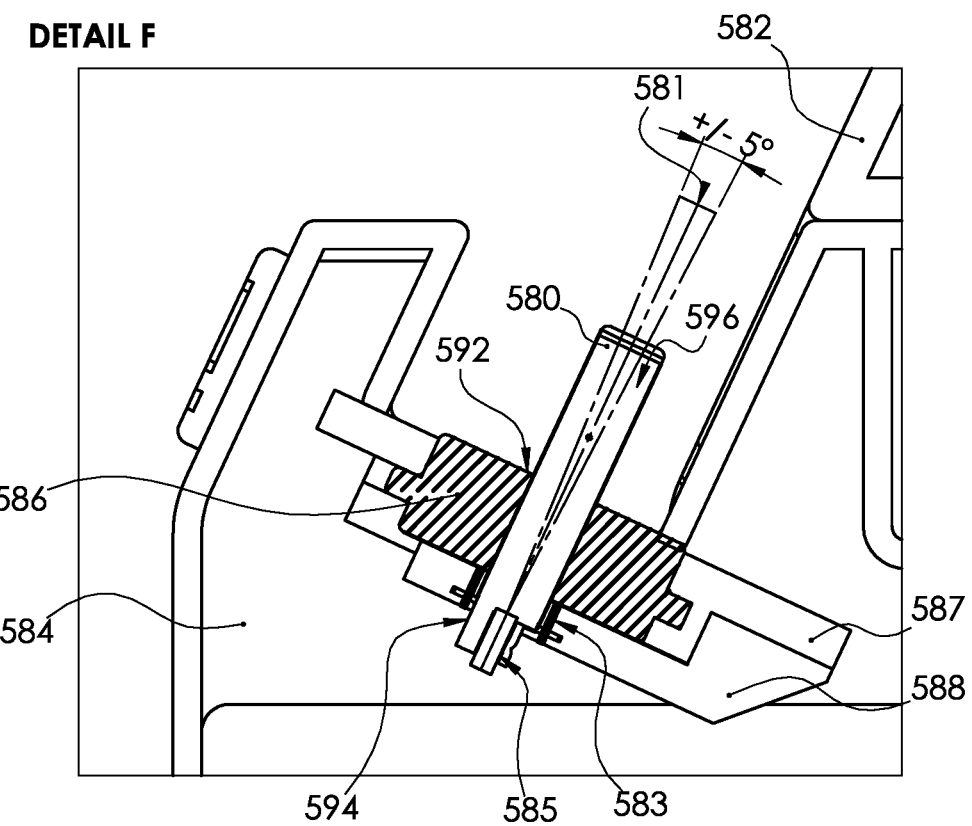

FIG. 12. This figure shows a fine adjustment system 590 to move the telescopic USB-C port 580 inside the telescopic base 584 in the hub 582. In this way, depending on where the power and/or data/video port of the monitor, smartphone, tablet or other device are located, the fine-tune adjustment of the telescopic USB-C port 580 can be positioned to accommodate and fit the precise distance of the device port of the connected apparatus, and do not break the telescopic USB-C port 580 due to the mechanical effort that these connecting devices can exert when connecting and disconnecting them from this invention. As explained in Detail F, the telescopic USB-C port 580 pivots over a pivot 583 that provides a +/−5.0 degrees of adjustment, compared with the centered line 581. The telescopic USB-C port is sustained in the top side 592 of the hub frame 587, in the bottom side 594 by a clip 588 which has a pivot space 583 to provide mobility to the USB connector 596. An elastic plastic dust seal 586 provide flexibility and protection for particles entry into the hub. This design release mechanical strengths in the telescopic USB-C port 580. The apparatuses installed in the telescopic base 584 will be horizontally supported in the sustaining wall 598 of the hub 582. The signals sent from the PCB are carried by cable to the connecting port 585 of the USB-C 580. The top side 592 of frame 587 also receives and supports the attached device.

Figure 13A:
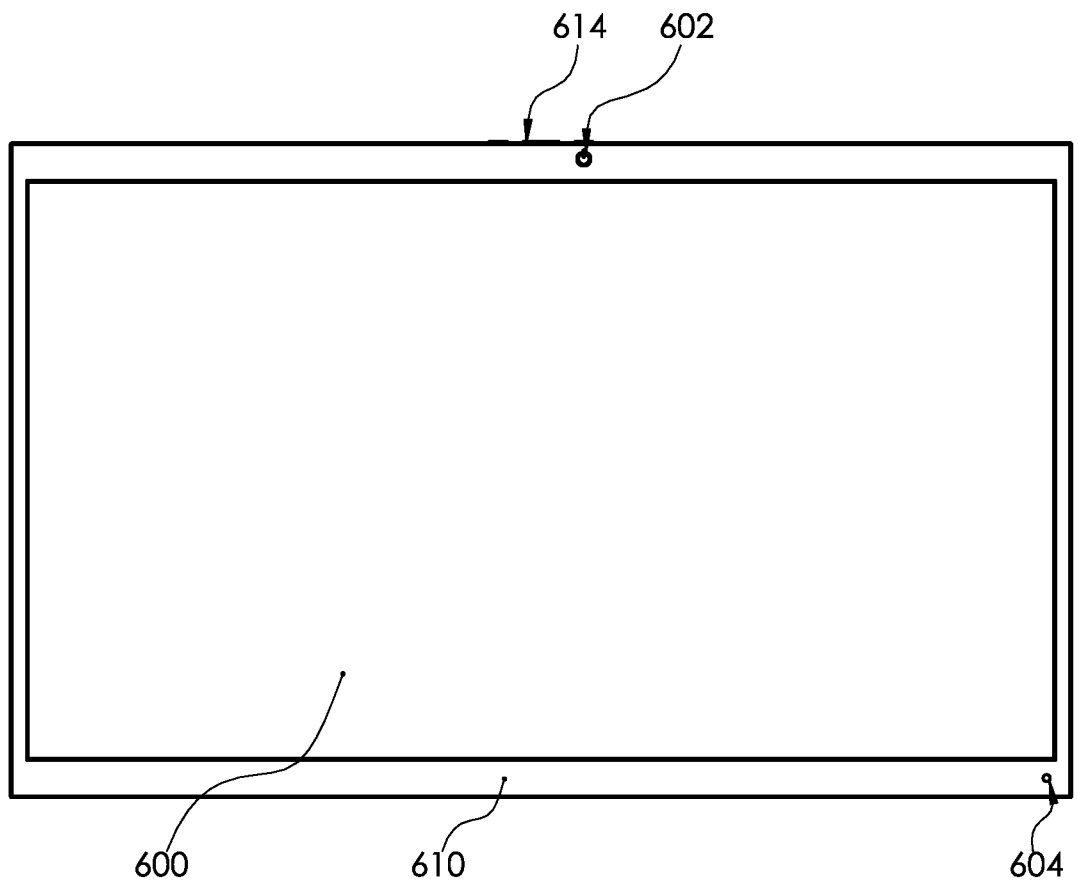
FIGS. 13A, 13B, and 13C are an illustration of the screen mechanical guides of the present invention.
Figure 13B:
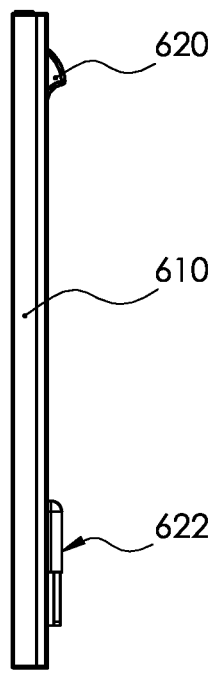
Figure 13C:
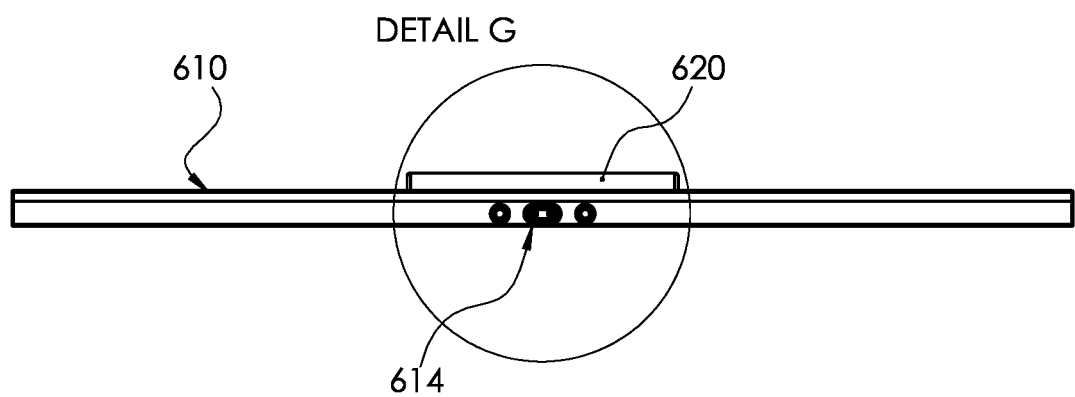

FIGS. 13A, 13B, and 13C shows the front (FIG. 13A), top (FIG. 13C) and right side view (FIG. 13B) of the monitor 610 identifying a touchscreen display 600, the set-up buttons 614, these buttons allow the user to configure the setting of brightness, contrast, sharpness, and other available configurations of the monitor, the description icons 602 of these buttons, the led indicator 604 when the monitor is turned on, the manipulation handle 620 and the assembly guides 622 for connecting the monitor with the hub and provide mechanical stability. Internally the monitor 610 includes a rechargeable battery and a set of electronics for communications with the hub (340 of the FIG. 6A) and other peripherals apparatuses.

Figure 14:
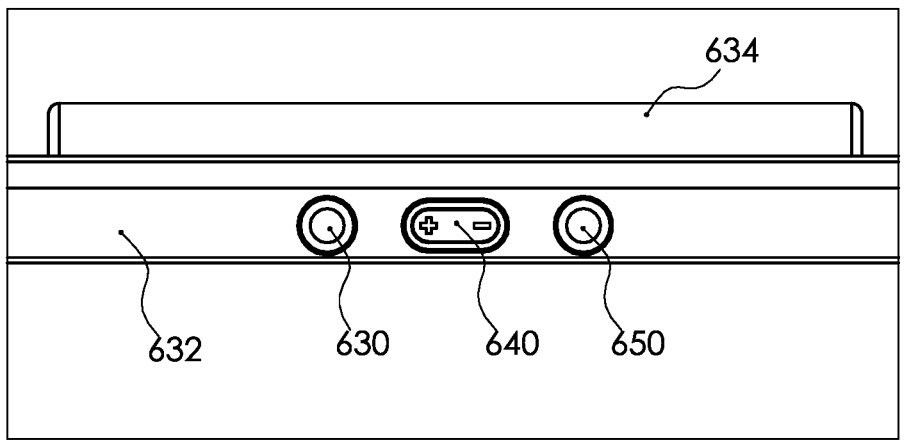
FIG. 14 is an illustration of the screen set-up buttons of the present invention.

In FIG. 14, this figure enlarges the Detail G shown in FIG. 13, where the monitor control buttons are described. It shows the screen power button 630 that turns the screen 632 on and off, the up/down button 640 that moves the display options selector, and the select button 650 that activates the menu and opens the display setting options such as, but not limited to, brightness, contrast, color, image, energy options, language, information, return and exit. By pressing the select button 650, all the previous options are activated, and the user can use the up/down button to choose the option desired to modify. Afterwards, user can press the select button 650 again, and then enter to edit the value by pressing the up/down button 640 up to the desired value. To exit the option then press return, select any other option, or press exit to exit the display configuration. The monitor 632 will be powered directly from the telescopic USB-C port, both for power and data transfer. There are different options to provide power to the hub as will be explained later in this document. This figure also shows the monitor's manipulation handle 634 in a top view that would be part of the screen frame or mechanically attached by means of screens to the chassis of the monitor.

Figure 15:
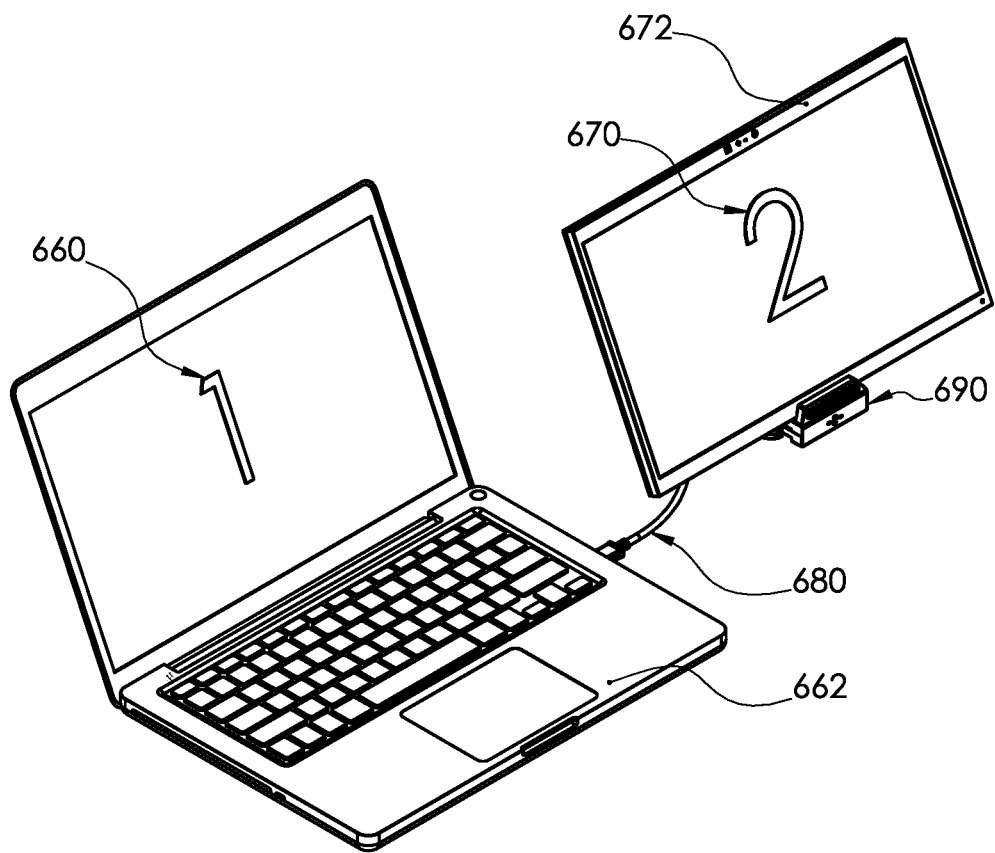
FIG. 15 is an illustration of the present invention working as an extended screen of a laptop computer.

FIG. 15. This figure shows the hub 690 of this invention connected by cable 680 to a laptop 662. In this configuration, the user can use the screen 1 660 of the laptop 662 and extend a new one or duplicate the same image on the display 2 670 of the portable monitor 672 when it is installed on the hub 690. The type of communication between the hub and the monitor would be Display Port or other wired or wireless technologies, including but not limited to, wireless video transmission, wi-fi, Bluetooth, 4G or 5G communications protocols, etc. The USB-C cable 680 carries different signals such as video, data and power that are used and distributed to the hub's ports. The cable would include a retractable reel to permit move the hub far from the computer. This functionality is commonly used by users to increase their performance among other benefits described in the Usage section of this document.

Figure 16:
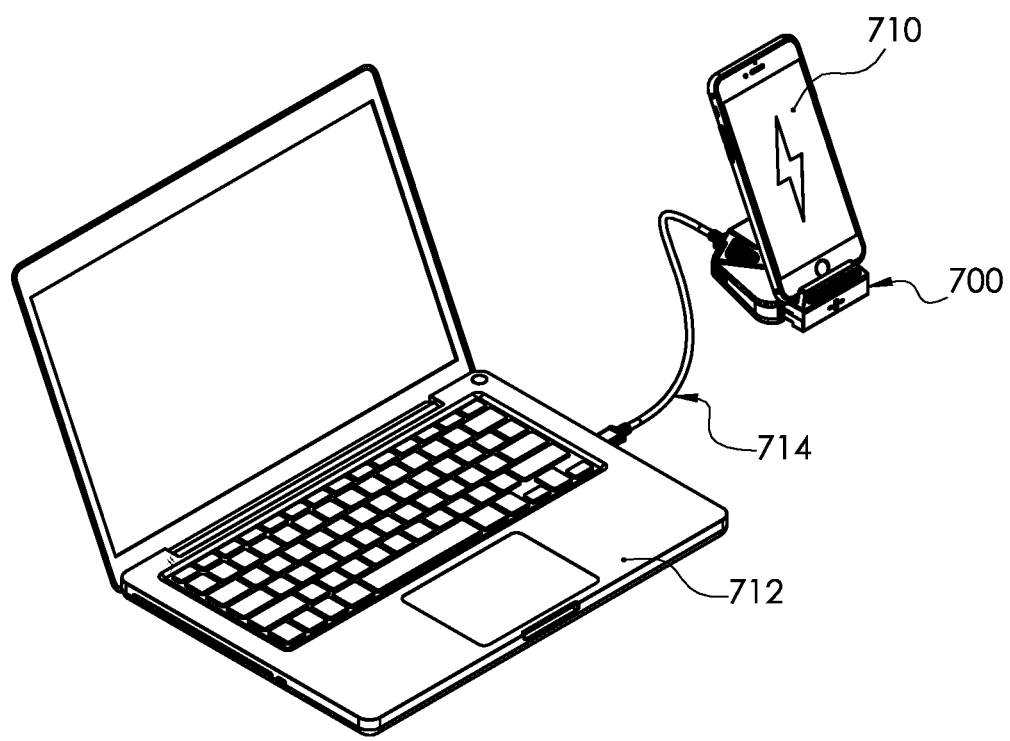
FIG. 16 is an illustration of the present invention working as a smartphone charger with data transfer.

FIG. 16. This figure shows how this invention also serves to charge or share data and/or video with other types of devices such as a smartphone 710 when it is installed in the telescopic USB-C port of the hub 700 and the hub is connected by cable 714 to a laptop 712. In the described designs USB-C connectors are mentioned, but the hub can also be built with other types of ports that allow connecting other devices with proprietary connectors such the used by Apple or other brands, etc. In this way the devices can be loaded, transmit power, data and/or videos through the wired connection to the computer. As will be explained later, this invention can be connected wired or wireless (wi-fi, Bluetooth and other wireless technologies) with other apparatuses.

Figure 17:
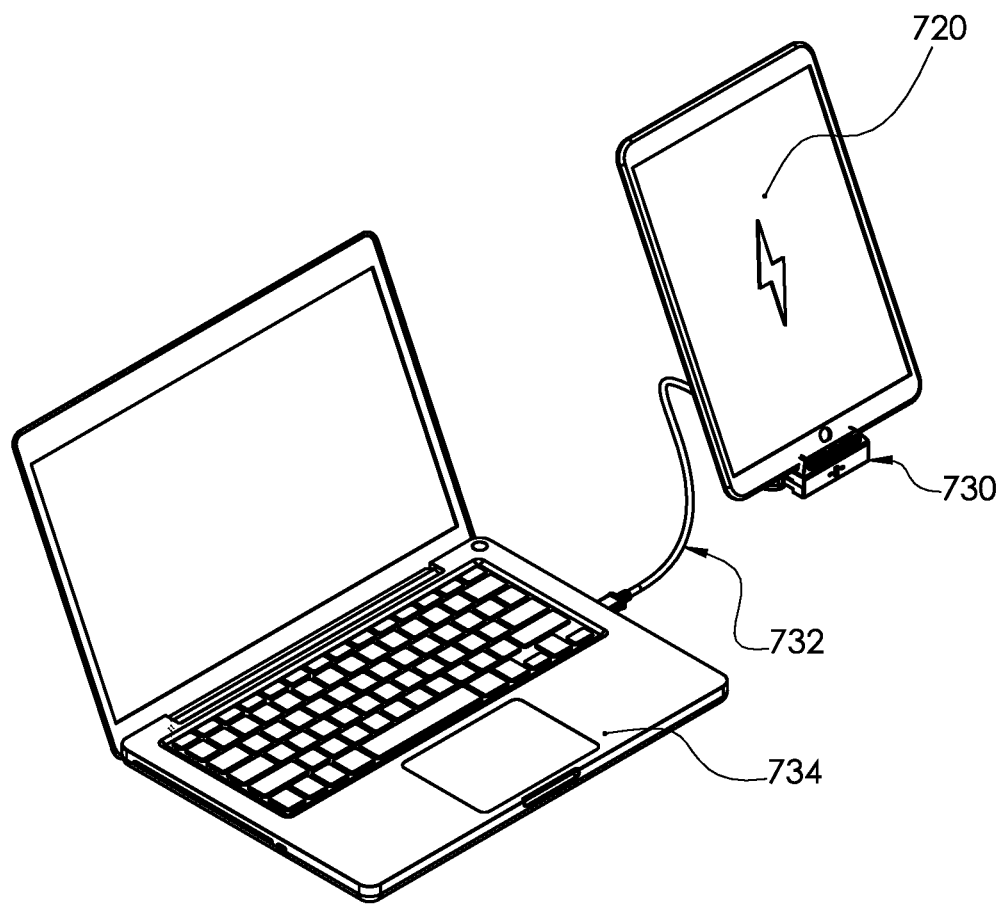
FIG. 17 is an illustration of the present invention working as a tablet charger with data transfer.

FIG. 17. This figure similarly shows how to connect a tablet 720 to the hub 730 system, and the hub system to a laptop 734 with a cable 732, with the same benefits announced in the previous FIG. 16.

Figure 18A:
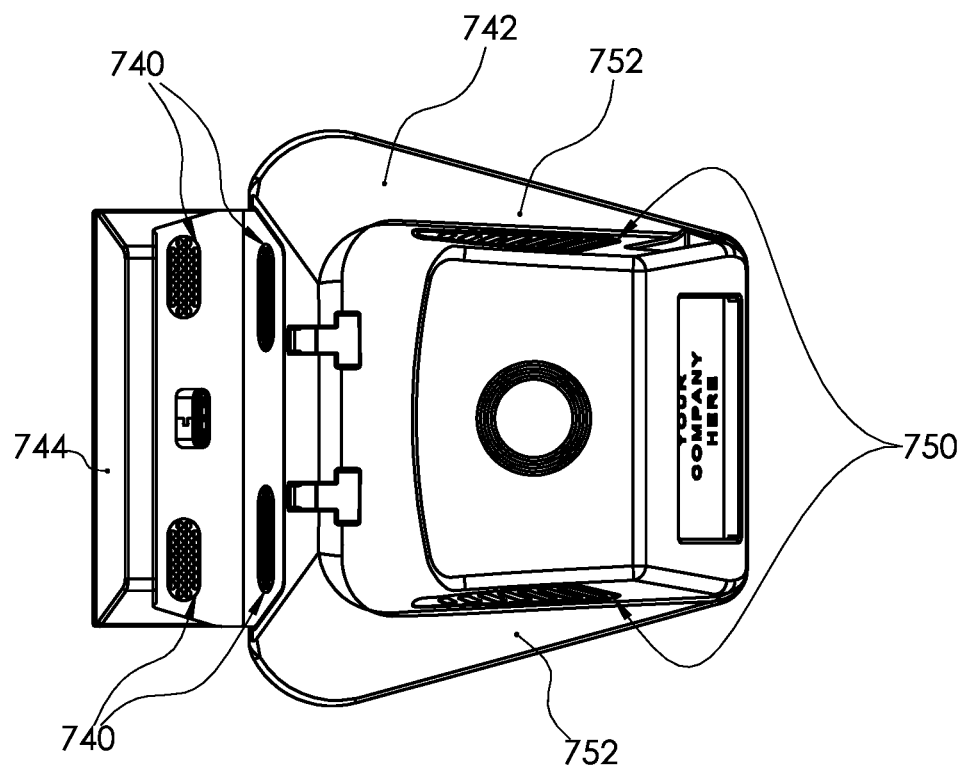
FIGS. 18A and 18B are an illustration of the top and side views showing the sounds input and output ports of the hub of the present invention.
Figure 18B:
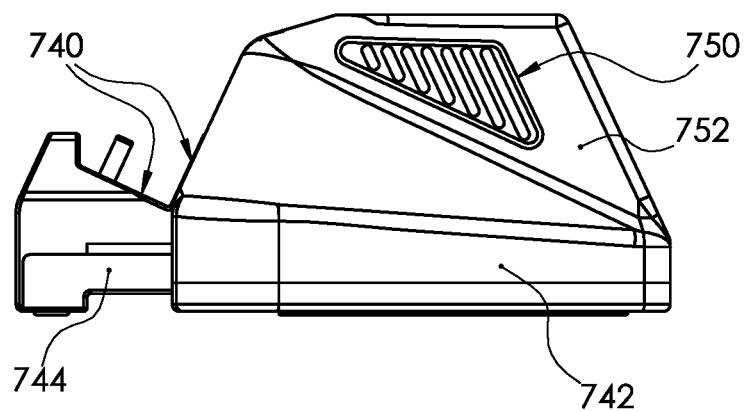

FIGS. 18A and 18B are top and side views respectively, which show the sound inputs 740 located on the telescopic base 744 of this invention, which allow the sound of smartphones, tablets and other devices that have the speaker at the bottom next to the power connector to enter. The sound enters the hub and with the internal resonance bars design explained in the following FIGS. 19A and 19B, the sound is amplified and comes out with more power through the audio outputs 750 located on both sides 752 of the hub 742. In this sense, this invention also acts as a resonance box to amplify the sound power of the devices that are connected in the telescopic USB-C port.

Figure 19A:
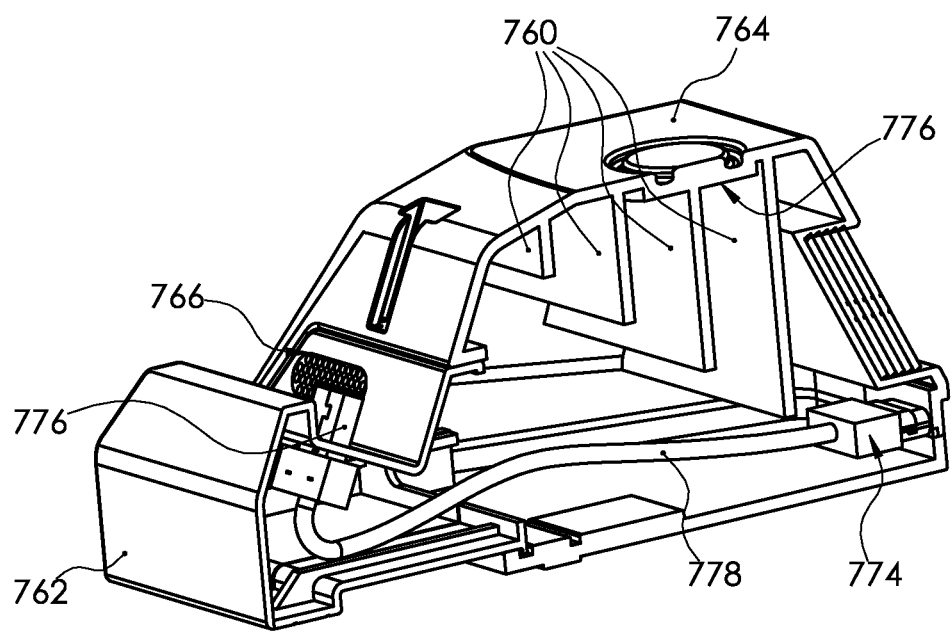
FIGS. 19A and 19B are an illustration of the internal resonance bars and sound output port of the hub of the present invention in section view.
Figure 19B:
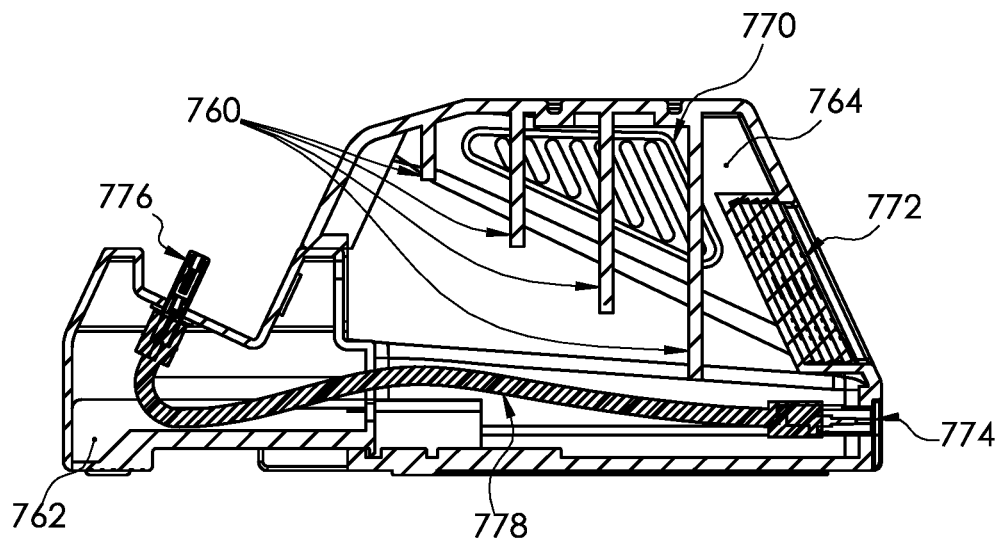

With FIGS. 19A and 19B, these figure show a cross section and internal side of the hub 764. When the sound comes in by the sound inputs 766 and 740 of FIGS. 18A and 18B, both located in the telescopic base 762, the multiple parallel resonance bars 760 (four are shown in FIGS. 19A and 19B, but more may be included, and at least one is included in the embodiments) which together create one or more acoustic pathways to help to amplify the sound in about, but not limited to, a range among 5 to 10 decibels and emit it through the audio output 770 located on both sides (See 752 of FIG. 18A) of the hub 764. As seen in FIGS. 19A and 19B, the parallel resonance bars 760 are preferably arranged in increasing length within the hub from front to back (or alternatively, back to front), are equal distance apart from each other, and extend downward from the internal top side 776 of the hub 764, and across the width of the hub. This figure also shows an option of connection between the telescopic USB-C port 776 with the hub USB-C input port 774 by means of a flexible pass-through cable 778, in order for this invention to act, in one of its versions, as a charger and sound amplifier of apparatuses such as smartphones, tablets, etc. This figure also shows the interchangeable plastic cards 772 installed horizontally in the cards slot section.

Figure 20A:
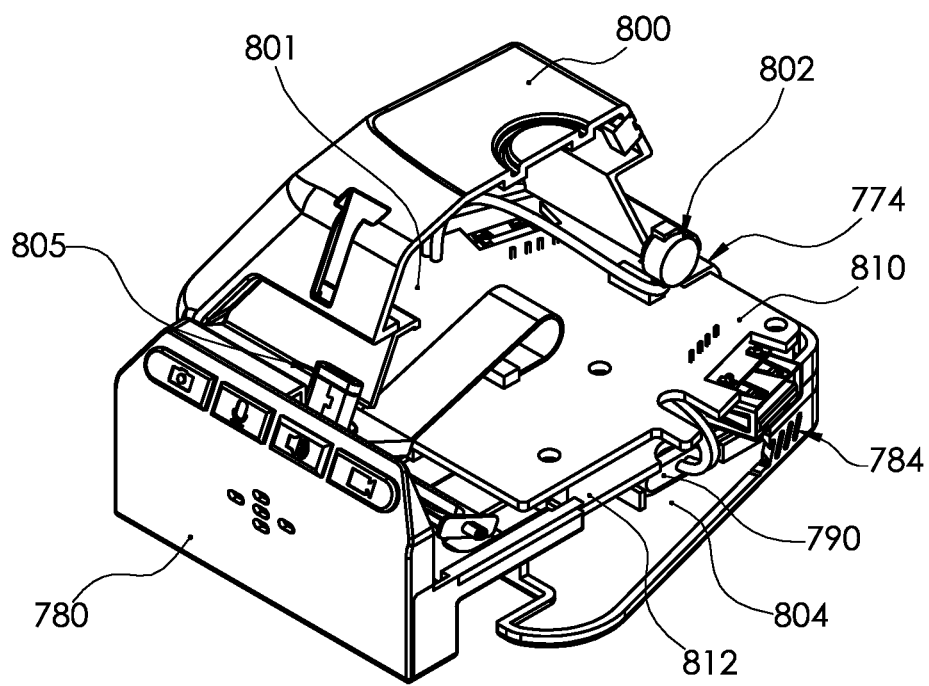
FIGS. 20A and 20B are an illustration of the batteries compartment of the present invention.
Figure 20B:
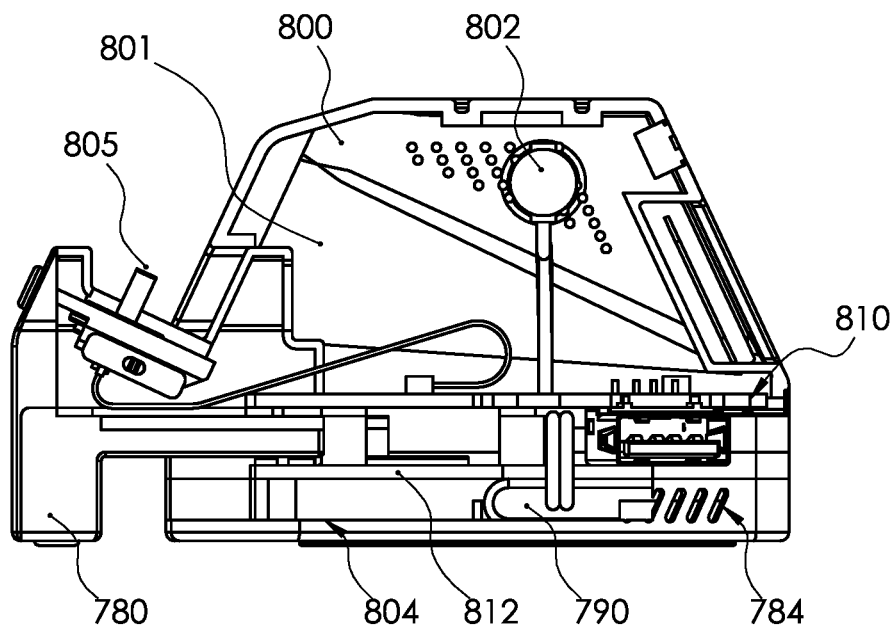

FIGS. 20A and 20B show the internal view of the hub 800 of this invention, including internal electronic speakers 802 on the both sides (See 752 of FIG. 18A) of the hub 800 and the bottom section 804 where the rechargeable battery 790 is housed. The rechargeable battery 790 is placed under the PCB module 810 separated by an isolation plate 812. Ventilation holes 784 aid in convective heat transfer and helps the battery maintain a proper temperature when in use. The rechargeable battery 790 is charged through the hub USB-C input port 774, when this invention 800 is connected to a computer, or an A/C adapter or another power source. The telescopic base 780 with the telescopic USB-C port 805 are also shown.

Figure 21:
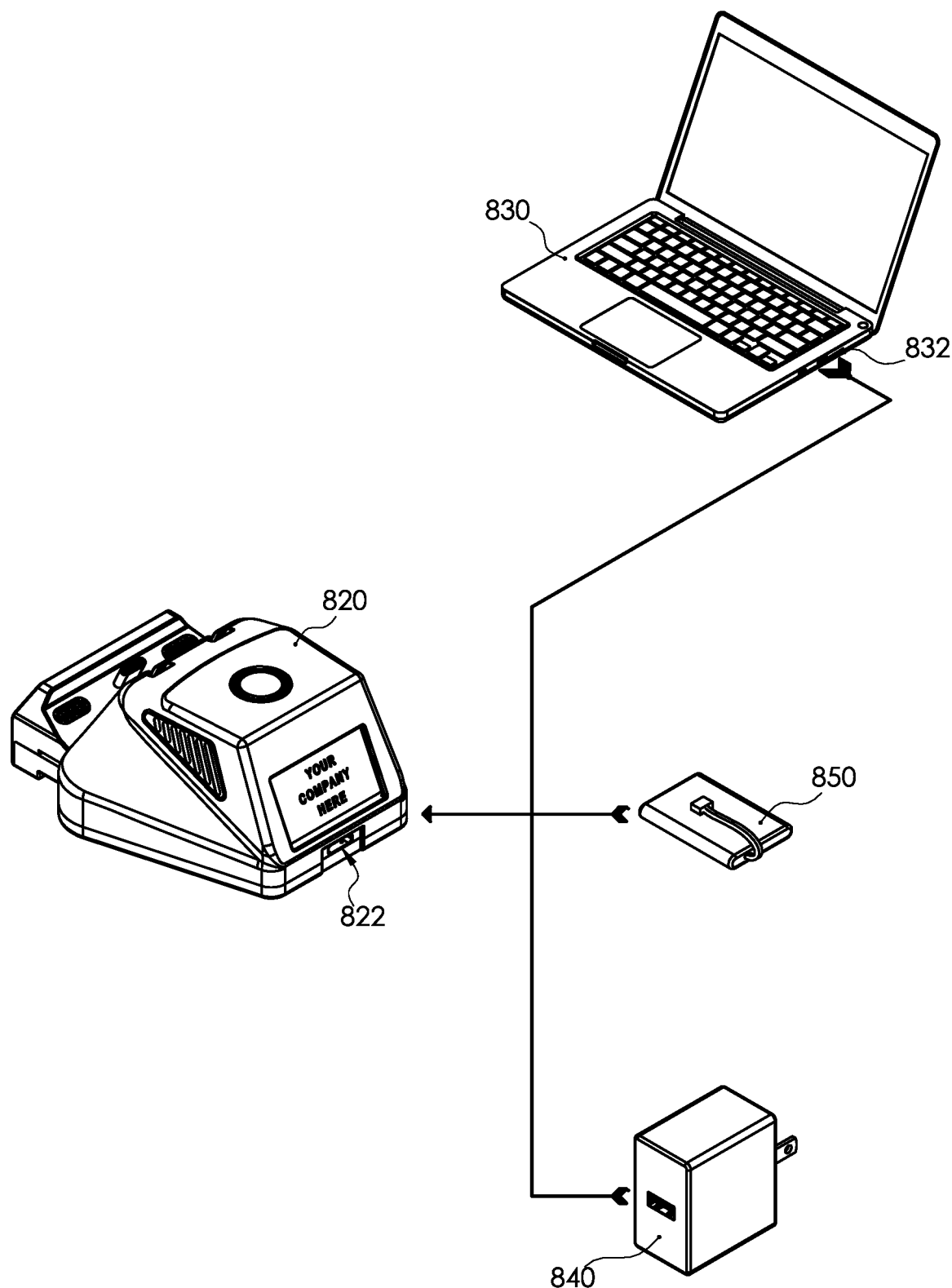
FIG. 21 is an illustration of the different options to provide energy to the hub of the present invention.

FIG. 21. This figure describes how the hub 820 can obtain power in the USB-C port 822, which would be, but not limited from, a USB-C or USB-A port 832 of a computer 830, or from an A/C adapter 840 (for instance 110/220v), or from the internally installed rechargeable battery 850. This invention is a self-contained device that can even work as a power bank unit to charge devices such as smartphones or tablets.

Figure 22A:
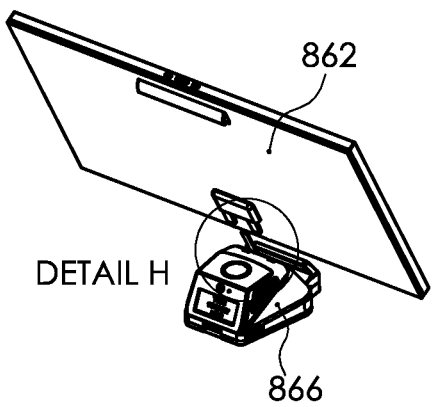
FIGS. 22A and 22B are an illustration of the screen assembly of the hub, with exploded views.
Figure 22A:
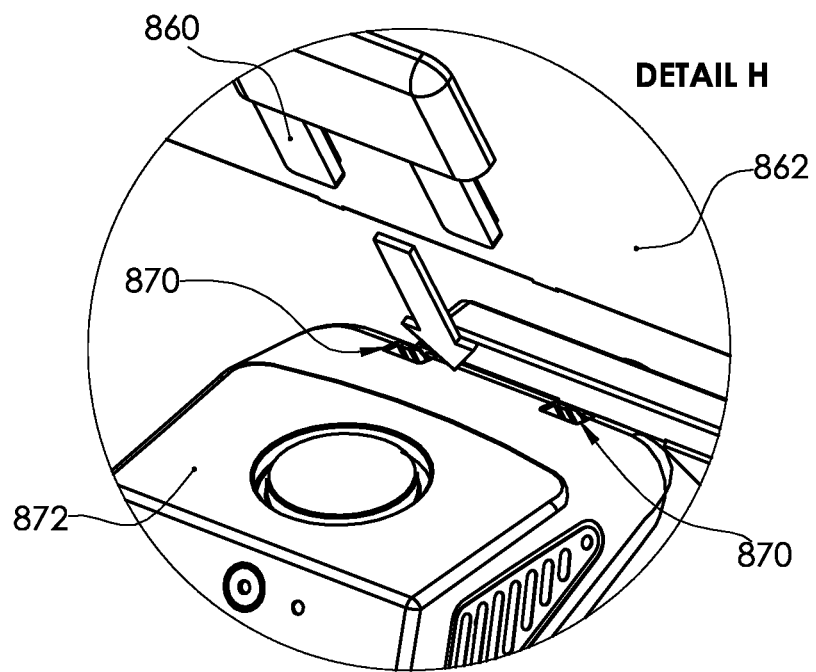
Figure 22B:
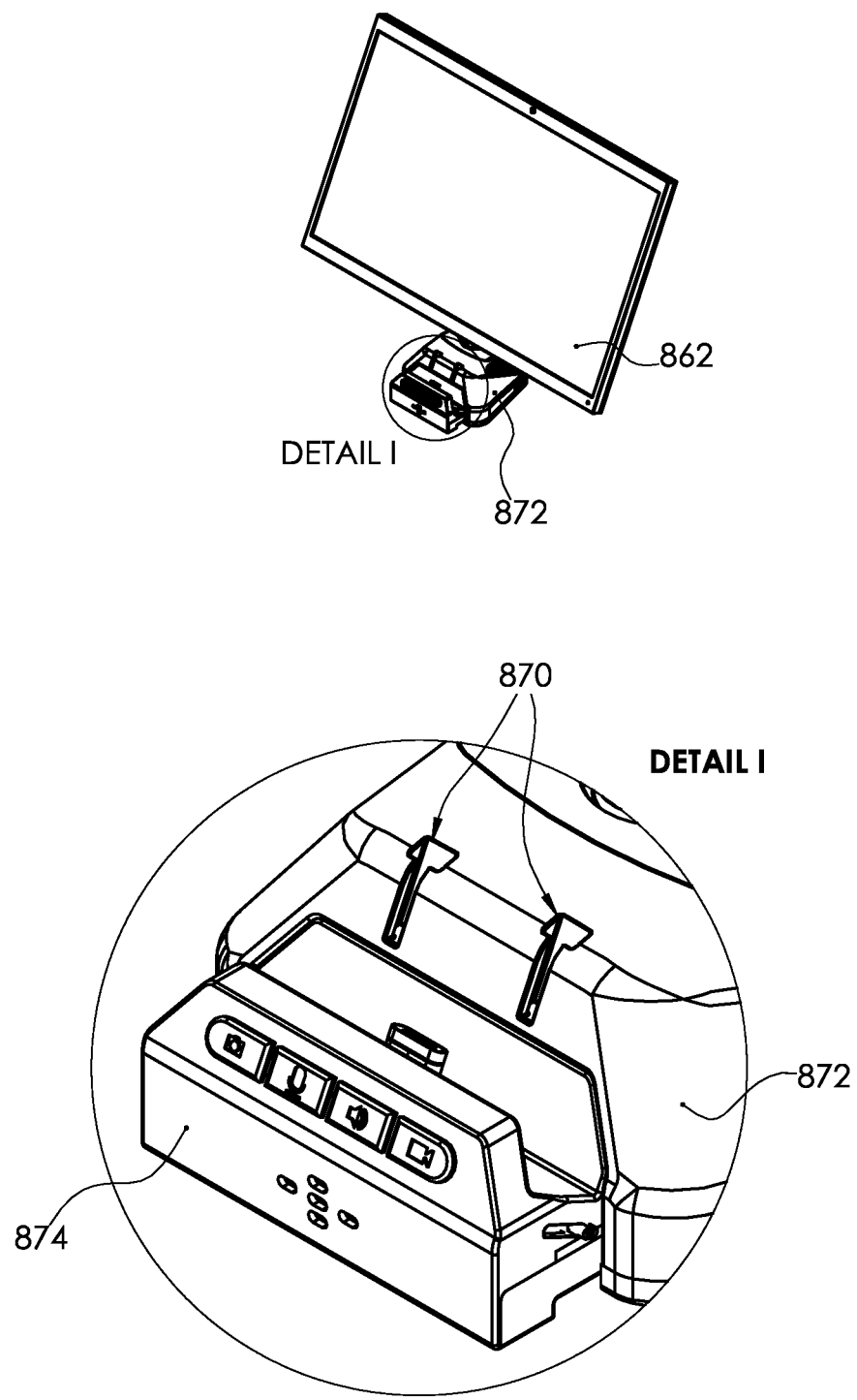

With FIG. 22A, the Detail H shows how from an isometric back view the screen guides 860 aligns the monitor 862 with the grooves 870 of the hub 872 of this invention. This mechanical design provides horizontal stability to this invention when user touches the screen in any angle or when push any of the screen control buttons in the top side. In FIG. 22B, the Detail I shows a frontal isometric view of the hub 872, including the two grooves 870 for receiving the monitor 862, and the telescopic base 874 in an extended position.

Figure 23:
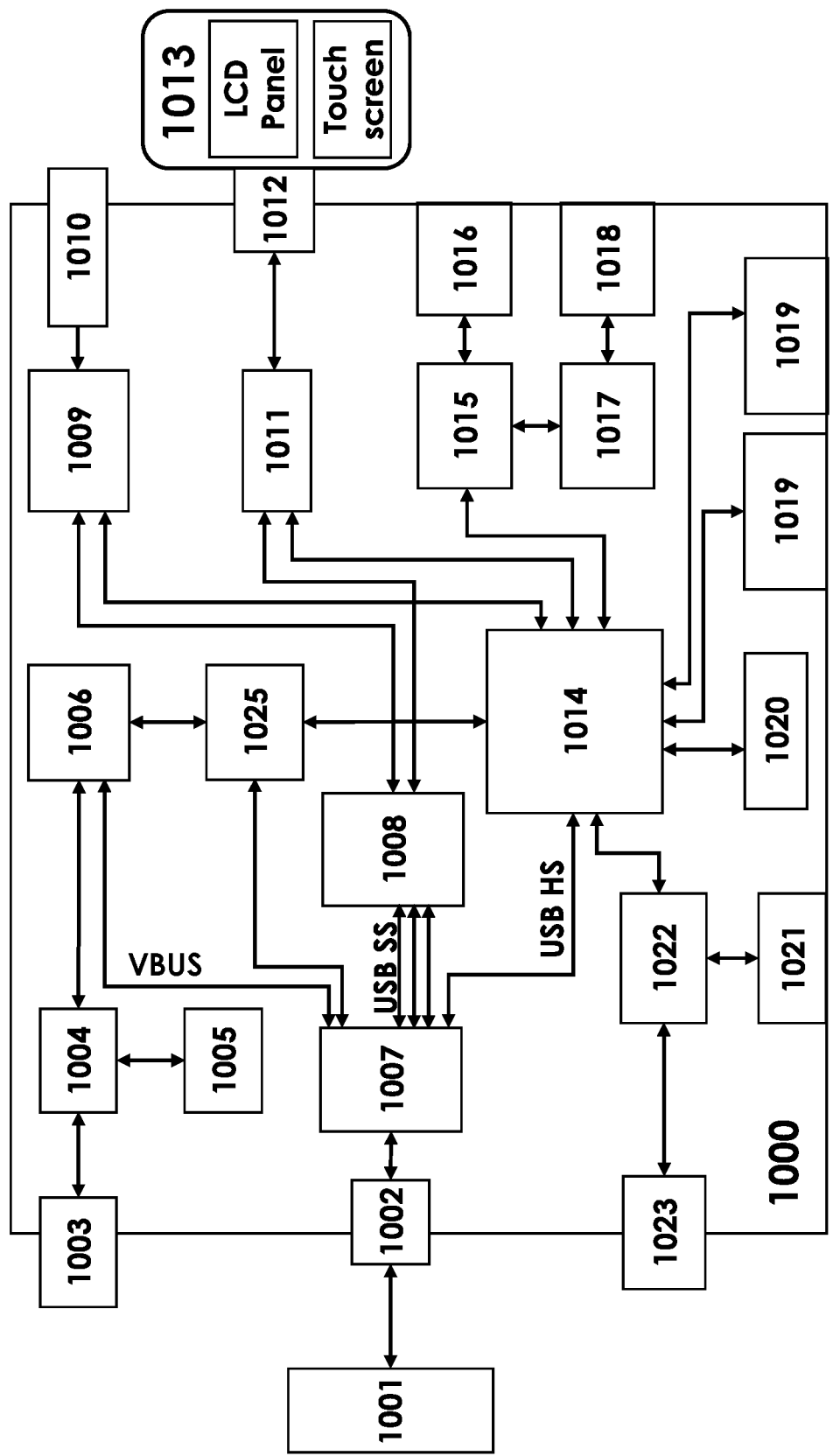
FIG. 23 is an illustration of the electronic block diagram of the present invention.

FIG. 23 figure depicts a block diagram of the exemplary embodiment device's (TBD) internal capabilities. The hub 1000 connects to a user's PC, laptop, tablet or phone 1001 via a USB-Type C connector 1002. This connection carries power, video and, data communications. Each signal undergoes filtering, clamping and conditioning to reduce unwanted electromagnetic interference and emissions 1007.

Power delivered by the connected device reaches a Power Module 1006. This circuitry 1006 monitors the voltage and current and allows the USB Type-C cable to be reversed while still powering the device. The Power Module 1006 also provides some overvoltage/current protection.

In one embodiment of the device, a rechargeable Lithium-Ion Battery or Pack 1005 is installed. When power is available for the Charger Module 1004 to recharge the cell with. In one embodiment of the device, a power connector 1003 is available for providing external power to the hub 1000.

Data, power and, video are provided to a Type-C controller with Power Delivery 1025 which handles enumeration with the host 1001 and provides power delivery to a USB 2.0 Hub 1014 and any connected devices (1015, 1016, 1017, 1018, 1019, 1020, 1022).

A MUX module 1008 handles crossing and uncrossing of the USB superspeed data pairs to support a reversed USB cable connection.

One or more superspeed data pairs are routed to converter module for the camera 1009. Embodiments may be developed to support MIPI, LVDS, HDMI, Display Port and other display formats. A camera image sensor 1010 sends video data to the converter module 1009 for reception back to the host 1001.

One or more superspeed data pairs are routed to a USB-display converter module 1011. Embodiments may be developed to support MIPI, LVDS, HDMI, Display Port and other display formats. A USB Type-C connector 1012 allows a connected display 1013 to be docked and stream video output from the host 1001.

Various embodiments may be developed to support different display sizes, formats, resolutions, color profiles, viewing angles and mechanical profiles. One embodiment supports a touch screen in the display that provides input to the host 1001 via a USB or I2C interface.

A USB audio codec 1015 connected to a microphone 1016 converts audio in the environment to a USB data signal for transmission back to the host 1001. A USB audio amplifier 1017 connected to one or more speakers 1018 converts a USB data signal from the host 1001 into audio for playback in the environment.

A USB Flash module 1021 connects to the USB 2.0 HUB 1014 and provides local data storage to the connected host 1001.

In one embodiment a microcontroller 1022 reads button inputs 1023 for local control and transmission back to the host 1001.

Embodiments may support turning the camera on and off, muting and unmuting the speaker or microphone, blanking the display, triggering lights, sounds or other behaviors from a connected NFC device 1021, and various wireless data operations.

Embodiments of the microcontroller 1022 support WiFi and Bluetooth for sending and receiving data to other connected devices and databases. The microcontroller 1022 also sends and receives data from an NFC coil 1021. In one embodiment the NFC coil would read data from a figuring or action figure and trigger sound effects from the speakers. In one embodiment the NFC coil would read information sent from a temperature, light, biometric or atmospheric sensor.

USB Type-A ports 1019 provide power for charging connected mobile devices and a data link back to the Host 1001.

Figure 24:
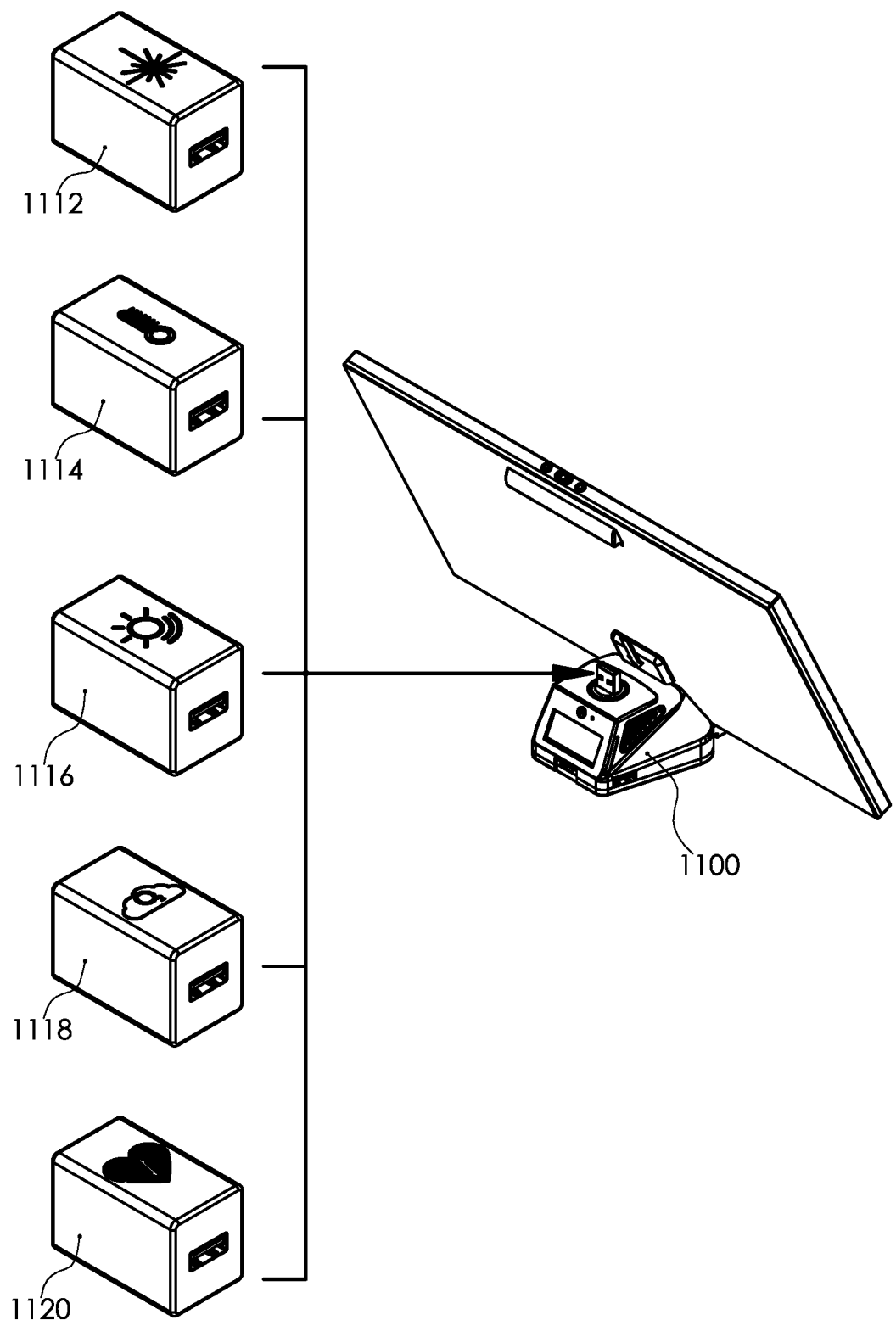
FIG. 24 is an illustration of the connecting sensors options with the present invention.

FIG. 24 shows this invention allowing the installation onto the hub 1100, of different kinds of sensor or auxiliary peripherals such as, but not limited to, a laser pointer 1112, ambient temperature 1114, light intensity 1116, oxygen in blood 1118, heartrate/pulse sensor 1120, etc, for increase the functionality of this invention such as in the healthcare and HSE (Health, Safety and Environment system) applications.

Figure 25:
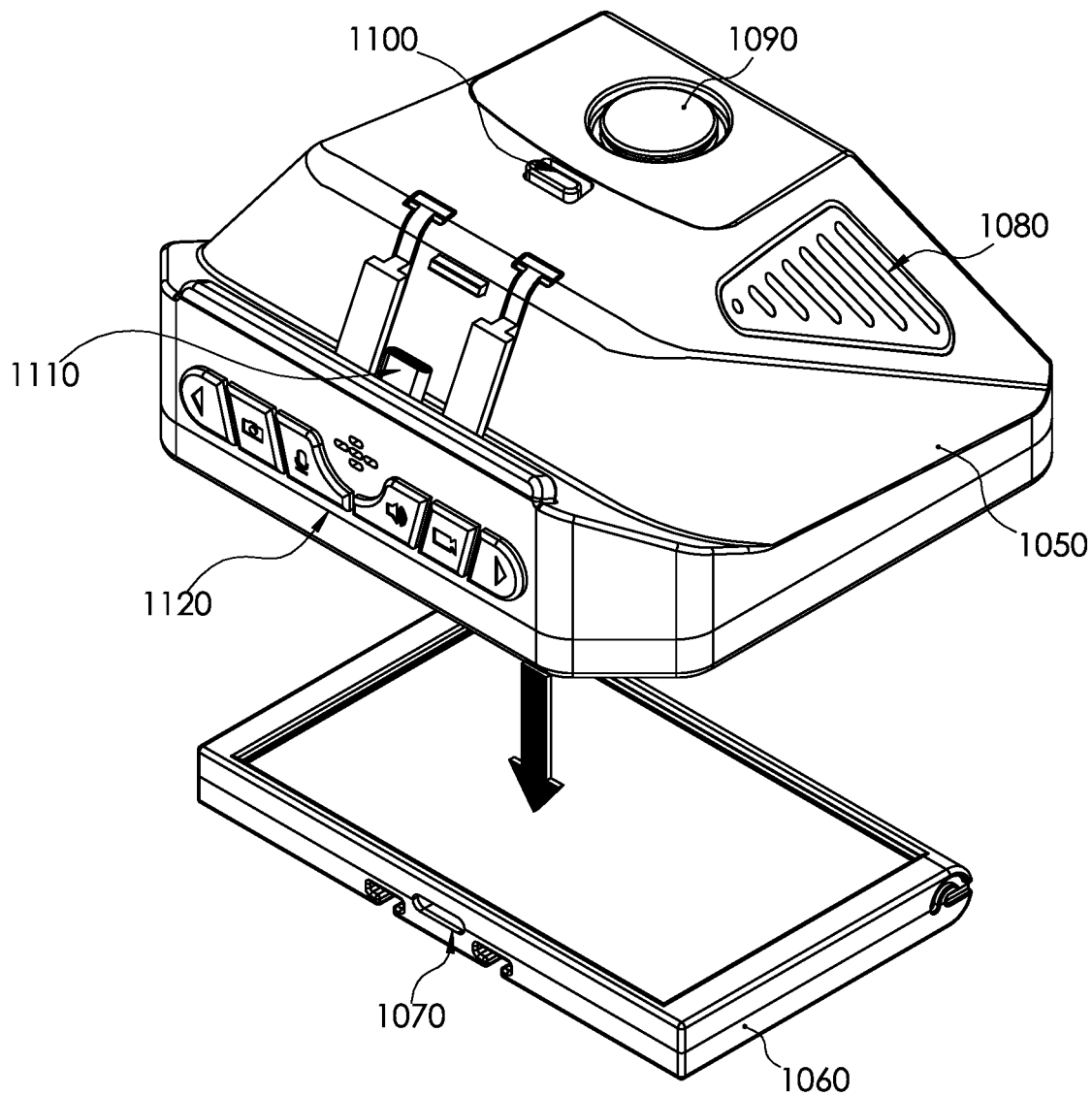
FIG. 25 is an illustration of the frontal view of the present invention with a monitor.

FIG. 25. This figure shows a version of this invention 1050 with a compact monitor of about 4" or 5" 1060 that has a power, data and video signals port 1070, such as a USB type C display port or other wired or wireless similar connections. This invention has a port in the upper side to connect other apparatuses such as characters or accessories. There is the locking button 1100 to hold the compact monitor to this invention 1050. This invention has a connecting port 1110 for transferring power, data and/or video to any accessory mounted onto it. The control buttons 1120 are located in the front area of this invention to control the outputs of the monitor or other accessories, such as the speakers 1080 located on the sides.

Figure 26:
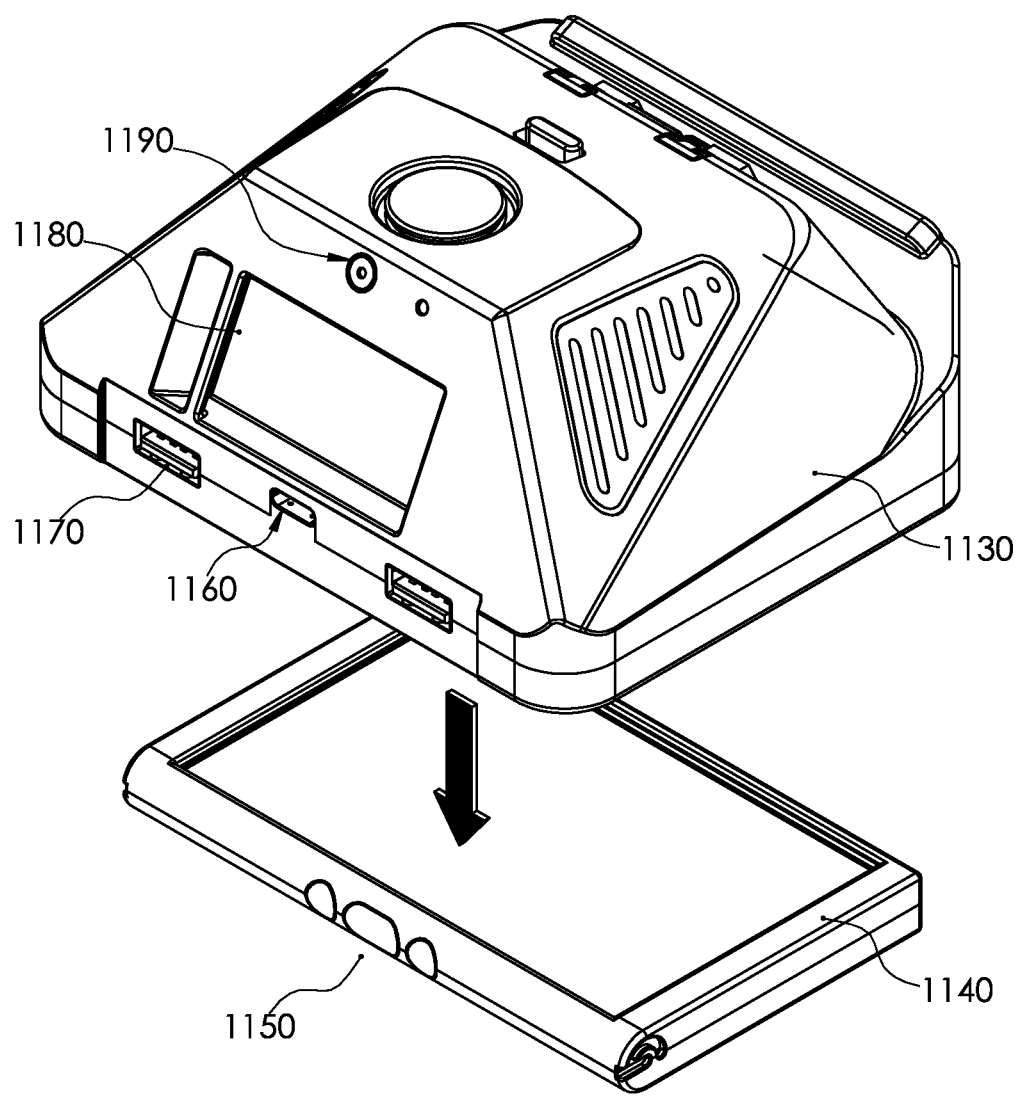
FIG. 26 is an illustration of the rear view of this invention with a monitor.

FIG. 26. This figure shows the rear view of this invention in which a compact monitor 1140 is dis-installed from the bottom side of invention 1130. This invention has one or more USB ports, not limited to a USB type C port to receive data, power and/or video signals from other apparatuses such as a computer or video game console, etc, a USB-2.0 or similar ports to receive or transfer data and power from/to other apparatuses, such as a flash memory, a smartphone, etc. This version of the invention includes a slot 1180, which can be used for the purposes of advertising brands, names or other applications. The compact monitor's control buttons 1150 are located in the top side of the compact monitor 1140.

Figure 27:
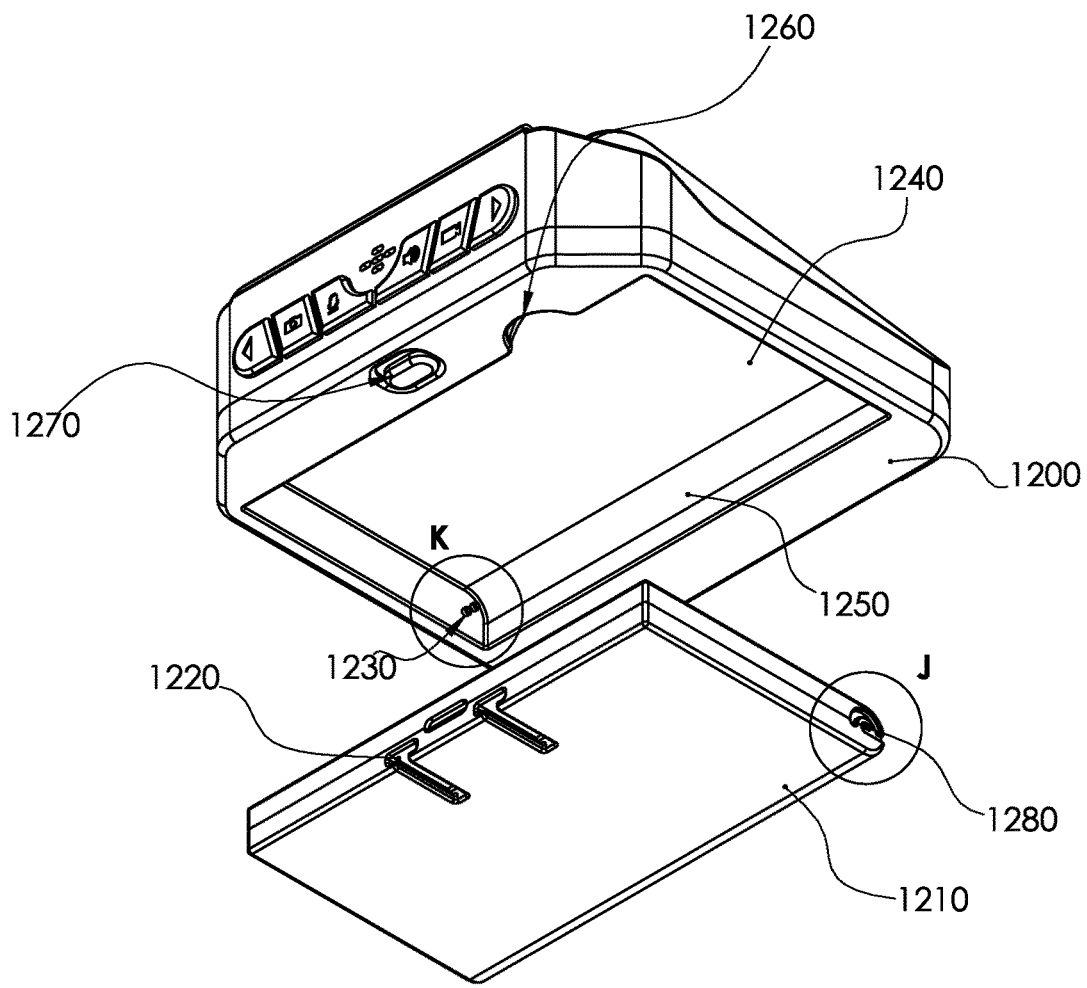
FIG. 27 is an illustration of the underneath view of this invention showing how to store a monitor.
Figure 27:
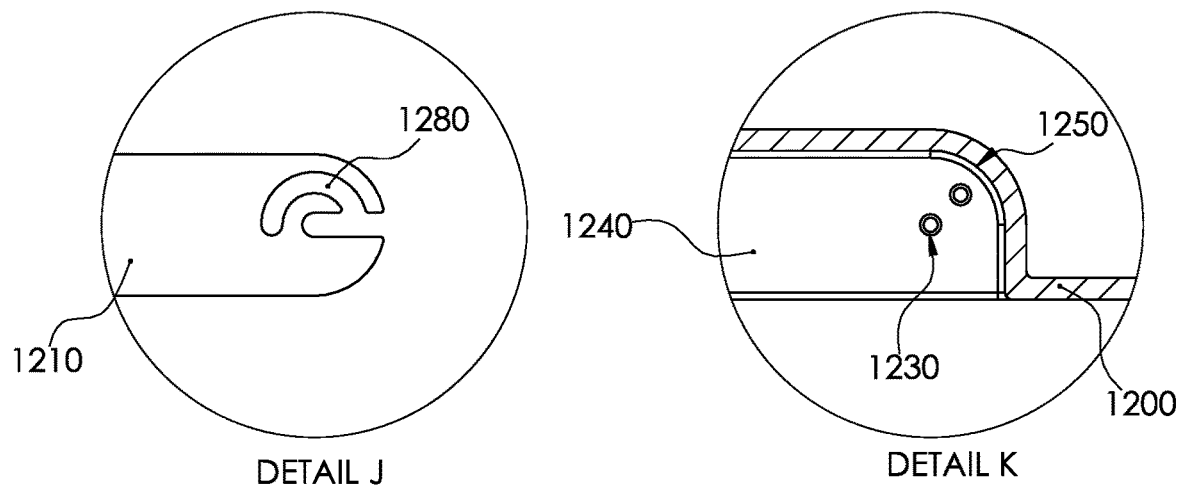

FIG. 27. This figure shows the bottom side of this invention 1200. A compact monitor 1210 of about 4" or 5" is stored an underneath compartment 1240 of this invention 1200. The invention's compartment has two protuberances 1230 that fits with the compact monitor's clefts 1280. The upper side of compact monitor is rounded and fits with the rounded section of the compartment 1250, permitting the compact monitor's clefts to enter in the compartment's protuberances 1230. The compact monitor includes two guides 1220 that serves to install it the connecting port 1110 of this invention. This invention 1200 includes in the underneath area a monitor locking button 1270 that hold and release the monitor from the main frame. After moving the monitor lock button 1270, the compact monitor 1210 can be released from this invention 1200 by pushing it out from the finger slot 1260.

Figure 28:
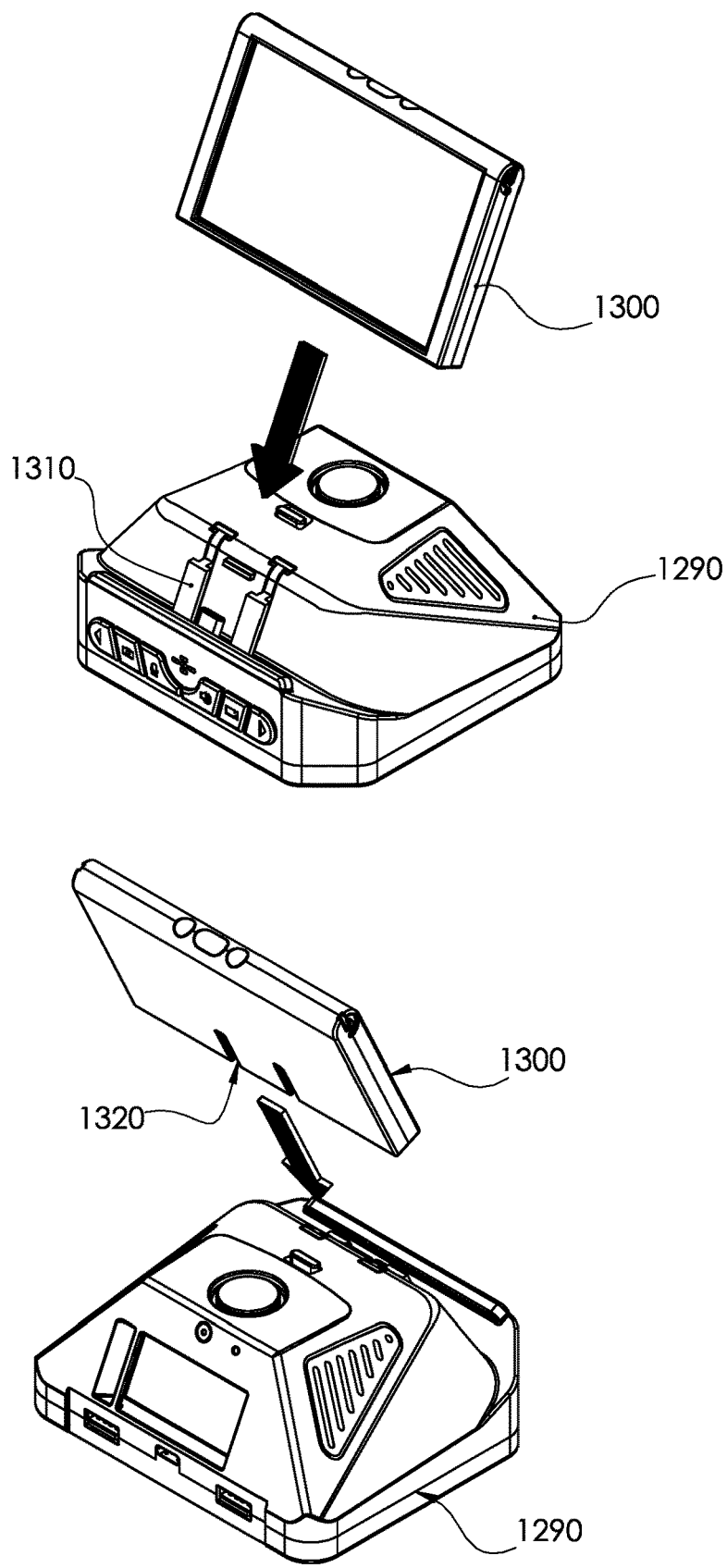
FIG. 28 is an illustration of this invention showing how to install a monitor.

FIG. 28 shows how to install a compact monitor 1300 in the guides of this invention 1290. The compact monitor 1300, and any other device, connects and disconnects vertically by connecting the slots in the monitor 1320 through the guides 1310 of the invention. Once the compact monitor or any other installed apparatus, its angle will be approximately 65 degrees to the horizontal rear.

Figure 29:
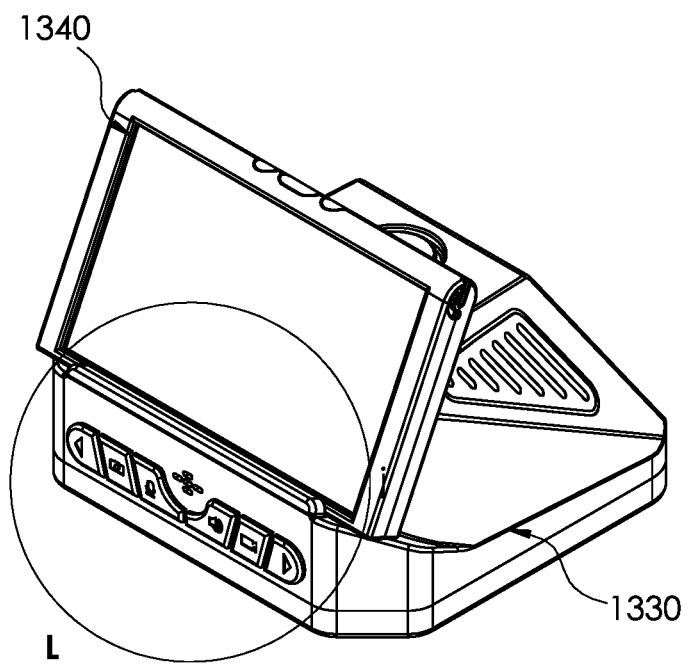
FIG. 29 is an illustration of the invention with a monitor mounted and the details of control buttons.
Figure 29:
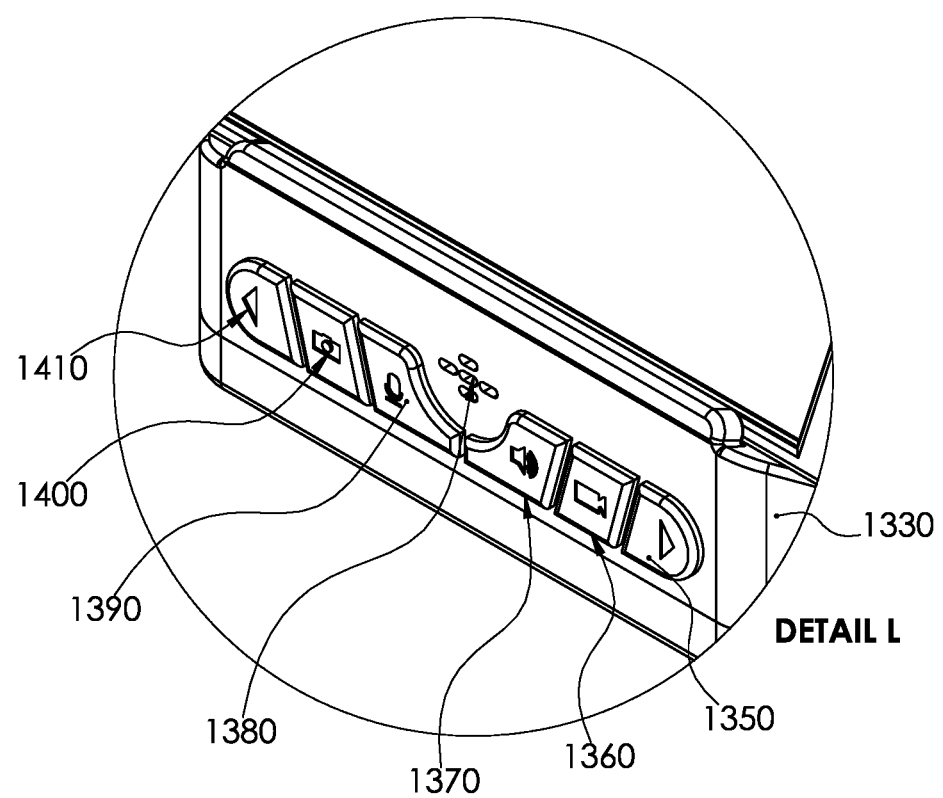

FIG. 29 shows this invention 1330 with a compact monitor installed 1340, and shows the control buttons which can be, without being limited to, lowering volume button 1410, camera activation 1400, microphone activation 1390, speakers activation 1370, video activation 1360 and increasing volume button 1350. Also, in front are the sound inputs to the microphone 1380.

Figure 30:
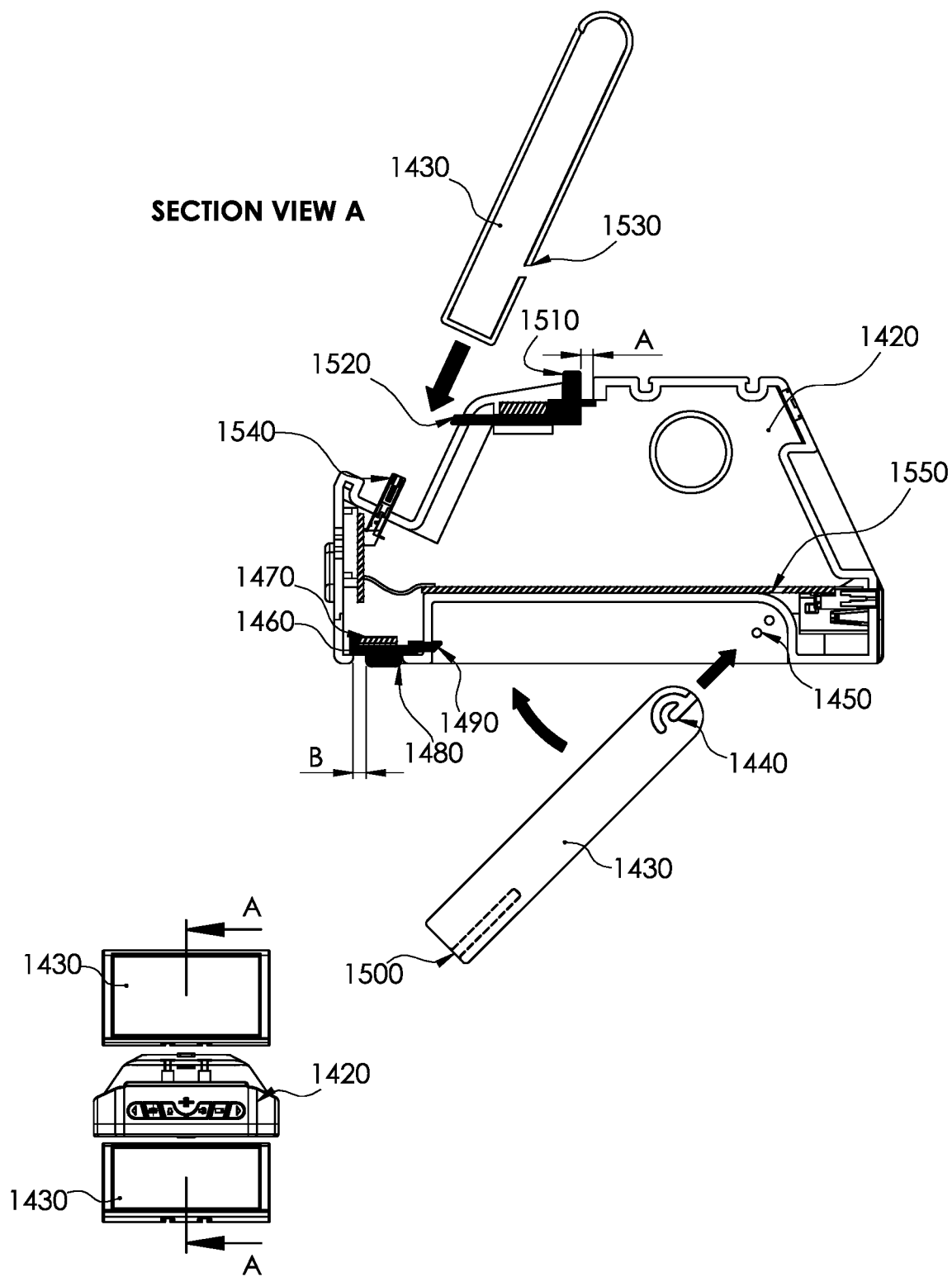
FIG. 30 is a section illustration of this invention showing how to install the monitor and how to store it underneath and lock it.

FIG. 30 shows this invention 1420 and the compact monitor 1430 in the installation and storage position, in cross section A. The compact monitor 1430 has the grooves 1440 that engage protuberances 1450 of the invention allowing the monitor to enter angularly below the invention, then rotate inward of the invention, and engage the invention the moment the monitor lock/unlock system 1460 installed in the invention moves a distance B, permitting the locking pin 1490 entering a monitor slot 1500 and holding the monitor dully stored in the inventions' compartment. The storage locking system 1480 has a spring 1470 that allows the locking system to maintain its natural position with the pin out 1490. To undock the compact monitor 1430 of this invention 1420, the lock button 1480 is then moved outward, a distance B which will cause the lock body 1460 to move the locking pin 1490 inward of this invention allowing the compact monitor 1430 to be undocked. This invention 1420 includes a PCB 1550 that obtains the energy, data and video signals from a computer, console or other device, and transfers them, but not limited to, the video camera, speakers, microphone, other USB ports and the frontal port to connect the monitors 1540. The monitors when connects to this invention in a vertical angled way at approximately 65 degrees from the rear horizontal, will cause the connection locking system to activate, by moving the locking pin 1520 inward of the invention a distance A, and subsequently entering the monitor lockout hole 1530. To release the compact monitor 1430, or any other type of device that includes a lockout hole 1530, the release button 1510 located on the top of this invention 1420 must be moved, which will return to its original position since it has an internal spring.

Figure 31:
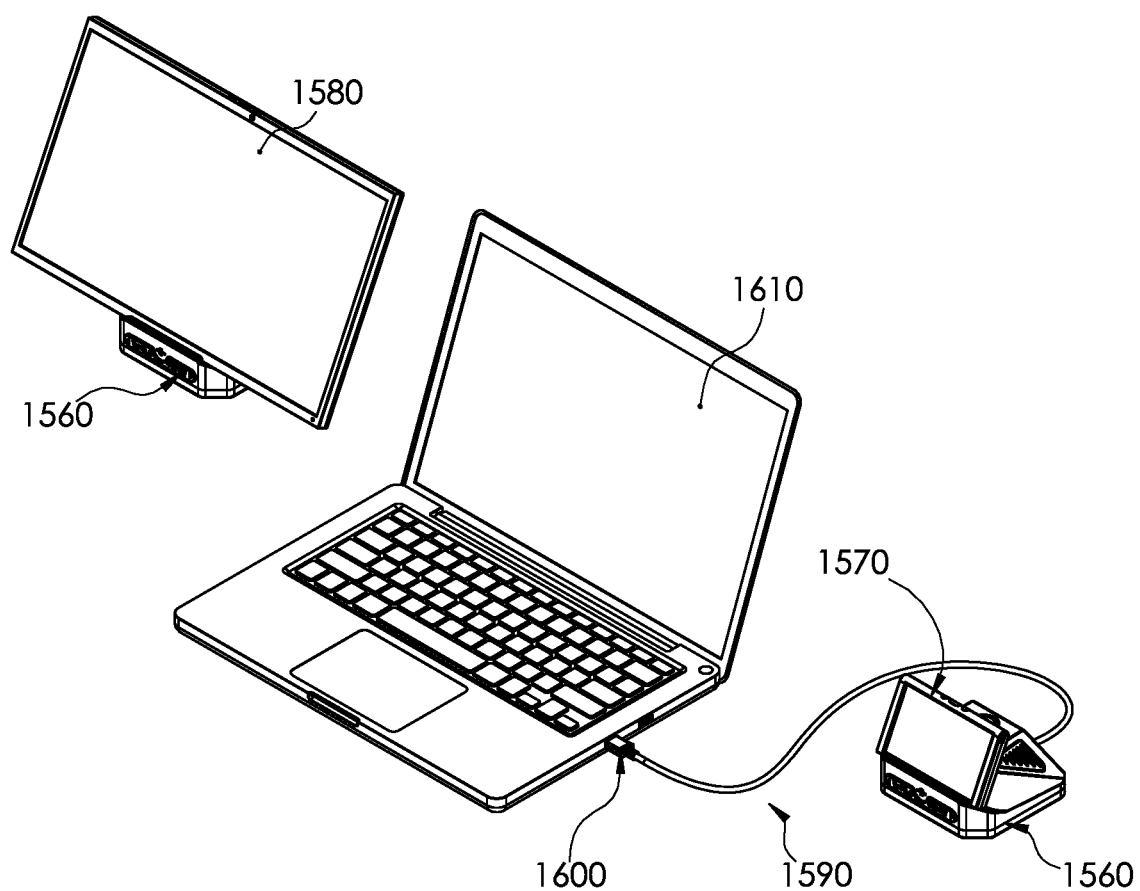
FIG. 31 is an illustration of the invention is connected to a computer and works with different sizes of monitors.

FIG. 31 shows how this invention 1560 is connected, without being limited to, a computer 1610, console or any other device that provides power, data and/or video signals. This invention 1560 may have a compact monitor 1570 connected which can be stored inside the chassis of this invention 1560 in its underneath area for easy transportation, or receive the installation of other larger monitors 1580, smartphones, tablets, etc. The connection can be wired 1590 and connected for instance to a USB port of a computer 1600, or via wireless depending on the desired configuration and use of this invention.

Figure 32:
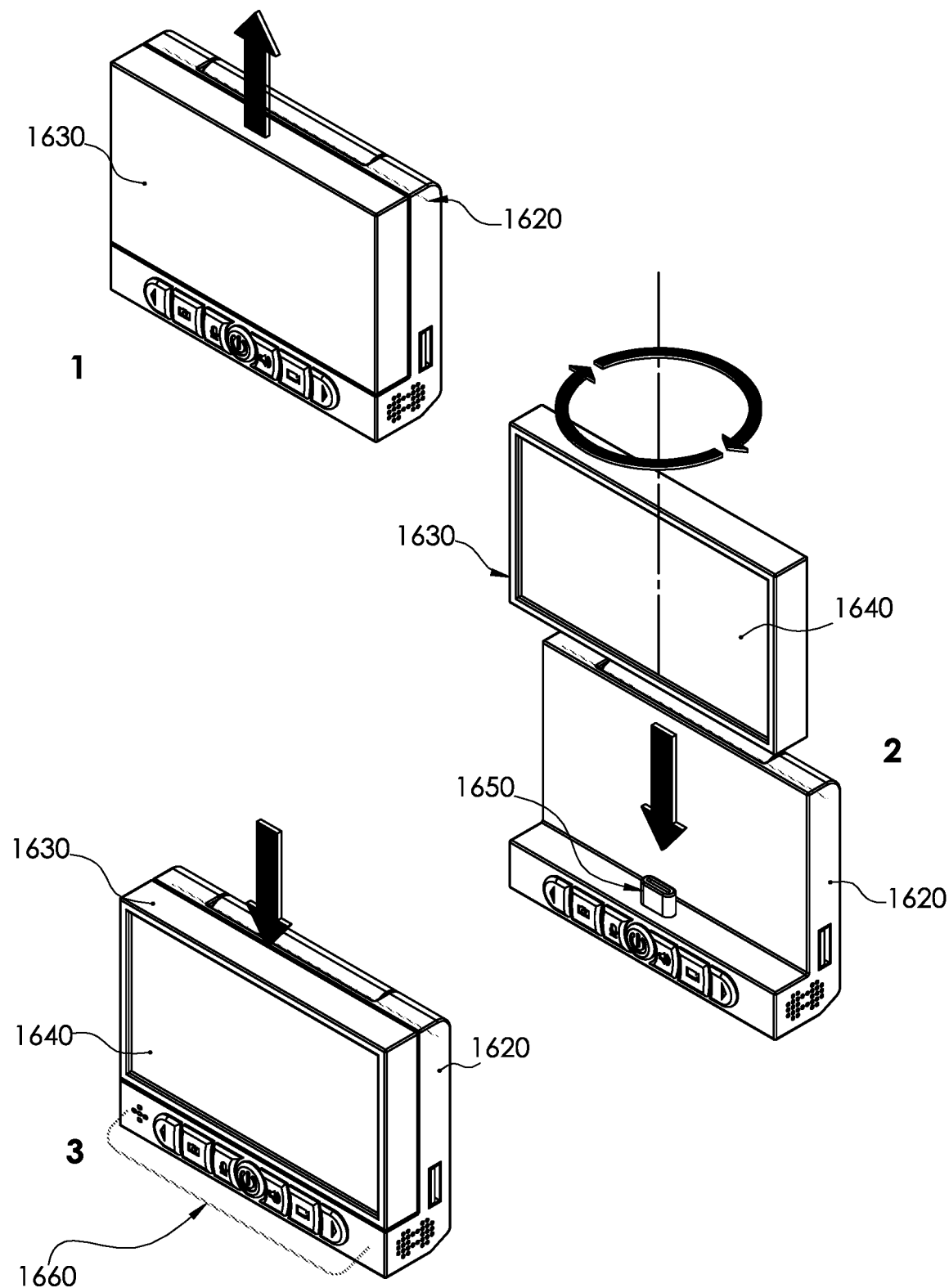
FIG. 32 is an isometric view of a version of the invention in a foldable configuration.

FIG. 32 This illustration shows a foldable version of this invention 1620 integrating a compact monitor 1630 of about 4" to 6", which is positioned with the screen stored inwards for its transport (1). The monitor is removed by pulling it in the upward direction, rotated 180 degrees (2), and placed back on this invention 1620 by connecting it to the USB type C port 1650 through which it receives the power, data and video signals. Finally, the monitor 1640 is positioned facing the front (3) for the visualization of images and videos. On the front of this invention 1620 are the monitor control buttons 1660 for activating the device functions.

Figure 33:
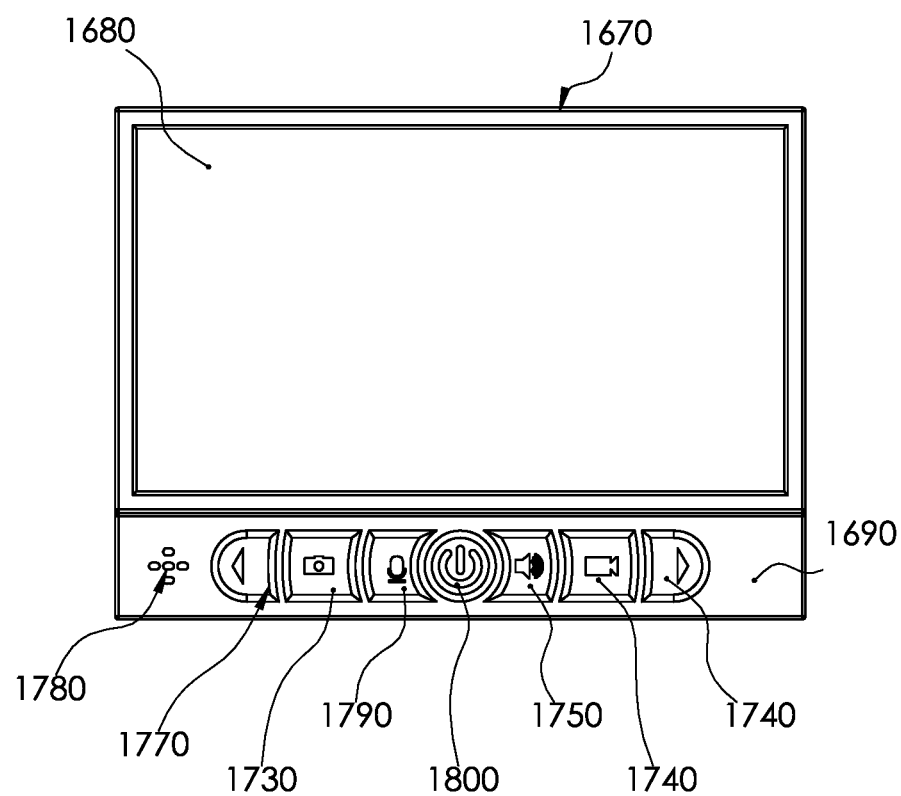
FIG. 33 is the front and right-side view of the foldable version of the invention.
Figure 33:
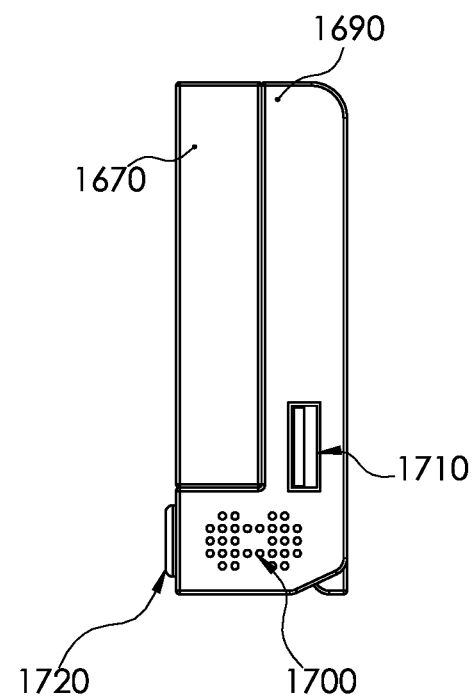

FIG. 33 This illustration shows the front and right-side views of the foldable version of this invention 1690 and indicates the positions of: the compact monitor 1670 with its panel screen 1680 which would be touch or not touch screen, this invention 1690 with the right output speaker 1700 and a USB type 2.0 connection port 1710, the control panel buttons 1720 for activating the camera, the photo activation button 1730, the video activation button 1740, the speaker activation button 1750, the increase volume button 1760, the decrease volume button 1770, the input holes for the microphone 1780, the microphone activation button 1790, and the power button 1800 of this invention.

Figure 34:
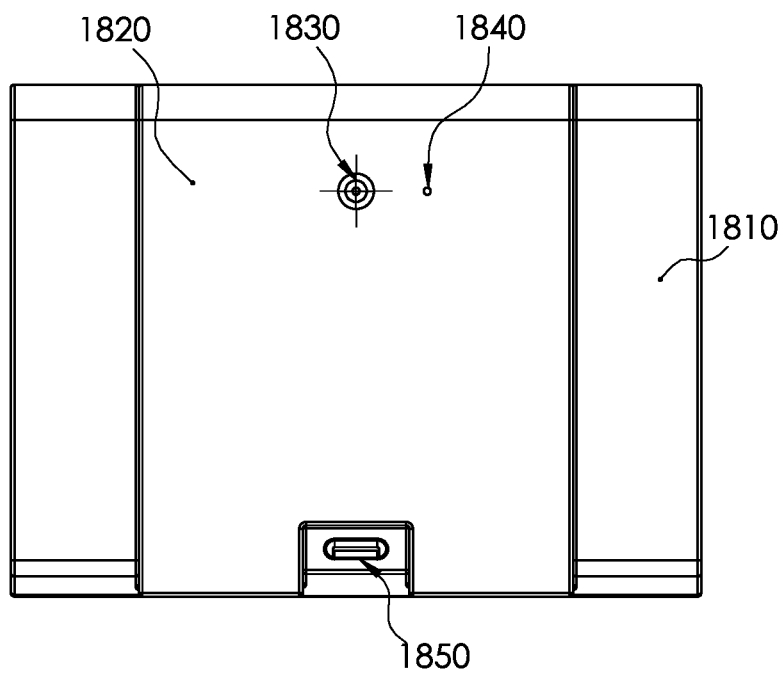
FIG. 34 is the rear and left-side view of the foldable version of this invention.
Figure 34:
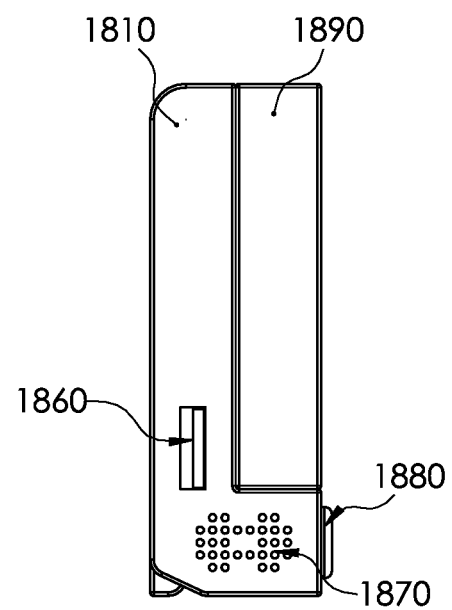
Figure 35:
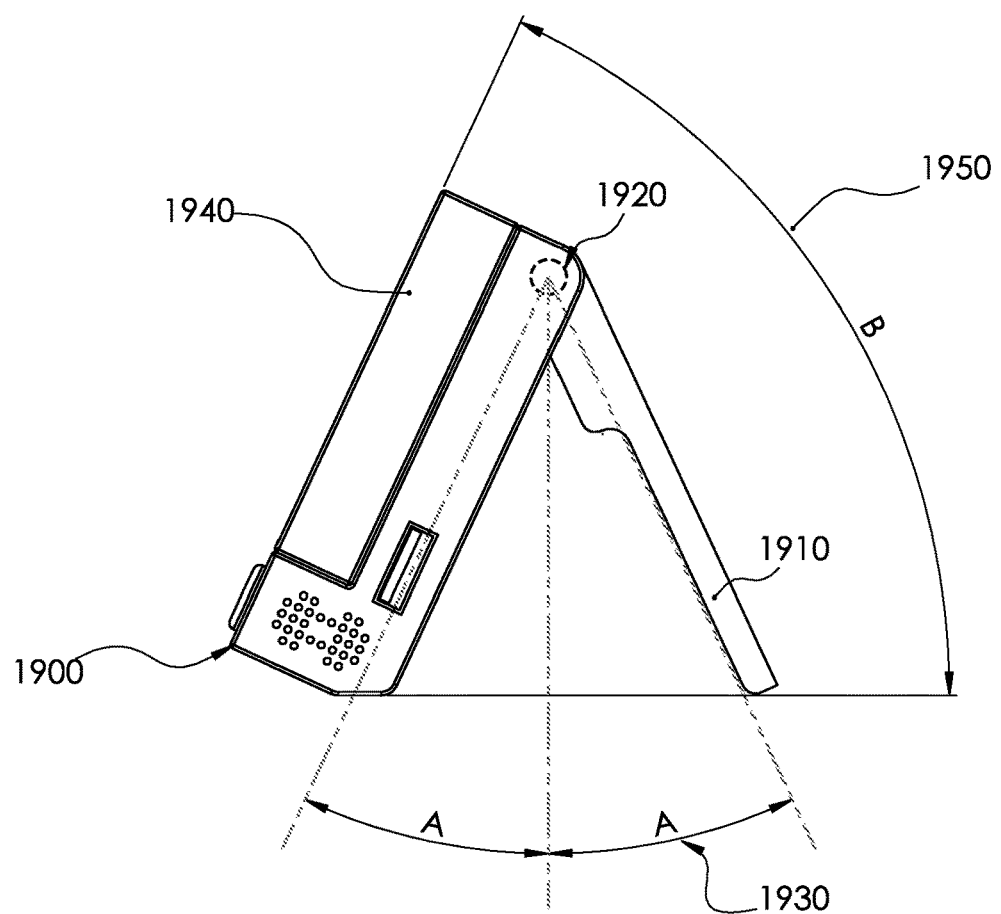
FIG. 35 is the foldable version of the invention in the unfolded position.
Figure 35:
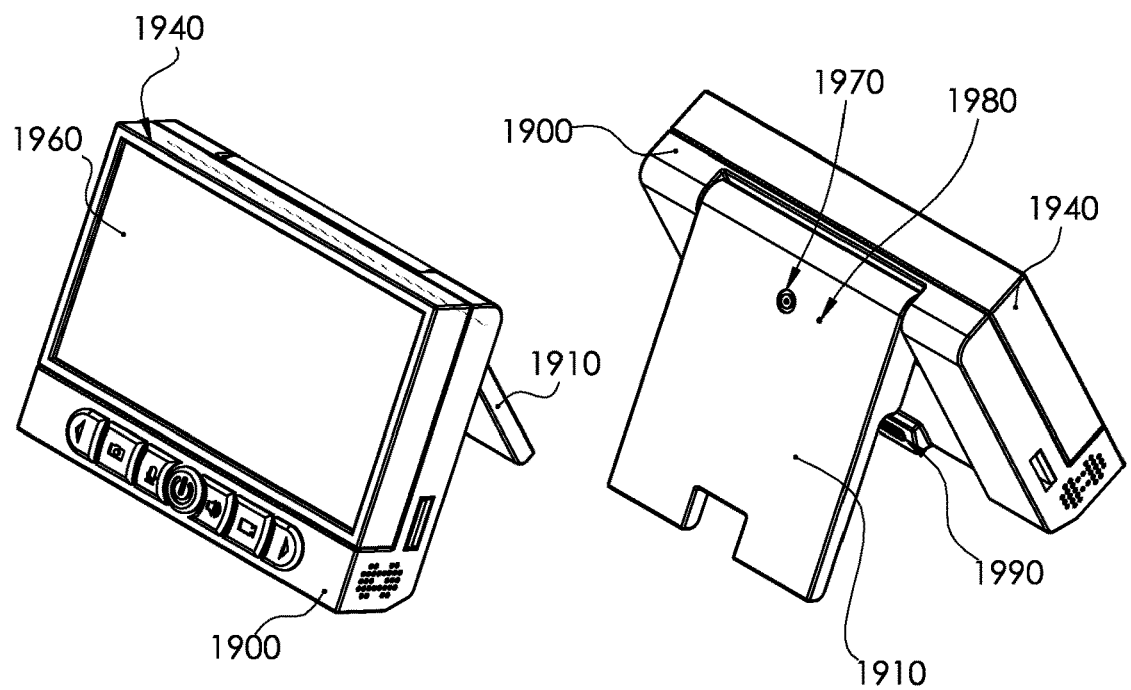

FIG. 34 This illustration shows the rear and left-side views of the foldable version of this invention 1810. In the side view there is an output of the left speaker 1870, the control buttons 1880, a USB 2.0 connection port 1860, and the compact monitor 1890. In the rearview of this invention 1810, the USB type C input port 1850 and the fold-out bracket 1820, the video-camera 1830 and its power LED indicator 1840 are shown FIG. 35 This figure shows the main frame of the foldable version of this invention 1900, with its support base 1910 in the unfolded position. Both the main frame of this version of this invention 1900 and the support base 1910 rotate through an axis 1920 forming an angle "A" of about 25 degrees 1930 from the vertical center with a total opening of about 50 degrees that gives stability to the device and places the monitor 1940 at a "B" inclination of about 65 degrees 1950 for easy viewing of the monitor 1960 from the frontal point of user's view. In the rear view, it shows that the USB type C input port 1990 is located on the main frame of this invention, but the video-camera 1970 and its power led 1980 is located on the support base 1910.

Figure 36:
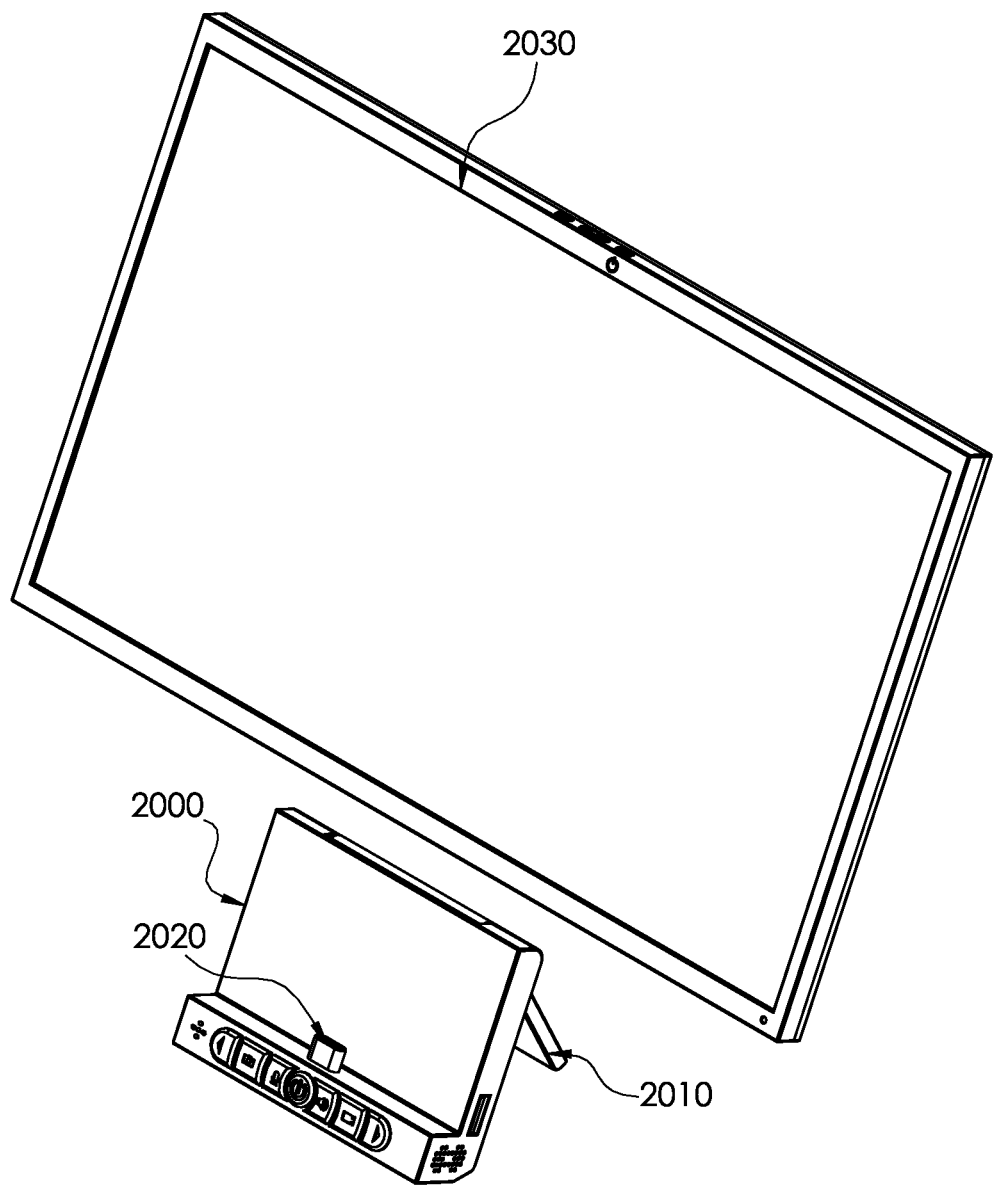
FIG. 36 is the foldable version of the invention supporting larger monitors.

FIG. 36 This figure shows the foldable version of this invention 2000 with the support base 2010 in an unfolded position, allowing the installation of, but not limited to, larger monitors 2040 such as 13" or 15" for work performance enhancement and to act as a secondary screen of a computer or other apparatuses, tablets-pc, smartphones, or any other apparatuses that can be connected to the USB type C output port 2020 of the foldable version of invention. This foldable version of the invention would be built with different type of connecting ports such as USB, thunderbolt, etc, and/or including wireless capabilities to transfer data and/or video signals, and obtain power from an A/C adapter, batteries built-in, from a computer, etc.

Figure 37:
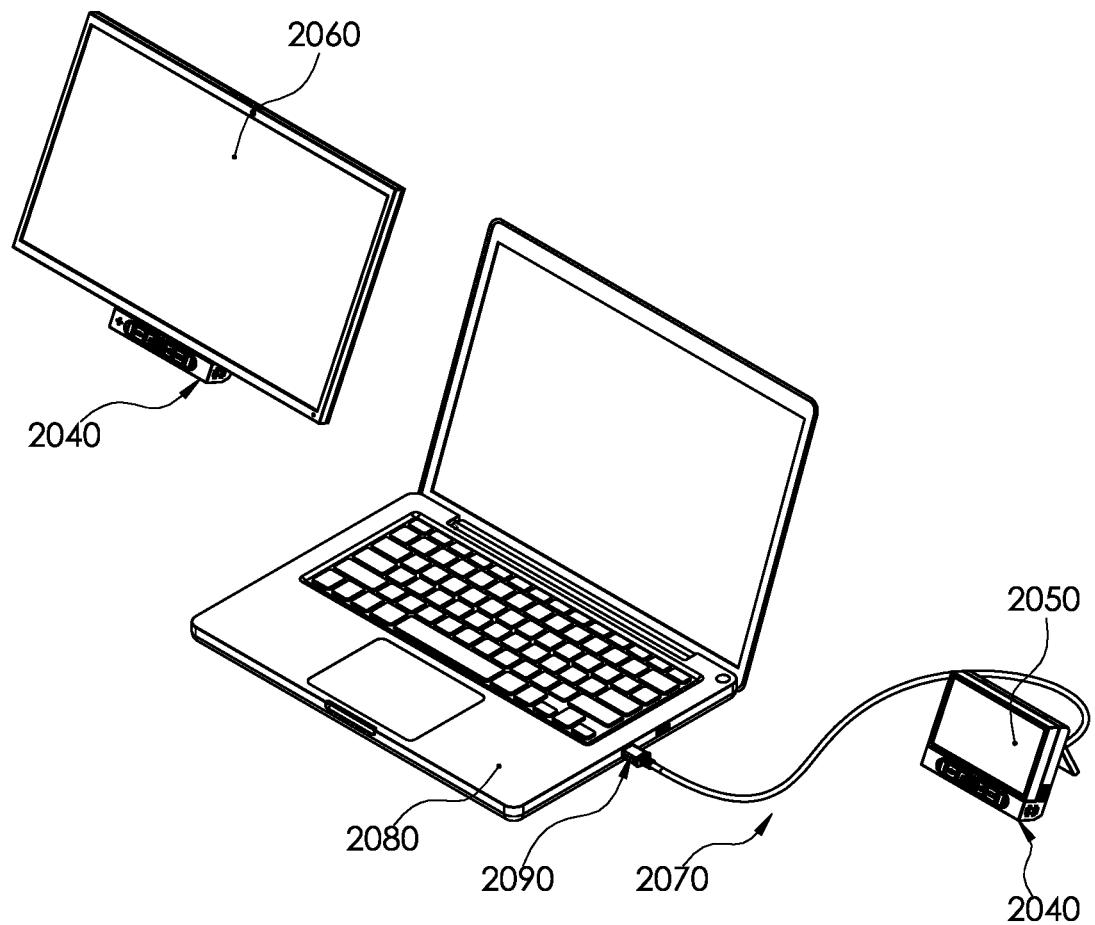
FIG. 37 shows the foldable version of the invention with different sizes of monitors connected to a computer.

FIG. 37 This figure shows a foldable version of this invention 2040 supporting a compact monitor 2050 of about 4" or 6", connected by a USB type C cable 2070 to the USB type C port 2090 of a computer 2080, in another foldable version of this invention supporting a larger monitor 2060 of about 13" connected via wireless to the computer.

The present invention is the new generation of the portable monitor and hub system that incorporates the flexibility to transport, install and interchange different types of apparatuses combining with IoT capabilities, such as a secondary screen, video-camera, microphone, speakers, sensors, characters, all-in-one portable hub system.

This new hub system can interact mechanically, visually and/or orally with the user or third parties and be used in different applications.

The internal and external structures are designed to house electronic boards and connectors of the latest technology that can manage, interface and/or detect the signals obtained from the monitor, apparatuses and/or characters installed in the hub, and receive and/or send signals to a computer and/or other apparatuses.

Some of uses of this invention are following:

As a Portable Monitor: by installing a secondary computer screen in the hub's USB-C Port, the screen will act as a secondary monitor of the computer and the user can duplicate or extend another screen for enhanced performance;

To make Videos: by using the video-camera located in the back side of the hub, user can select the camera of the computer to show what is at the computer's front, or the hub's camera to show any other place, easily, by just directing the hub to the desired place and touching the on/off video button; or also can activate both videos at the same time, for instance, during a videocall using an APP such us Skype, Teams, etc;

To take Photos: by using the hub's cameras when it is connected to the computer, in a wired or wireless connection, the user can easily take photos of documents or places by taking the hub with the hand, looking at the computer screen or monitor to see what the hub's camera is directed to and then pushing the photo button, and all photos will be downloaded directly to the computer or the hub. Take photos with the computer is not easy or maybe impossible in many cases, or it takes longer time to do it with a smartphone because it requires to send the file to the computer via e-mail consuming unnecessary time and data plans. For instance, to take a photo with a smartphone, users need to see the display of the smartphone, something which is hard or impossible for instance if they want to take a photo of the back side of their head, however, with this invention, user just need to see the computer's display and direct the video-camera to any place and push the photo button. All options with voice activation option available to simplify and enhanced operation;

Use Microphone, Speaker and Memory Built-in Features: use these hub's capabilities in case that the computer ones do not work properly, or the specific situation requires it or because it is easier to just pushing a button in the hub, instead trying to finding the right option in the configuration section of the computer's software, which sometimes is very difficult and consume time. Therefore, this invention acts as redundant system of the computer accessories;

Connect External Peripherals: to connect other apparatuses in the USB Ports such as external memory, Lantern, Pointer, Fingerprint, chargers, etc. The connection with the computer would be wired or wireless by using the wi-fi, Bluetooth or other similar feature connectivity of the hub, that permits the hub to work as an independent apparatus of the computer;

Power Charge, Video and Data Transfer with Smart Phones and Tablets: by simply installing them in the hub's USB-C port. The hub can transfer power to the USB ports in different ways: i) when the hub is wired connected to the computer by a type-c cable or similar, or ii) when the hub is connected to an external A/C adapter (110/220 volts), or iii) when the hub is using the power stored in the rechargeable batteries installed inside the hub thus acting as a power bank.

Knowing that users generally install covers to protect their smartphones and tablets, the present invention includes a telescopic base to install different size of apparatuses. The telescopic base can be sited to a minimum of up to 2 positions to increase the area for installing different type of apparatuses sizes, and also, a Fine-Tune selector to move the USB-C port over the telescopic base to do a fine adjust of the hub's USB-C port to the apparatus to be connected.

The present invention will be produced with different type of connectors depending of the common technologies such as, USB-C, MAC, etc. Also, there is a possibility to produce the present invention with magnetic and removable adaptors to connect different type of smartphones, such as Android or Apple, in a unique hub connector.

Gain Sound Amplifier: to increase the sound emitted by the apparatuses' speakers when they are close to the input holes of the resonance box in the hub;

Install Healthcare sensors: by installing Pulse, Oxygen, Temperature, Workstation Light sensors, among other in the hub.

Use the hub for Entertainment: to install interchangeable figurines or characters onto the hub frame, such as famous heroes, and download their original voices by using the RFID feature built-in in the hub. In this case, a brand license will be negotiated with brand owners;

Advertising: to install removable cards advertising company names, customized names, popular phrases, etc.

Some IoT capabilities of the HUB are described below. Many kinds of apparatuses can be installed in the portable hub, allowing the transfer of data with other IoT apparatuses, software, databases, etc. The data reaches a database where is analysed and presented using Data Science algorithms programmed in an AI machine.

The download and file storing feature of the hub can be applied to download voices or sounds from the cloud, for instance, of a famous character that is installed on the hub. The hub of this invention includes an NFC reader module to detect microchips installed in characters or other apparatuses by using the RFID (Radio Frequency Identification) technology.

A custom software will be developed to download, automatically or manually, movies trailers, marketing announcements, promotions, and other kind of information to be watched in the screen, or to be emitted by the character, for instance.

The customer satisfaction surveys can be obtained at the Point-of-Sale by using a data-entry accessory connected to the hub, and the data will be uploaded to the cloud and the software feature of this product can delivery analytics to the company or user.

The electronic design of the HUB is described as follows: IoT (Internet of things) is a technical name for any technology that captures data from any device or subject and transmit it, using an available network, to a database for analysis.

The hub of this invention can capture health data, environmental data, security alerts or any other information in a home or office environment subject to be measured using an array of sensors.

Then, the hub transmits the data using the computer as a modem connected to the internet via a wired (LAN) connector or a Wireless (Wifi, Bluetooth, 3G, 4G, 5G) transport protocol. The data reached a database where it is analysed using data Science algorithms programmed in an AI machine.

The hub can work wired or wireless with computers, and its versatility to share files in its built-in memory is an innovative design that will facilitate business meetings with the extended monitor.

Different kinds of decorative accessories can be installed onto the hub. The following are some of the options:
1. Fixed Toy or Character: In this case the toy or character cannot be separated from hub. That is, the Toy or Doll is fixed to the hub, although it could have the ability to rotate horizontally and vertically in different angles.
2. Interchangeable Toy or Character: In this version, the Toy or Character can be released from the hubs, and replaced by a different one, or by a different application.
3. Luminous or Rotative Toy: This version will have a power connector that will allow to transfer energy from the batteries for illumination or rotation actions.
4. Popular Phrases: This version will market popular phrases, maps of regions, etc. ("I love you!", "may I help you?", etc.)
5. Customized Name: user can customize the name of the hub just selecting the word pieces that will be installed in the front of the hub (John, Susan, etc.). Businesses and Corporations users can market their names, logos, slogans, special or seasonal events, etc.
6. 3D Printing Entry: of people or other figures provided by user (in glass or other light material; like a 3D figure of your family, your pet, etc.).

The following are some options of health care applications and sensors that can operate with the hub system:
1. Pulse and/or Oxygen: in this version, a sensor installed on the top of the hub can measure the oxygen and pulse per minute of a user. The data is sent to an APP to store and/or create statics and/or early warnings. The hub-Software will indicate the pulsations per minute in a pop-up screen, which can be programmed by the user.
2. Temperature sensor: this model measures the temperature body, by mean of a touching sensor or laser.
3. Workstation Light Level sensor: it senses and measures the quantity of light user has where the hub is located. When the user has higher or lower quantity of light that could affect the vision of user. The hub Software will pop-up an alert in the computer's user if levels are out of recommended measures. This application could help some people to save their eyes stress, headache and/or other collateral pains. The hub Software include thresholds and alerts that will give user early warnings and/or information, depending of the application.

Office and Home Applications:
The following are some options of other peripherals that can be installed on the hub:
1. Microphone Entry: The hub-Microphone can incorporates a high-tech microphone in the front in such a way that allows the participants of a conference to be closer to the microphone, improving the clearness of the audio signal heard by the other people on the other side of the computer or cellular phone connection. This facilitates that the computer or cell phone or Tablet does not have to be moved, but only move the hub close to the person who is speaking. It is very normal in business meetings to have many attendees in big large tables, then it will be easier to say . . . "Talk to the Hub" for the other people connected to listen the speaker person clearly and louder. The connection could be wired or wireless via Bluetooth.
2. Memory stick reader Entry: to increase the data entry to the computer.
3. Lantern or Pointer Light Entry: It has a high intensity light, low power consumption, in case user need it in an emergency or if user want to improve the sharpness of something wanted to see or read. A Pointer entry incorporates a laser on the front (colors to be selected), to be used when making a presentation. It could also incorporate two keys to pass page forward or backward
4. Fingerprint Reader Entry: The hub would incorporate a fingerprint reader to validate the identity of people. This application can be especially useful in banks and other entities that wish to integrate 2 devices in a single Multi-Entry apparatus. FIG. 34.
5. Third-party Data-Entry: to obtain data from the user or third parties, like the satisfaction experience survey at a point-of-sale or other applications. This could be useful for companies to save, register, analyze and make decisions based on this Data-Entry data. Data would be transmitted to the cloud by mean of a specific data management system to be embedded in the hub or computer.

Second Screen Applications:
The hub system incorporates a lightweight display (recommended, but not limited to 10.1") that serves as a monitor of the computer, cellular, tablet or other apparatuses that can be wired or wireless connected with the hub.

It could be used for conferences, in which all people do not have access to see the computer screen either because they are not on the same side of the computer, or because the computer's owner does not want them to see the screen of the computer for privacy reasons.

Various hub systems of this invention could be connected, wired or wireless to show the same image of who is on the other side of a video call (for example video conferences, etc.).

The hub can also be used as a TV screen when the user connects the hub to a computer, to a tv, to a TV transmitter, phone, tablet or similar apparatuses.

The multiple pieces of the outer shell of the hub is made of acrylonitrile butadiene styrene (ABS) plastic that has been injection moulded. Sections of the outer shell may also have an additional material such as thermoplastic polyurethane (TPU) or silicone. The power, data and video transfer options would be done by using USB type C, USB2.0, HDMI among other available wired and wireless technologies. All buttons, switches, electrical micro-switches (made of plastic and metal) are also commodity components that have been manufactured and/or sourced from other suppliers. Integrated circuits, chipsets and printed circuit boards (PCB) are also standard items, although different proposed functions of the hub may have proprietary chipsets designed, printed and programmed to fit the requirements of each peripheral function that is to be added to the hub.

The printed circuit board (PCB) on which the electrical and mechanical components are mounted is custom-made for the functional design of the hub peripherals. It is a flat, resin-coated sheet. Electrical resistors, capacitors, oscillators, integrated circuits (ICs), and other components are made of various types of metal, plastic, and silicon, also sourced from manufacturers that produce in mass.

The general shape falls within the range of a top-end industrial design product that is available in the current market but may be produced slightly larger to accommodate for the added internal components that are built into the hub. The overall layout is similar as well, its orientation is symmetrical along a line that runs from the front to the back of the body of the hub along the top face. The hub has been detailed designed to obtain the smallest and carry-on size to allow for the addition of the proposed peripherals. On this hub, there are holes moulded in the shell to allow for sounds to leave the device via internally mounted drivers. On the front there are activation buttons to accommodate the functions of the added devices that become mounted into the hub.

Figure 38:
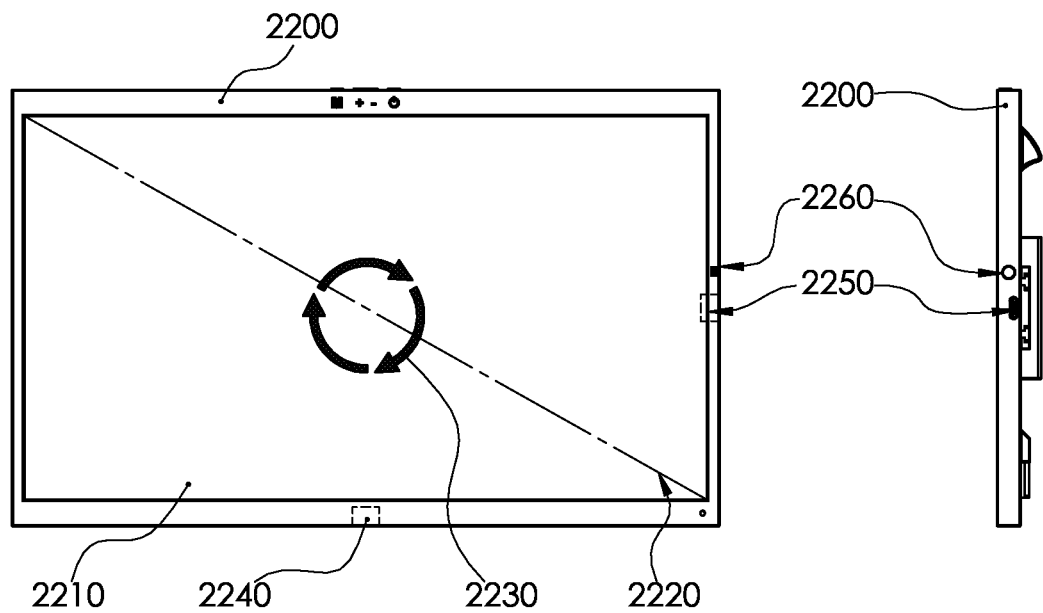
FIG. 38 shows the front and right-side of a version of a monitor with rotating feature included in this invention.

Referring now to an embodiment of the present invention which includes a monitor with a rotating feature that connects with the hub. In FIG. 38 This illustration shows a monitor with rotating feature 2200, optionally including a touch panel feature 2210 which has a size among 4 inches through 17 inches of active area 2220, and includes an autorotating function 2230 that allows installing it, or attach it, to the hub of this invention, in landscape (horizontal) and portrait (vertical) array. The monitor has 2 connecting ports, not limited to a USB type-C ports or similar that allows to transmit power, video and/or voice data. The landscape connecting port 2240 is located in the bottom face (longest lateral side) of the monitor 2200 for the installation in landscape (horizontal) mode. The portrait connecting port 2250 is located at the right face (or left side) of the monitor 2200 for the installation in portrait (vertical) mode. The magnet 2260 is detected by the Hall Effect Sensor (later explained in FIG. 45), when the monitor is installed in portrait array, and activate the autorotation image feature of the monitor 2200.

Figure 39:
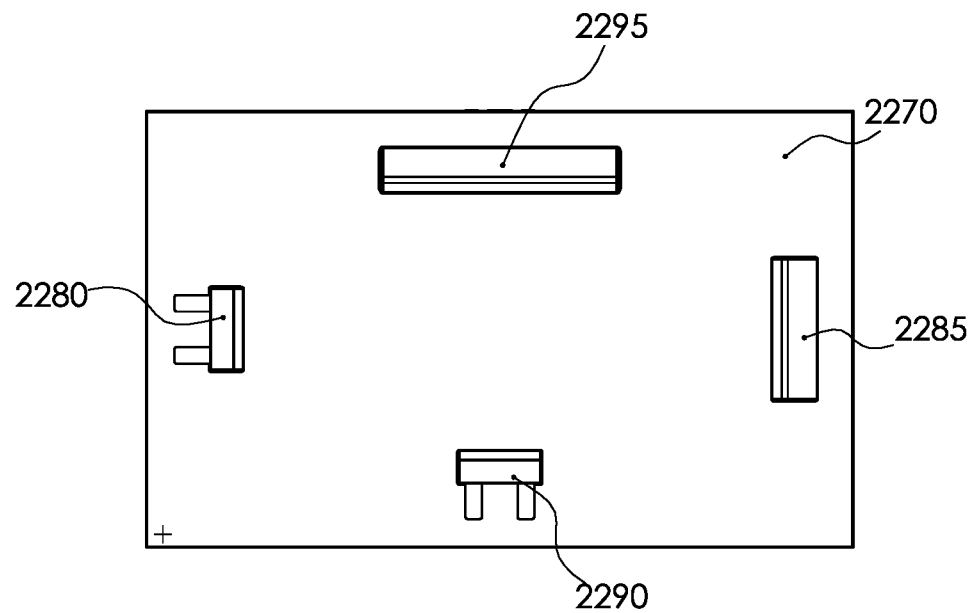
FIG. 39 shows the rear and bottom views of a version of a monitor with rotating feature included in this invention.
Figure 39:
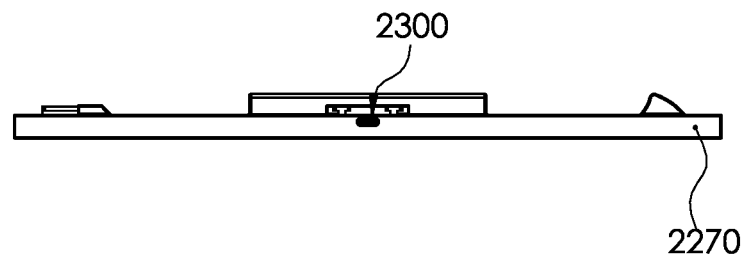

FIG. 39 This illustration shows the rear and bottom views of the monitor with rotating feature 2270. The monitor 2270 includes a vertical handle for manipulation 2285 and the vertical assembly guides 2280 that allows to attach it the monitor in portrait (vertical) mode to the hub of this invention. The horizontal assembly guides 2290 and the horizontal handle 2295 are used to install the monitor in landscape (horizontal) mode to the hub of this invention. There is shown the landscape connecting port 2300 located in the bottom face (longest lateral side) of the monitor 2270 for the installation in landscape (horizontal) mode onto the hub of this invention.

Figure 40:
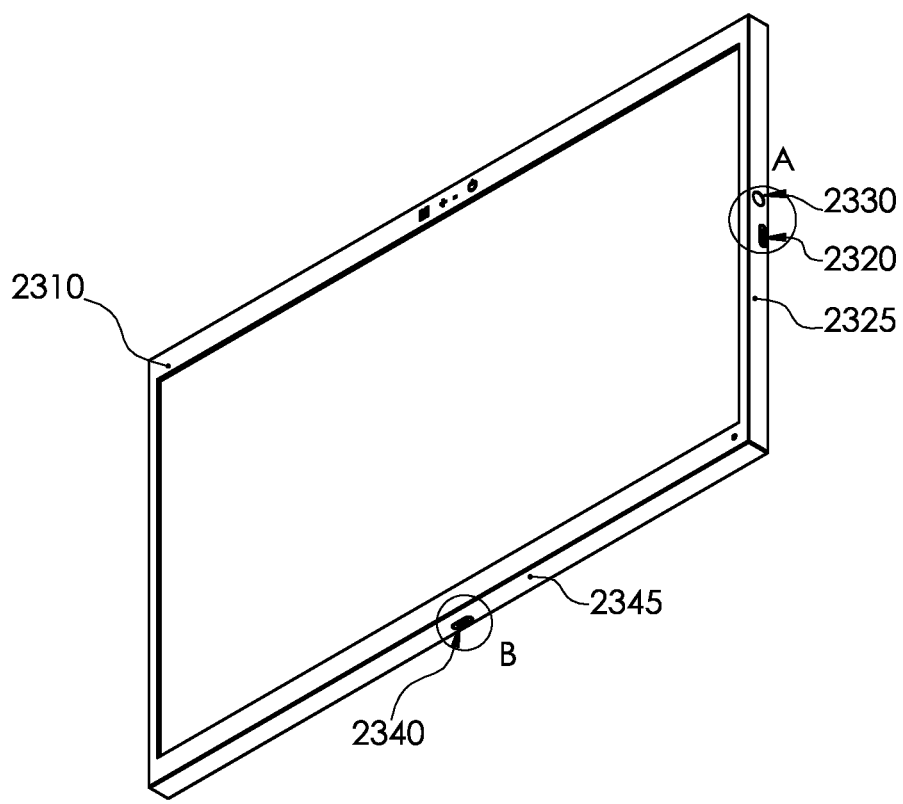
FIG. 40 is the isometric bottom view of the monitor with rotating feature showing the two connecting ports.
Figure 40:
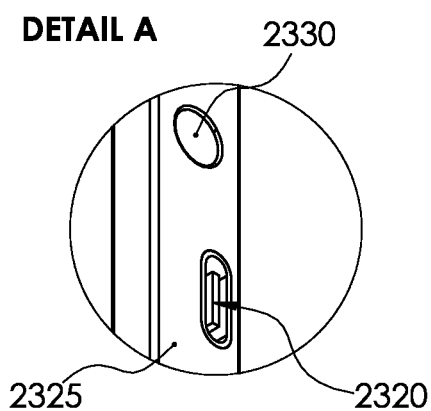
Figure 40:
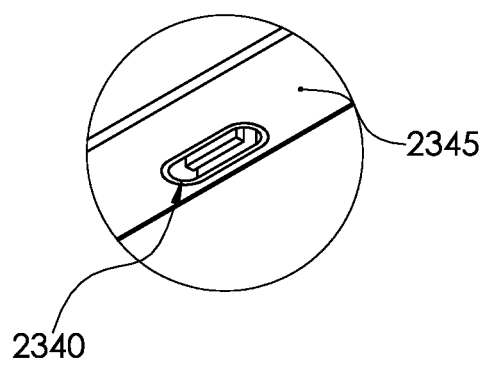
Figure 41:
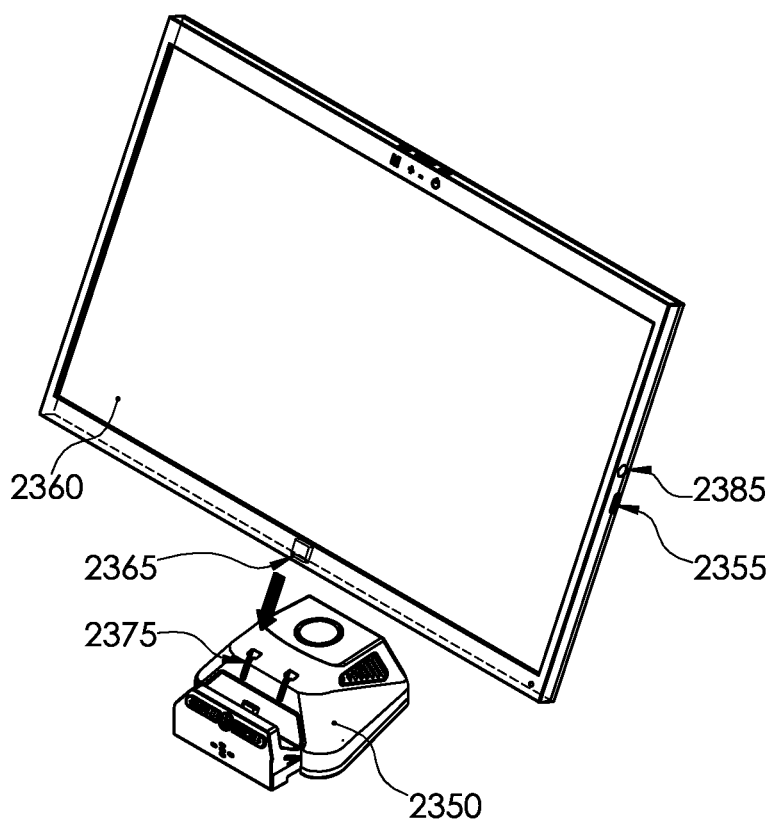
FIG. 41 is an illustration of the front and the rear isometric views of the landscape installation array of the monitor with rotating feature onto the hub of this invention.
Figure 41:
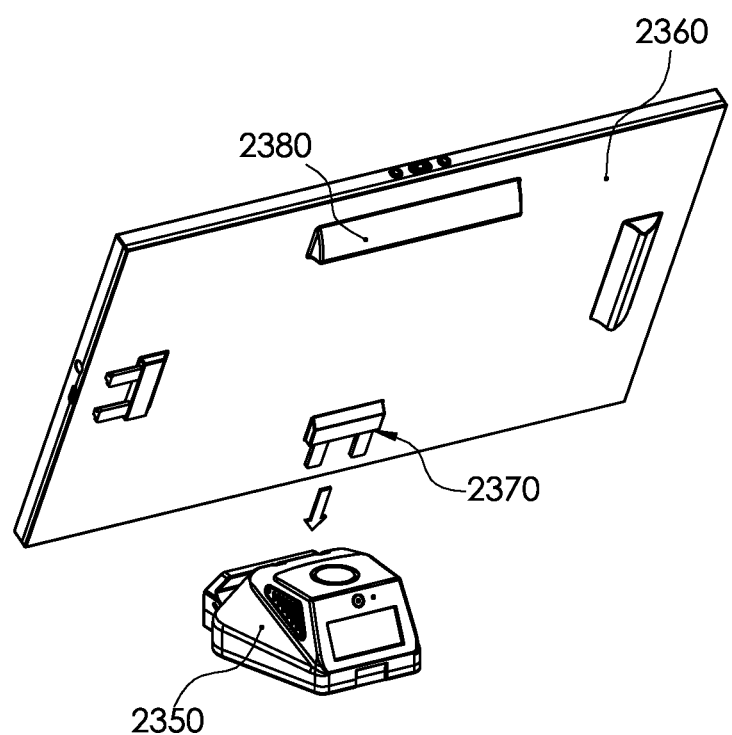

FIG. 40 this illustration is an isometric bottom view of the monitor with rotating feature 2310 showing in the Detail A the portrait connecting port 2320 installed in the right face 2325 of the monitor 2310 and the magnet 2330. In Detail B the landscape connecting port 2340 is shown in the bottom face 2345 of the monitor 2310 for the installation in the landscape mode. FIG. 41 this illustration shown the frontal and rear isometric views in landscape mode of the monitor with rotating feature 2360 fitting the horizontal assembly guides 2370 into the grooves 2375 in the hub 2350 of this invention, using the landscape connecting port 2365. The bottom figure shows, the handle 2380 to hold the monitor in landscape mode. Also, in this view can be seen the portrait connecting port 2355 and the magnet 2385 for the portrait mode of use of this invention.

Figure 42:
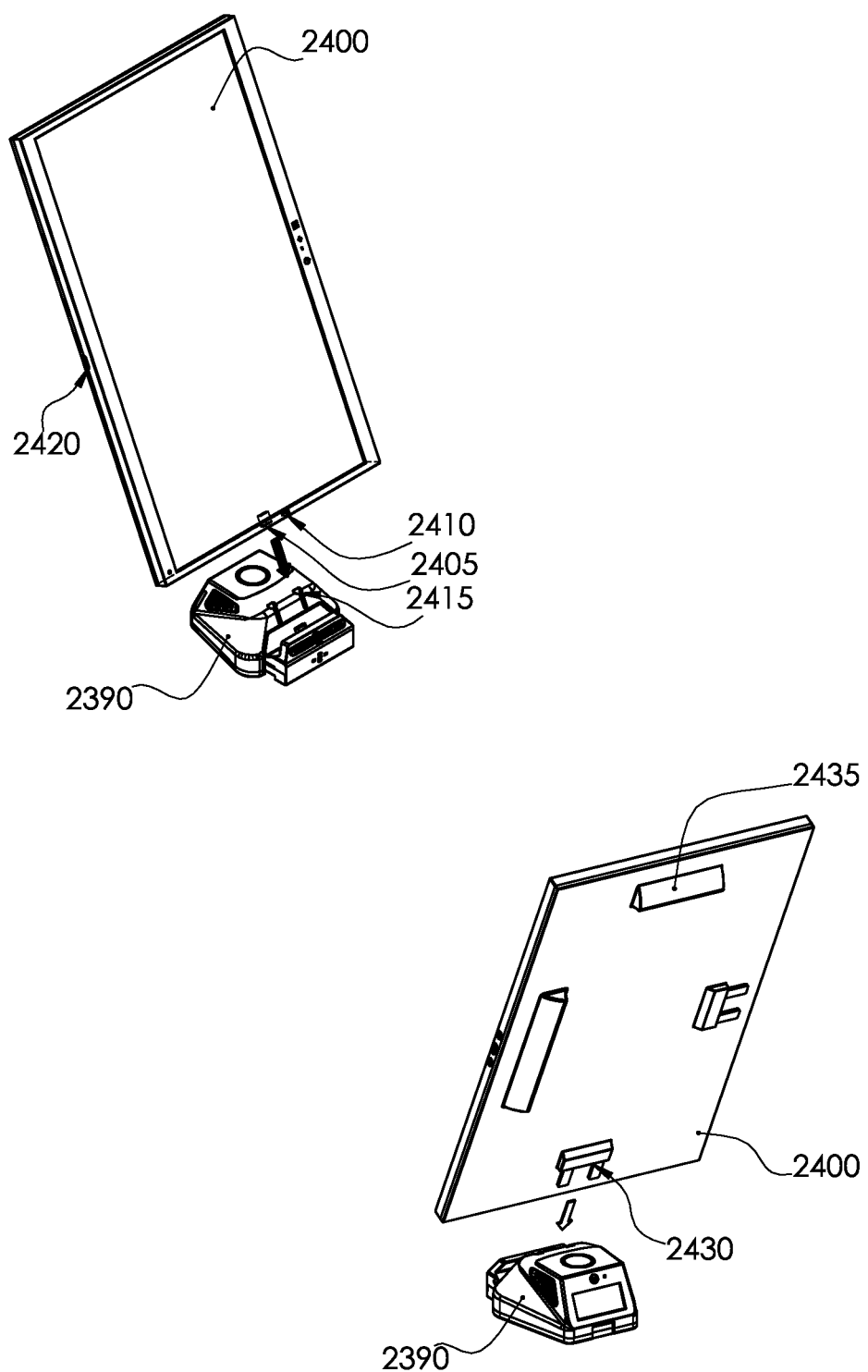
FIG. 42 is an illustration of the front and the rear isometric views of the portrait installation array of the monitor with rotating feature on the hub of the present invention.

FIG. 42 this illustration shown the frontal and rear isometric views in portrait mode of the monitor with rotating feature 2400 fitting the vertical assembly guides 2430 into the grooves 2415 in the hub 2390 of this invention, using the portrait connecting port 2405. The monitor 2400 adjusts the image orientation, automatically from landscape to portrait, when the magnet 2410 is detected by the Hall Effect Sensor (later explained in FIG. 45) installed into the hub of this invention. The bottom figure also shows the vertical handle 2435 to hold the monitor when it is in portrait mode, and the upper figure show the landscape connecting port 2420.

Figure 43:
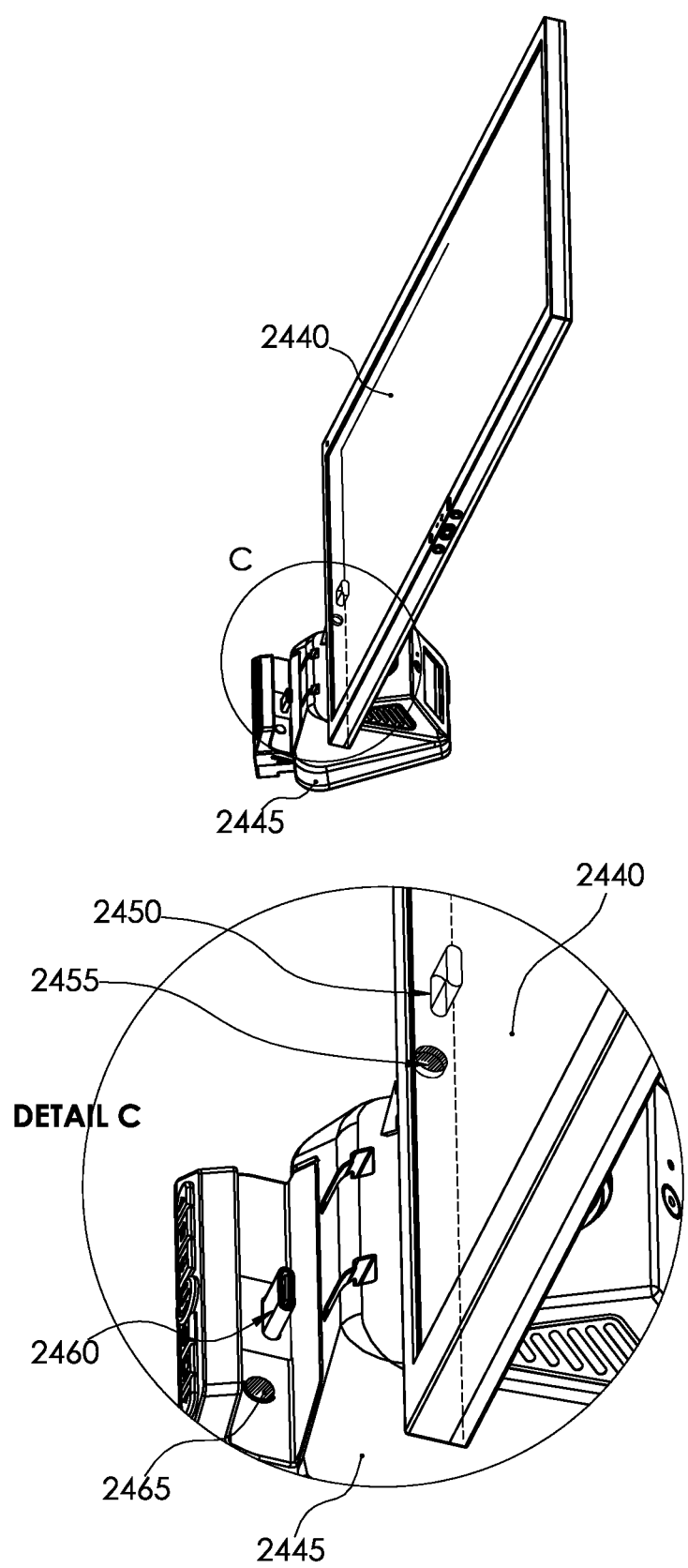
FIG. 43 this illustration shows the magnetic sensor system to detect the portrait mode operation.

FIG. 43 this figure is an isometric view of the installation in portrait mode of the monitor with rotating feature 2440 onto the hub 2445 of this invention. The Detail C shows the connection between the hub's connecting port 2460 with the monitor's connecting port 2450 for the transmission of power, data and/or video. When the hub's hall effect sensor 2465, detects the magnet 2455 located close to the vertical connecting port 2450 of the monitor 2440, then, the hub's PCB activate the autorotation feature of the monitor 2440.

Figure 44:
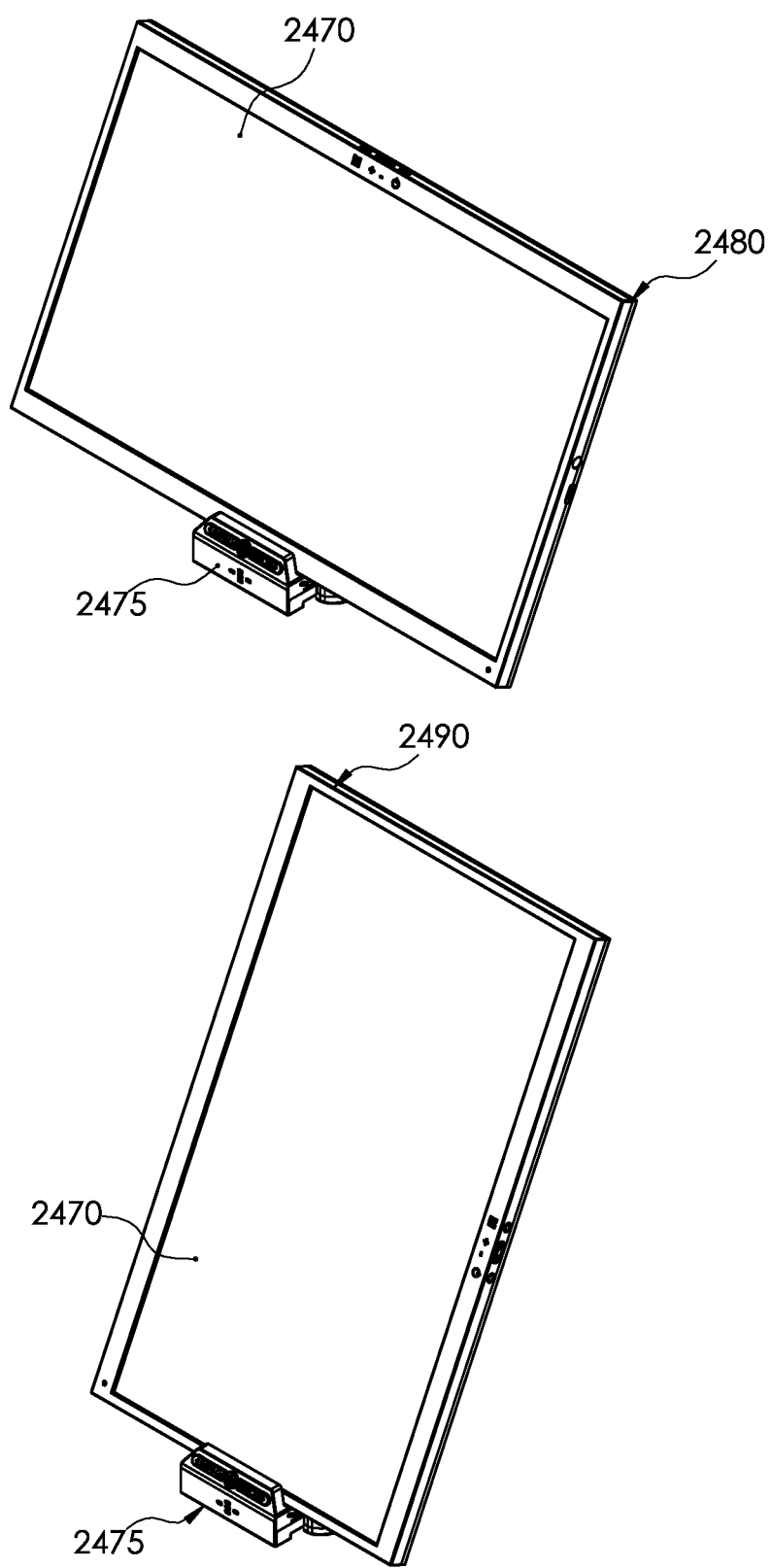
FIG. 44 this illustration shown the monitor with rotating feature installed onto the Hub in landscape and portrait modes.

FIG. 44 this figure shows the isometric views of the monitor with rotating feature 2470 installed in the hub 2475 in the landscape mode 2480 and in the portrait mode 2490.

Figure 45:
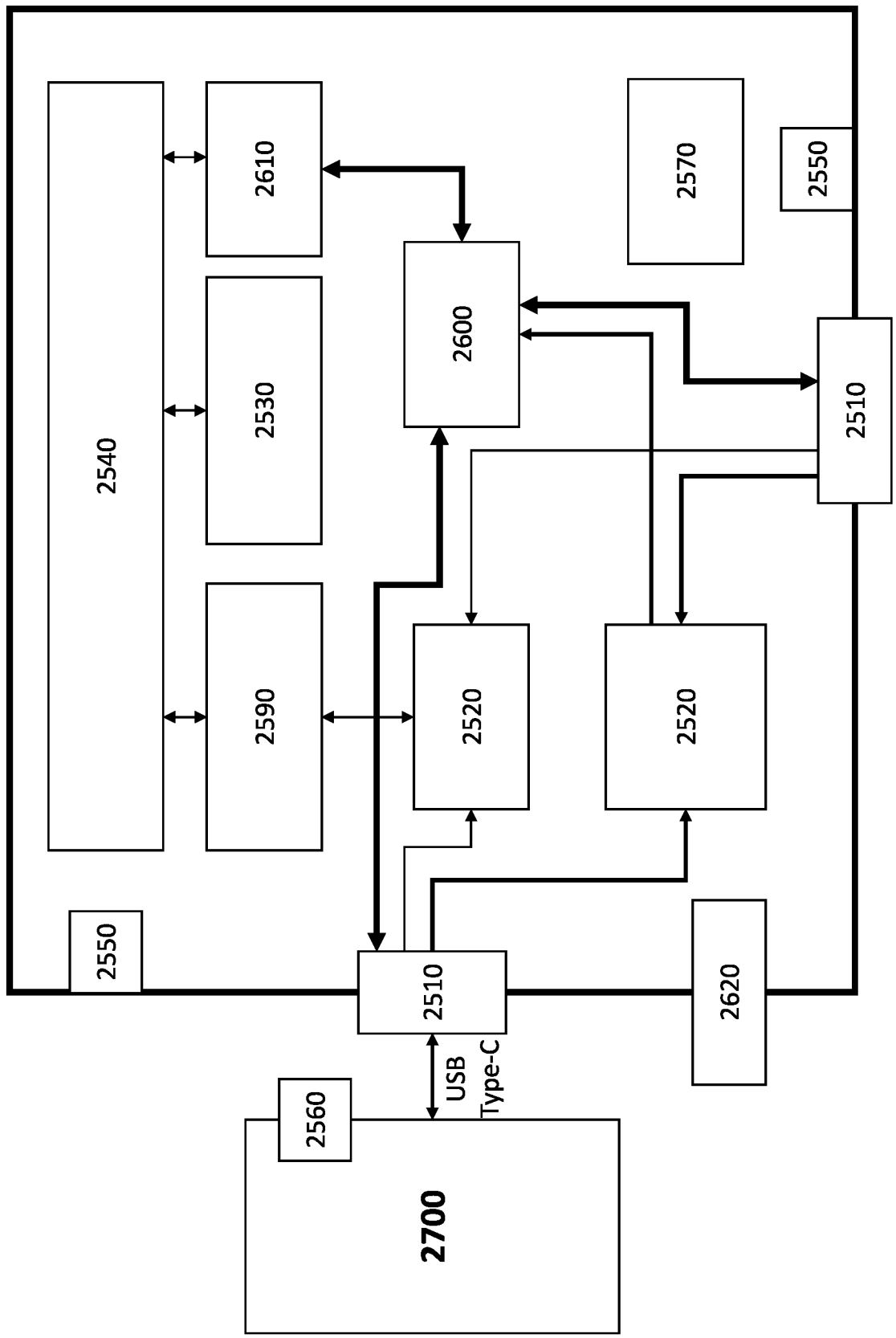
FIG. 45 this illustration shows the block diagram of the monitor with rotating feature.

FIG. 45 This figure shows an exemplary design of the electronic block diagram of the monitor with the autorotating function. Alternative block diagram designs using different types of ports and protocols are not limited in this invention. The hub 2700 connects to the monitor 2500 using one of two, portrait or landscape, USB-Type C connectors 2510. The connectors 2510 allow for landscape or portrait mode orientation. This connection provides power, video, and data communications consistent with, but not limited to, the USB Type-C standards. In one embodiment the USB Type-C connection supports Thunderbolt 3.0, via USB 3.2 Gen 2 and Display Port 1.2, or similar. In another embodiment, the USB Type-C connection supports USB 3.2 Gen 1 and Display Port 1.2. Each electrical connection undergoes filtering, clamping, and conditioning to reduce unwanted electromagnetic interference and emissions. Power regulator 2520 deliver power to a backlight driver 2530 for illuminating the display 2540. Other Integrated Circuits also receive power from the power regulator 2520 as needed. A pair of hall sensors or reed switches 2550 are positioned so only one aligns with magnets 2560 placed on the hub when used in portrait mode. An MCU 2570 detects the hall inputs and uses them to adjust signal routing from the USB Type-C connectors on the product. For example, the USB Superspeed pairs are Muxed 2580, so the appropriate pair is routed to the Display Port Controller 2590. This also handles a reversed cable input that swaps the SS pairs over USB Type-C. In some embodiments, the MCU 2570 uses the hall sensor or reed switch 2550 inputs to automatically rotate the display when plugged in portrait versus landscape mode without user interaction in the operating system. The Display Port Controller 2590 converts the USB data stream to video signals capable of, but not limited to, driving up to a 1920×1080 LCD panel 2540 at 60 fps. USB 2.0 D+/D− data signals from the USB Type-C connectors 2510 connect to a USB hub 2600 for enumerating a touch controller 2610, allowing the user to navigate using the touch control on the Display 2540. In one embodiment, buttons are present on the display 2620 for controlling functions such as, but not limited to brightness, contrast, color balance, test mode, and rotation.

With reference to FIGS. 46A-51, another embodiment is described which includes a folding monitor stored beneath the hub.

Figure 46A:
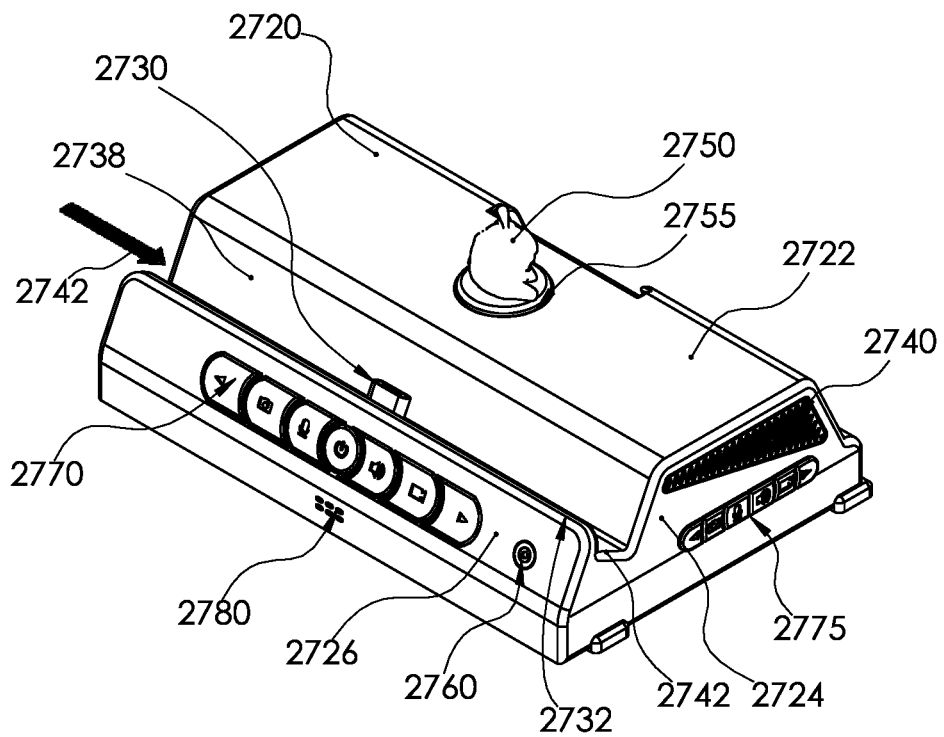
FIGS. 46A and 46B shows the isometric front view and the rear isometric view of a version of the hub of this invention with a built-in foldable monitor
Figure 46B:
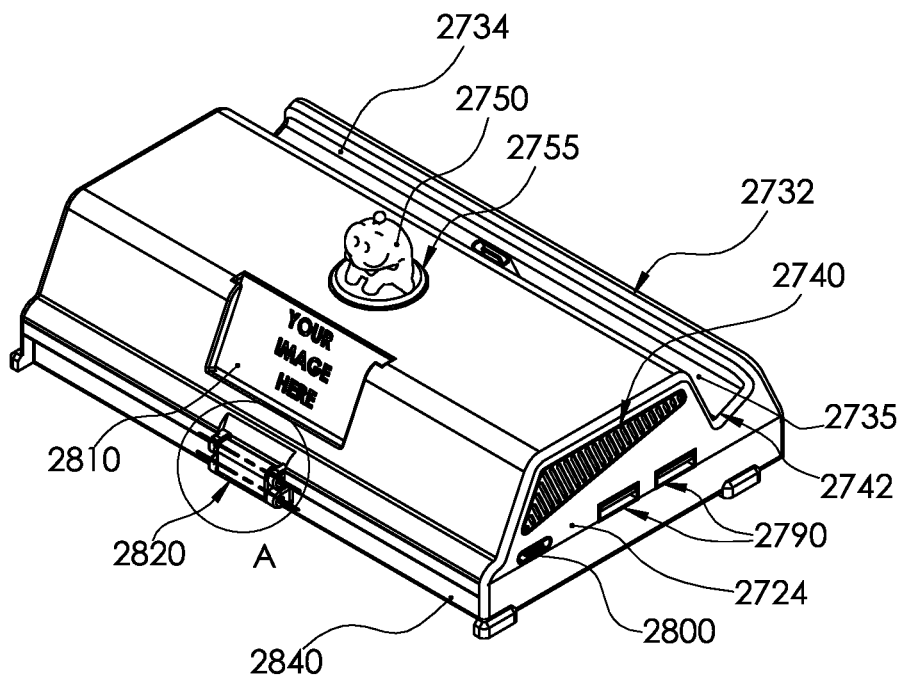
Figure 46B:
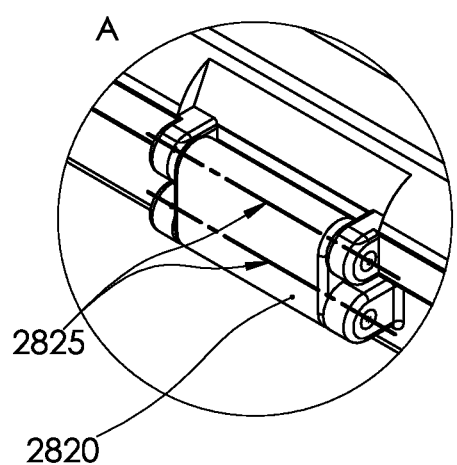

FIGS. 46A and 46B illustrate the front and the rear isometric views of the hub 2720 with the foldable monitor 2840 in stored position. The hub 2720 includes a top wall surface 2722, a pair of side walls 2724, a first front outer surface 2726 having various control buttons 2770, a camera 2760, and microphone 2780 and other features as may be included. A plane section 2735 and upwardly extending ridge 2732 integrally formed on front of plane section 2735 are on the backside 2734 of the first front outer surface 2726. The plane section 2735 is also integrally formed with a second front outer surface 2738, thereby forming a channel 2742 by the second front outer surface 2738, the plane section 2735, and the backside 2734 of front outer surface 2726. The USB Type-C male connector 2730 is used to transmit power, data, and video with the external monitor that can be connected to this port. Other connectors can be used for this function as well. The plane section 2735 extends the length of the front of the hub 2720 and includes an upwardly extending ridge 2732, which together with plane section 2735 holds the external monitor and the USB Type-C male connector. The grids 2740 located in the lateral sides of the hub are the spaces for the speaker's output sound. Over the hub 2720 at the top surface 2722 and located approximately in the middle area is a character port 2755 with mechanical, audio, video and electronic connections to install figurines 2750 or other accessories for advertising or other purposes. The hub camera 2760 provides the input sequence of images to the hub. The control buttons panels 2770 located in the front, and 2775 of the right-side face of the hub, provide activation signals to the peripherals, such as video, photo, sound and monitor features, including, but not limited to, brightness, color, contrast, backlight, tint, sharpness, among other monitor categories). Their mechanism can be push or touch selectors among other available options in the market. The square spaces at the front-lower-middle position are for the microphone 2780 location providing sound acquisition capabilities to the hub. Then, on the left side, there are two USB ports 2790 providing the connection and data exchange with external devices. Next, the primary USB Type-C female connector 2800 plugged through a USB type-C thunderbolt or similar technologies, wire to a computer that takes over the sound, photo, video, data, and power transfer. An advertising slot 2810 is included in the rear side of this invention. Finally, the built-in monitor 2840 (See on FIGS. 47A and 47B) contains at least one hinge 2820 as a point of reference guiding the proper turn cycle along the axis of rotation 2825 from a pin or hinge on the hub. Additional hinges may also be included.

Figure 47A:
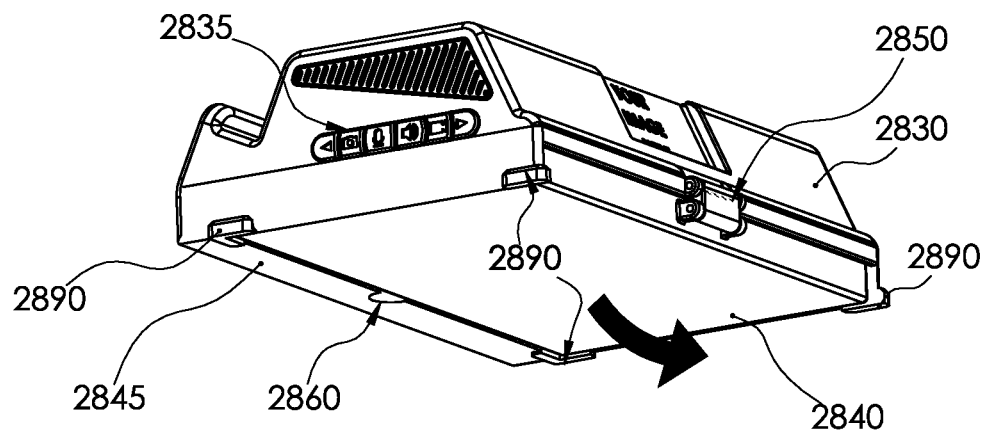
FIGS. 47A and 47B shows the hub with the built-in foldable monitor of the present invention displaying the monitor unfolding sequence feature included in this invention
Figure 47B:
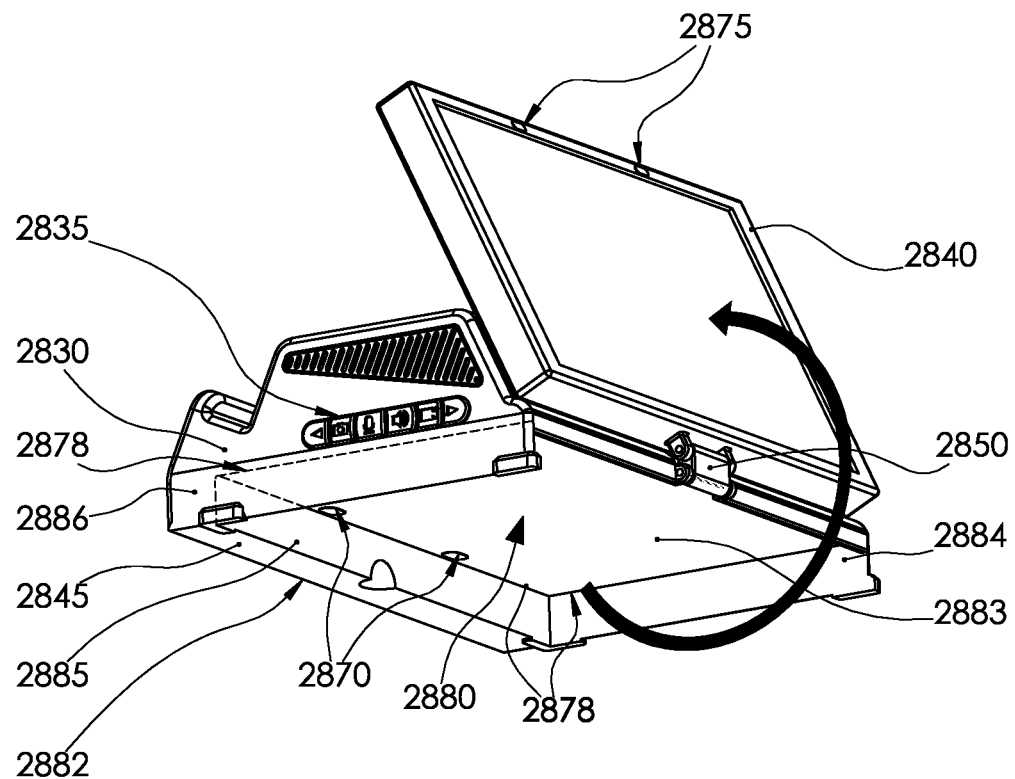

FIGS. 47A and 47B, show the isometric bottom views of the hub 2830 with foldable monitor 2840 included in the present invention. There is displayed the foldable monitor 2840 and its unfolding sequence. The hub bottom surface 2882, hub base area 2883 and edges 2878 along sides of base area 2883 have one or more downwardly extending walls 2884, 2885, 2886 on each of the edges 2878 of hub base area 2883. Together, the hub base area 2883 and downwardly extending walls 2884, 2885, 2886 form a storage cavity 2880 which receives and stores the folding monitor 2840. The folding monitor 2840 starts in the stored position under the hub so that the folding monitor is part of the base and bottom of the hub 2830. In order to open the monitor 2840 and move it from this first closed position to a second open and upright position, the rotation starts with an insertion of a tool or finger in the slot 2860, located in the bottom face 2845, to lift the foldable monitor 2840 from the stored position. This releases the foldable monitor 2840 and it is guided in the rotation turn by the hinge 2850 to the outside, upright second position for viewing. Although one hinge is shown, multiple hinges or other hinge, pins or rotatable faster means which allow the foldable monitor to swing to the open position and then return to the closed position are within the scope of the invention. When the monitor is folded into the storing cavity 2880, magnets 2875 at the top side of the foldable monitor and magnets 2870 in the storing cavity 2880 provides the mechanical connection force to maintain the monitor in a stored position. Other fastening mechanisms and means are within the scope of the invention, such as hook and look fasters, pins, snaps or mechanical means. The hub is supported by a set of four slip resistant grip pads 2890 that protects the foldable monitor to touch the surface of the desk. The foldable monitor 2840, when in its second upright position displays either the same or different video, inputs and outputs as the larger monitor separately connected to the hub. (See, FIGS. 49 and 50). Overall, the bottom base area and the at least one downwardly extending walls form a cavity to receive the foldable monitor which is rotatably connected to the hub by a hinge connection on the rear wall, with the hinge connection allowing the monitor to rotate from a first position to a second position along an axis of rotation. In the right-side of the Hub 2830 with foldable screen, can be seen the lateral control buttons 2835 that allow to activate or deactivate the different peripherals included in this invention.

Figure 48:
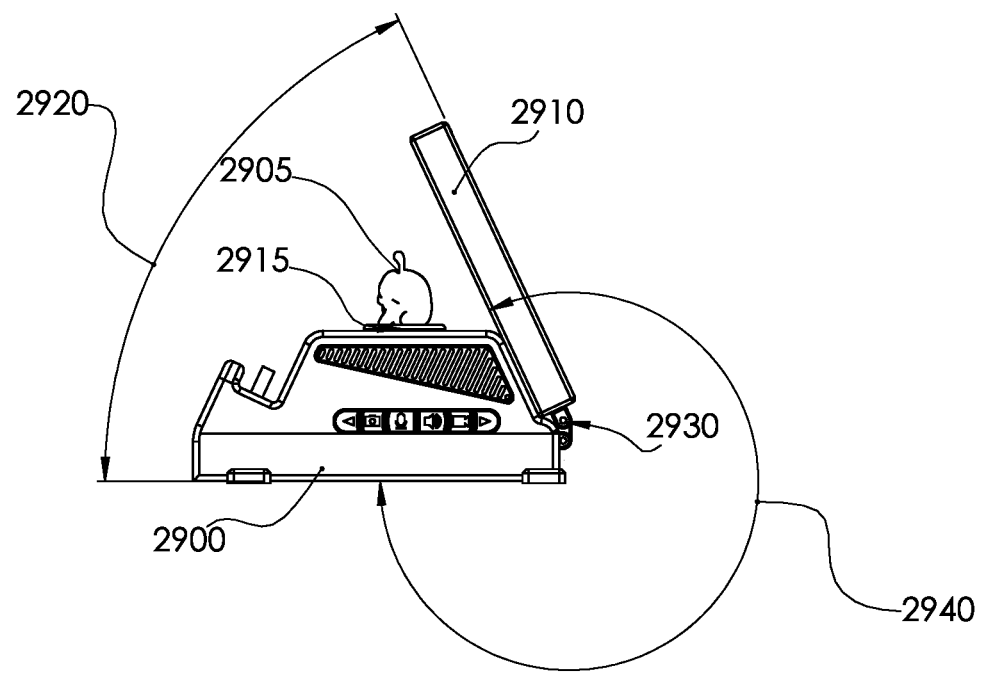
FIG. 48 is the right-side view and the rear isometric view of the hub with the built-in foldable monitor in the expanded position
Figure 48:
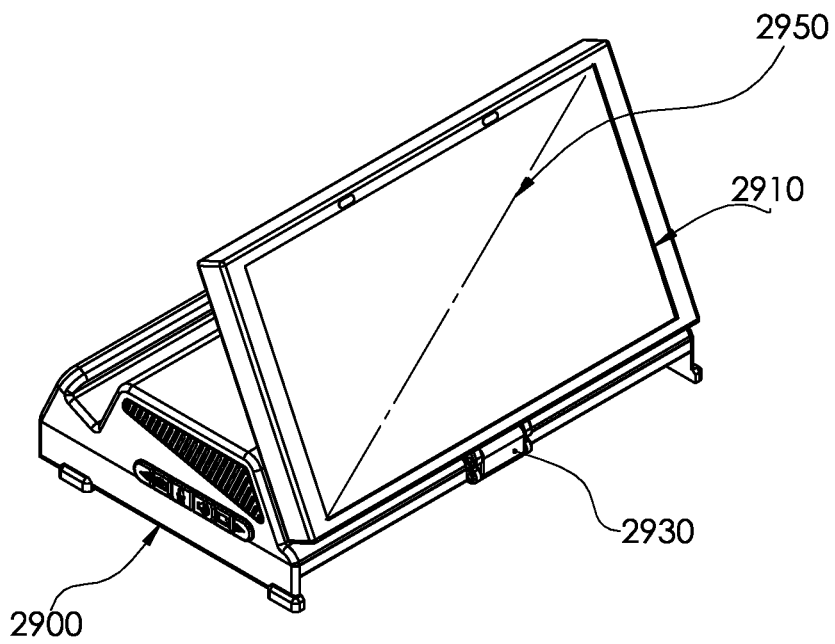

Referring now to FIG. 48, there is shown the right-side view and the rear isometric view of the hub 2900 with its foldable monitor 2910 in expanded, upright position outside of the base. The foldable monitor 2910 has a panel with an active area 2950 of between 3.5 inches to 13 inches, having a 7 inches as preferred value. Behind the foldable monitor 2910, the character 2905 and character port 2915 is located. The hinge 2930 included in the hub gives a foldable monitor rotation angle from the stored position to the outside expanded position, of about 295 degrees 2940, having a view of approximately 65 degrees to the user point of view 2920.

Figure 49:
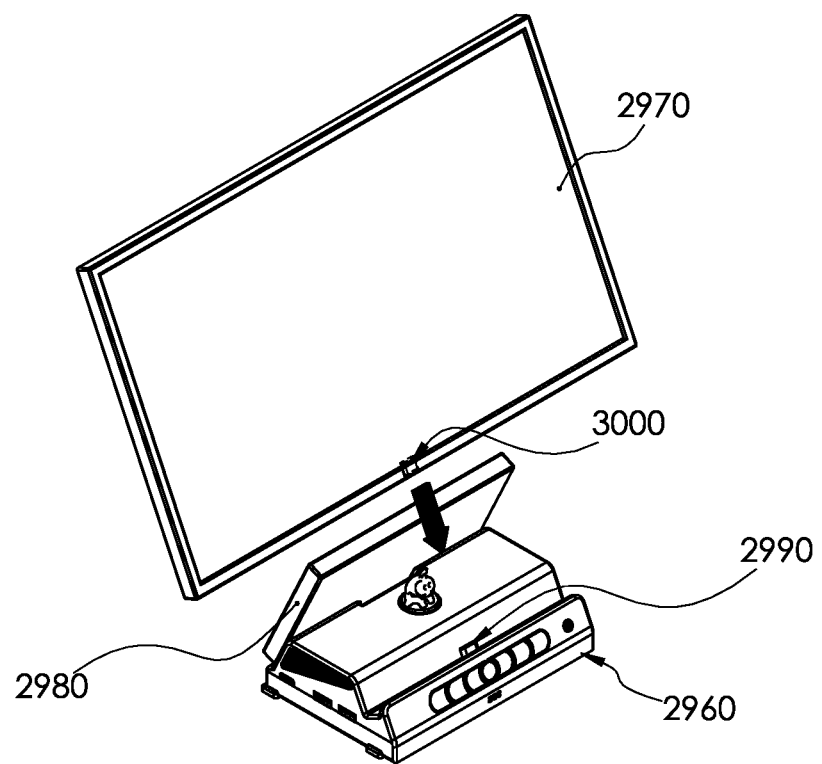
FIG. 49 shows in the upper side the front view of the hub with its built-in foldable monitor in expanded position, and an additional external monitor plugging feature included in this invention.
Figure 49:
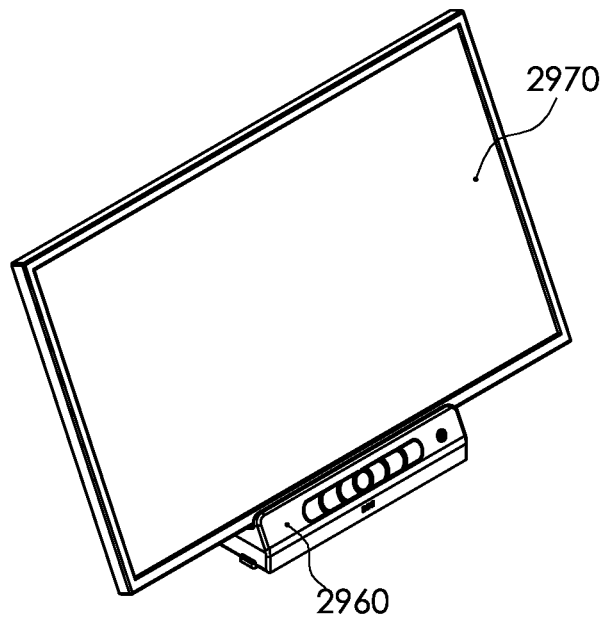

FIG. 49 shows the front view of the hub 2960 of the present invention with its foldable monitor 2980 in expanded position and demonstrating the plugging/attachment sequence of an additional external monitor 2970 that is between 10 inches to 17 inches, having 13.3 inches as preferred value. The external monitor's USB Type-C female connector 3000 match properly in the hub's USB Type-C male connector 2990 and can receive the power, data and video signal from other devices, such as computer, tablets, gaming console, etc. The external monitor and the hub can use other types of connectors available in the market (HDMI, Lighting, Pogo Pins, etc.) for connecting between them.

Figure 50:
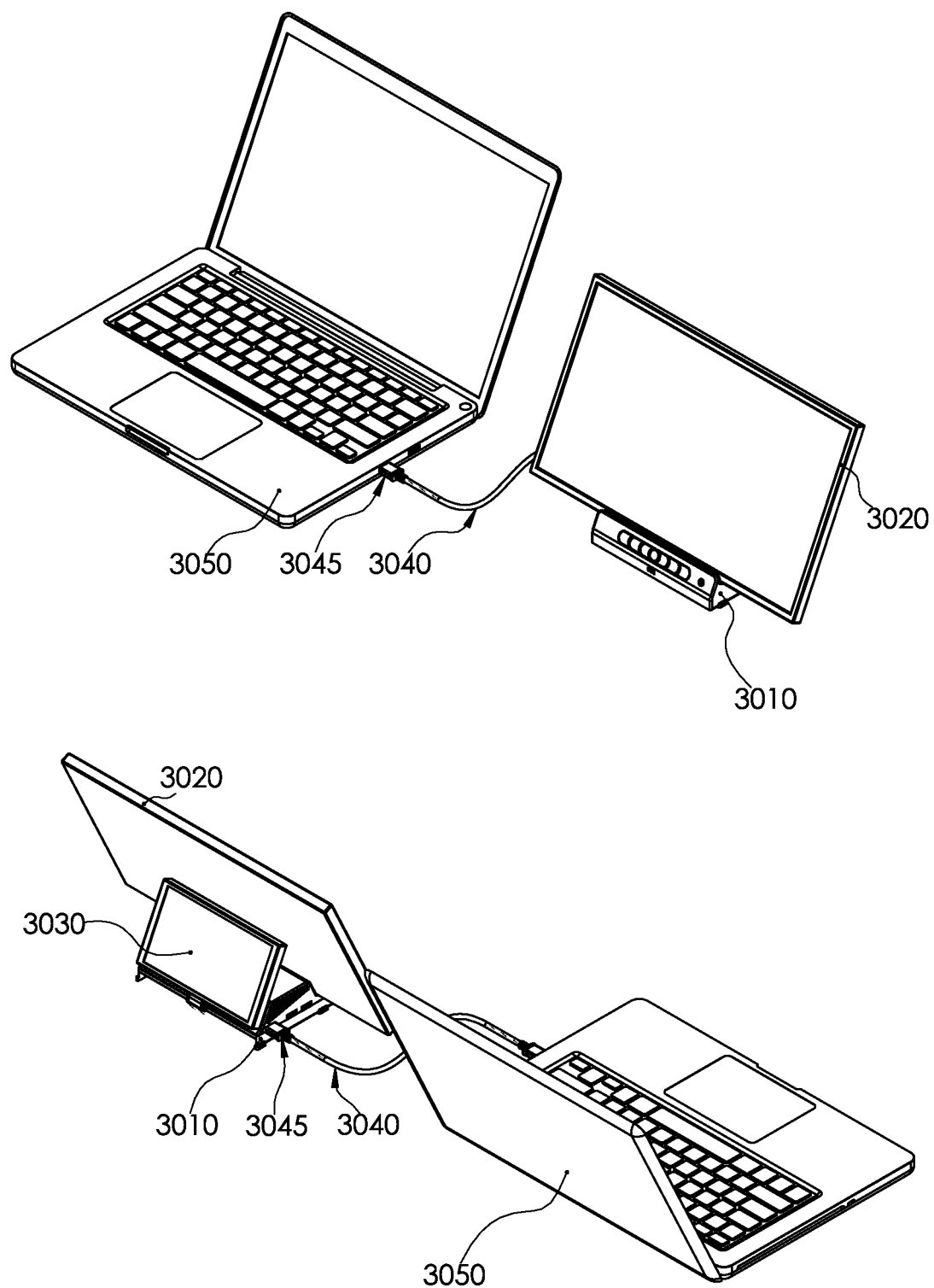
FIG. 50 shows the front and rear isometric views of the connection between a laptop and the hub with a built-in foldable monitor.

FIG. 50 illustrates the front and rear isometric view of the connection between a laptop 3050 and the hub 3010 with its built-in monitor 3030 of this invention, by means of a cable 3040 that has a USB Type C male connector 3045 at both ends of the cable 3040 suitable for the communication protocol between the computer and hub, which can be USB 3.1, Thunderbolt or similar. The hub 3010 with its foldable monitor 3030 in expanded position, and the external monitor 3020 plugged in the hub, can act as secondary and tertiary extender monitors of the laptop 3050 for projecting in both schemes duplicate or extended mode. Each screen also has the ability to have its own distinct video feed or screen display, separately and independently displayed simultaneously, so that two different users may view and interact with different material at the same time. Various electronic and input/output connections as known in the art can be used to achieve this result. The hub with built-in monitor of this invention, includes other peripherals explained in previous figures, such as, but not limited to, speakers, microphone, internal memory, video-camera, USB-A and USB-C ports or similar. Also, this invention can be designed with a built-in battery for independent operation and to power charge other apparatuses such as smartphones, tablets, etc. This invention can include wi-fi connectivity, Bluetooth and its pairing button.

Figure 51:
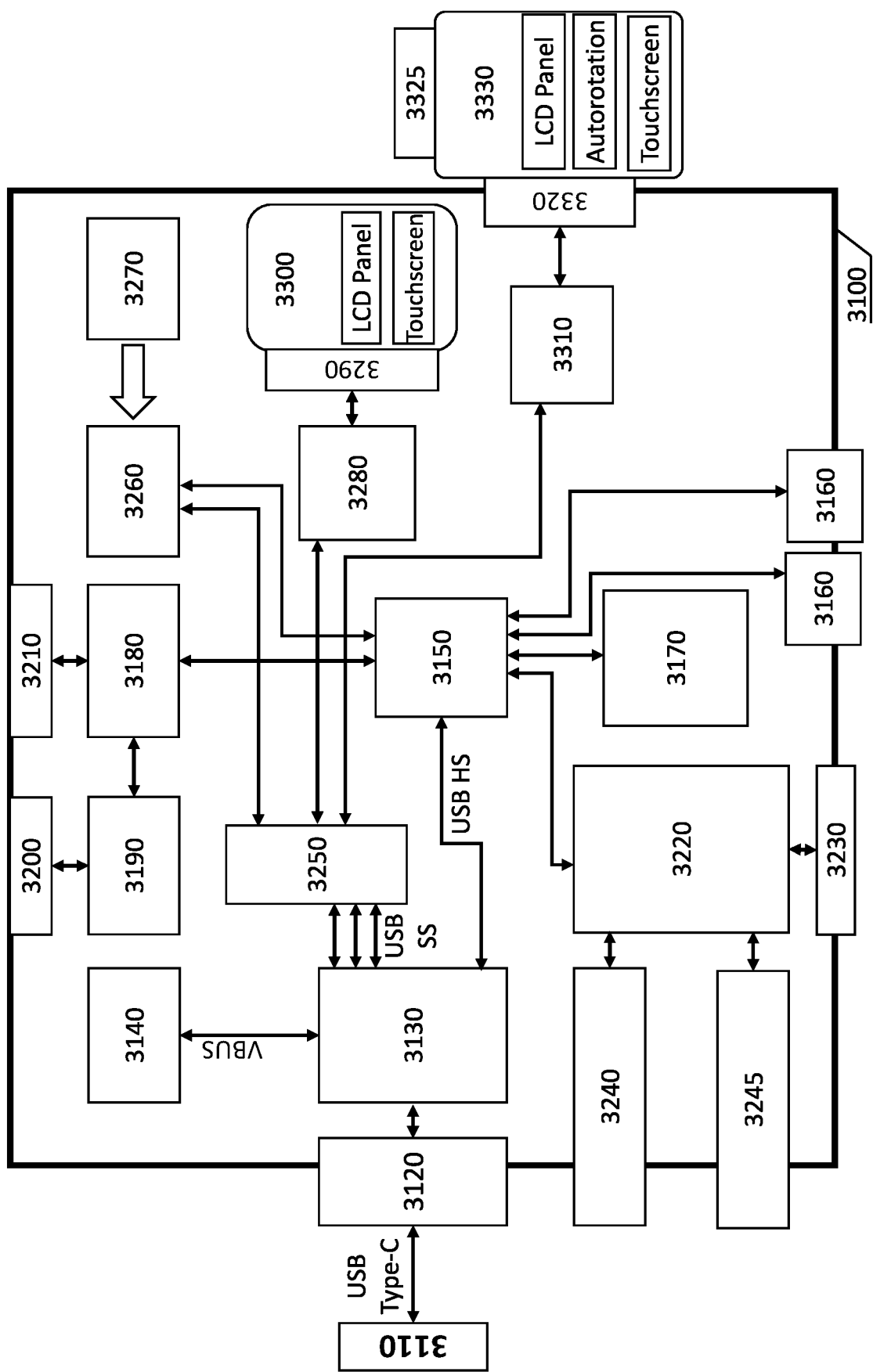
FIG. 51 shows the block diagram of the electrical connections of the hub with a built-in foldable monitor included in the present invention.

FIG. 51 depicts a block diagram of an embodiment of the device's internal capabilities and electrical connections. The hub 3100 connects to a user's host PC, laptop, tablet, or phone 3110 via a USB-Type C connector 3120. This connection carries power and data communications. Each signal undergoes filtering, clamping, and conditioning to reduce unwanted electromagnetic interference and emissions 3130. Power delivered by the connected device 3110 reaches a power module 3140. This circuitry 3140 monitors the voltage and current and allows the USB Type-C cable to be reversed while still powering the device. The power module 3140 also provides some overvoltage/current protection. Due to the power limit on USB 3.x, one embodiment of the design allows the power module 3140 to monitor device usage, and selective disable features to remain under the power limits defined in the USB Standard. Examples would include, but are not limited to, one embodiment where the use of the second monitor disables the flash drive, speakers and/or camera.

Data and power are provided to a USB 2.0 Hub 3150 and any connected devices hub USB, USB type A ports 3160, embedded flash storage 3170, USB audio codec 3180, USB audio amplifier 3190, speaker 3200, microphone 3210, MCU/RF RFID, Bluetooth, Wi-Fi, speech recognition 3220, NFC coil 3230, front panel buttons 3240, and foldable monitor's lateral buttons 3245. A MUX module 3250 handles crossing and uncrossing of the USB superspeed data pairs to support the reversable nature of the Type-C USB cable connection. One or more superspeed data pairs are routed to converter module for the camera 3260. Embodiments include those to support MIPI, LVDS, HDMI, Display Port and other display formats. A camera image sensor 3270 sends video data to the converter module 3260 for reception back to the host device 3110.

One or more superspeed data pairs are routed to a pair of display converter modules 3280 and 3310. Embodiments may be developed to support MIPI, LVDS, HDMI, Display Port and other display formats. The connectors 3290, 3320, and 3325 allows connected displays 3300 and 3330 to be docked and stream video output from the host 3110 to work as a duplicate or extended monitor. The external monitor 3330 is a removable display, that is to say, it provides the option of plugging in or plugging out the external monitor 3330 as a user preference. Meanwhile, the foldable monitor 3300 is a fixed screen in the hub with expansion and contraction capabilities. The connector 3290 is a flex kind connected to the foldable monitor 3300. The connectors 3320 and 3325 are both USB Type-C kind allowing the plugging of the external monitor 3330. The connector 3320 indicates to the external monitor the landscape orientation 3330, moreover, the connector 3325 indicates to the external monitor 3330 the portrait orientation. Various embodiments may be developed to support different display sizes, formats, resolutions, color profiles, viewing angles and mechanical profiles and attachments. One embodiment supports touch screens in one or both displays that provides input to the host 3110 via a USB or I2C interface.

A USB audio codec 3180 connected to a microphone 3210 converts audio in the environment to a USB data signal for transmission back to the host 3110. A USB audio amplifier 3190 connected to one or more speakers 3200 converts a USB data signal from the host device 3110 into audio for playback in the environment. A USB flash module 3170 connects to the USB 2.0 HUB 3150 and provides local data storage to the connected host device 3110.

In one embodiment, a microcontroller 3220 reads button inputs 3240 and 3245 for local control and transmission back to the host 3110. Embodiments may support turning the camera on and off, muting and unmuting the speaker or microphone, blanking the display, triggering lights, sounds or other behaviors from a connected NFC device 3230, and various wireless data operations. Embodiments of the microcontroller 3220 support Wi-Fi and Bluetooth for sending and receiving data to other connected devices and databases. The microcontroller 3220 also sends and receives data from an NFC coil 3230. In one embodiment, the NFC coil reads data from a figurine or action figure and trigger sound effects from the speakers. In one embodiment, the NFC coil reads information sent from a temperature, light, biometric or atmospheric sensor. Simultaneously, the microcontroller 3220 supports the speech recognition feature given by the microphone 3210 input signals. USB Type-A ports 3160 provide power for charging connected mobile devices and a data link back to the host device 3110.

The invention is not restricted to the details of the foregoing embodiments. The invention extends to any novel one, or any novel combination, of the features disclosed in this specification (including any accompanying claims, abstract and drawings), or to any novel one, or any novel combination, of the steps of any method or process so disclosed.

What is claimed is:

1. A hub device comprising: a unitary body having a top wall, a bottom wall, a front wall, a rear wall, and a pair of side walls defining a cavity within said unitary body, said unitary body having an internal power source and a set of electronics for wireless and wired communication with external devices; said front wall having an opening for receiving a base piece into said cavity of said unitary body, said base piece having a bottom surface and a locking ridge extending from said bottom surface; said base piece having a port extending from said base piece and adjustably positioned by a sliding arm; said bottom wall of said unitary body having an interior surface with a locking slot which receives said locking ridge of said base piece in different adjustable positions; said front wall having at least one slot formed in said front wall for receiving an external device; a plurality of parallel resonance bars extending from an interior surface of said top wall of said unitary body into said cavity, when sound comes in by at least one sound input on the front wall, said parallel resonance bars defining acoustic pathways; said top wall having an exterior surface with a mechanical connection, said mechanical connection capable of securing a functional object and electronically transferring power and data between said functional object and said unitary body.

2. The hub device of claim 1, wherein said sliding arm is adjusted by a position switch located on said base piece.

3. The hub device of claim 1, wherein at least one of said side walls has a sound output.

4. The hub device of claim 1 further comprising at least one input located on said unitary body for receiving data communications.

5. The hub device of claim 1 further comprising at least one input located on said unitary body for receiving video.

6. The hub device of claim 1 further comprising at least one input located on said unitary body for receiving electrical communication.

7. The hub device of claim 1 further comprising at least one output located on said unitary body for sending data communications.

8. The hub device of claim 1 further comprising at least one output located on said unitary body for sending video.

9. The hub device of claim 1 further comprising at least one output located on said unitary body for sending electrical communication.

10. The hub device of claim 1 wherein said bottom wall of said unitary body has an external surface with a second cavity, said second cavity for receiving and storing a monitor.

11. The hub device of claim 1 wherein said monitor is a foldable monitor.

\* \* \* \* \*